(12) United States Patent
Yamada et al.

(10) Patent No.: US 6,222,195 B1
(45) Date of Patent: Apr. 24, 2001

(54) CHARGED-PARTICLE-BEAM EXPOSURE DEVICE AND CHARGED-PARTICLE-BEAM EXPOSURE METHOD

(75) Inventors: Akio Yamada; Satoru Sagou; Hitoshi Watanabe; Satoru Yamazaki; Kiichi Sakamoto, all of Kawasaki; Manabu Ohno, Kasugai; Kenichi Kawakami; Katsuhiko Kobayashi, both of Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/637,119

(22) Filed: Aug. 11, 2000

Related U.S. Application Data

(62) Division of application No. 09/084,952, filed on May 28, 1998, now Pat. No. 6,137,111, which is a division of application No. 08/711,935, filed on Sep. 11, 1996, now Pat. No. 5,830,612.

(30) Foreign Application Priority Data

| Jan. 24, 1996 | (JP) | 8-010413 |
| Mar. 18, 1996 | (JP) | 8-060410 |
| Apr. 24, 1996 | (JP) | 8-102468 |
| Apr. 26, 1996 | (JP) | 8-107385 |
| Apr. 26, 1996 | (JP) | 8-107386 |

(51) Int. Cl.[7] ............................... G03F 9/00; H01J 37/00
(52) U.S. Cl. .................... 250/492.2; 250/491.1; 250/492.22; 430/5; 430/296
(58) Field of Search ........................ 250/492.2, 491.1, 250/492.22; 430/5, 296

(56) References Cited

U.S. PATENT DOCUMENTS

| 4,334,139 | 6/1982 | Wittekoek et al. | 219/121 EB |
| 4,751,169 | 6/1988 | Behringer et al. | 430/296 |
| 4,797,334 | 1/1989 | Glendinning | 430/296 |
| 4,816,361 | 3/1989 | Glendinning | 430/296 |
| 4,906,326 | 3/1990 | Amemiya et al. | 430/296 |
| 5,830,612 | 11/1998 | Yamada et al. | 430/30 |
| 5,952,133 | 9/1999 | Nakasuji | 430/22 |
| 5,969,365 | * 10/1999 | Takemoto et al. | 250/491.1 |
| 5,981,962 | 11/1999 | Groves et al. | 250/492.23 |
| 6,015,975 | * 1/2000 | Kawakami et al. | 250/492.22 |

FOREIGN PATENT DOCUMENTS 7-226361    8/1995  (JP) .

* cited by examiner

*Primary Examiner*—Teresa M. Arroyo
*Assistant Examiner*—Nikita Wells
(74) *Attorney, Agent, or Firm*—Staas & Halsey LLP

(57) ABSTRACT

A method of detecting deficiency of an aperture used in a charged-particle-beam exposure process employing at least two exposure columns is disclosed, where each of the two exposure columns passes a charged-particle beam through the aperture formed through a mask to shape a cross section of the charged-particle beam before exposing the charged-particle beam onto an object. The method includes the steps of mounting masks having the same aperture to the at least two exposure columns; scanning, in each of the at least two exposure columns, the charged-particle beam over an area containing a mark on a surface substantially at the same height as the object after passing the charged-particle beam through the same aperture; obtaining, in each of the at least two exposure columns, a signal waveform corresponding to the scan by detecting charged particles scattered by the mark; and comparing the signal waveform between the at least two exposure columns.

22 Claims, 62 Drawing Sheets

FIG. 2A
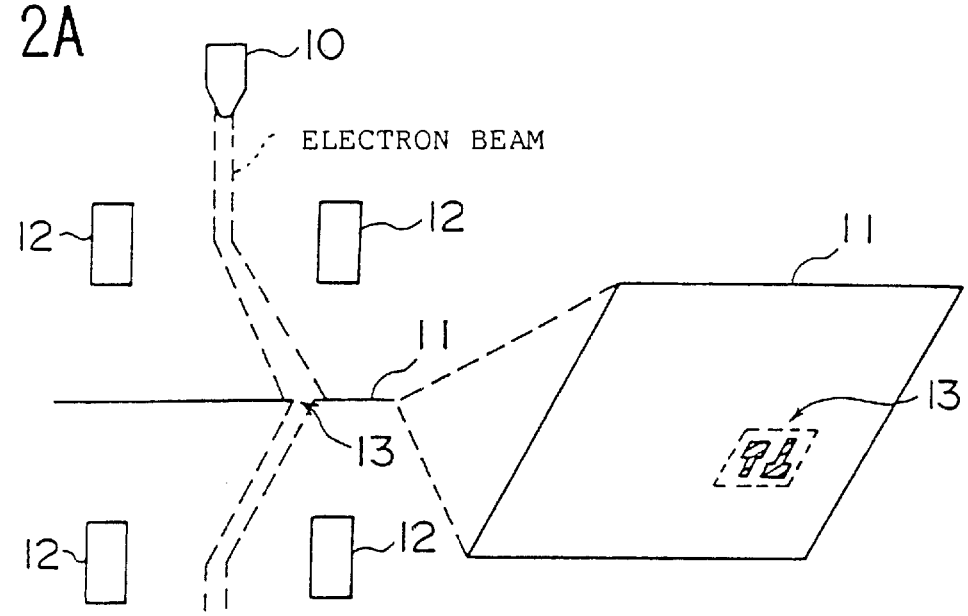
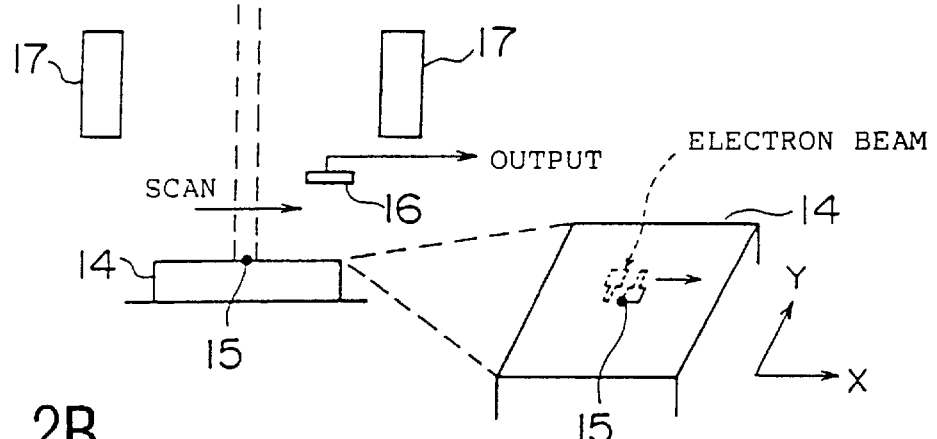
FIG. 2B
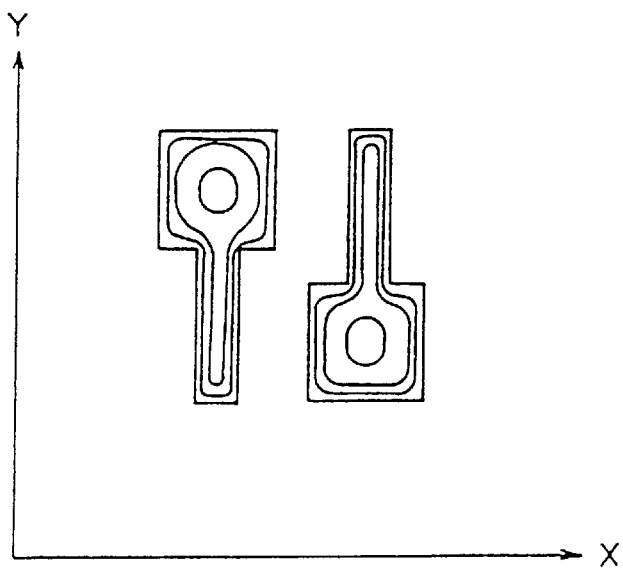

F I G. 14
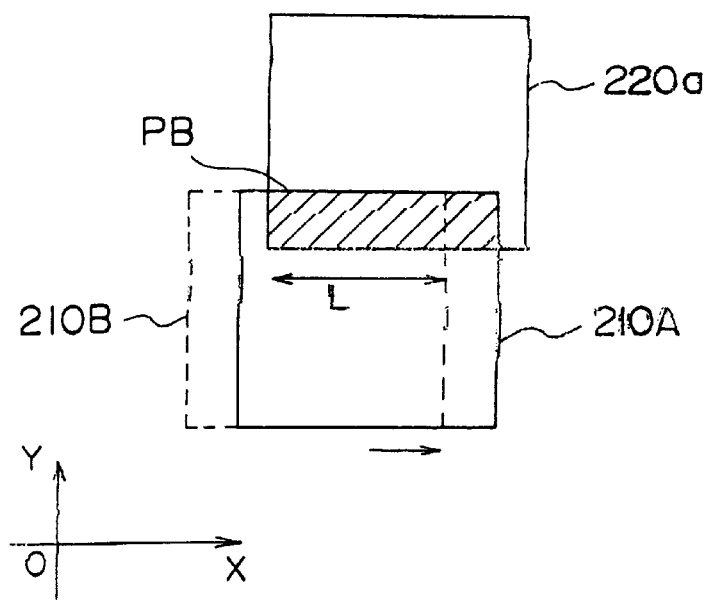
F I G. 15
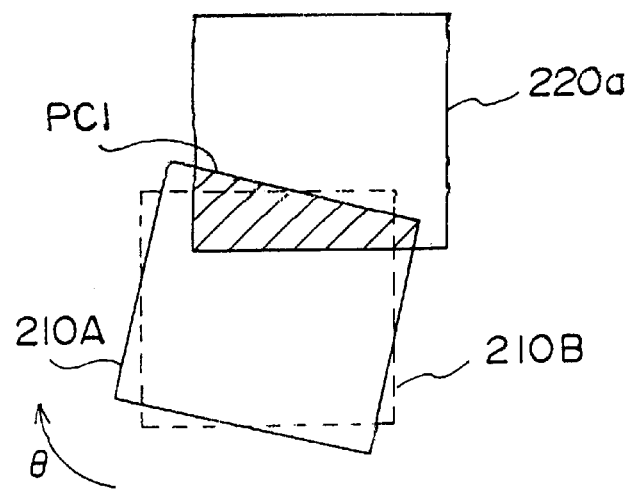

F I G. 20
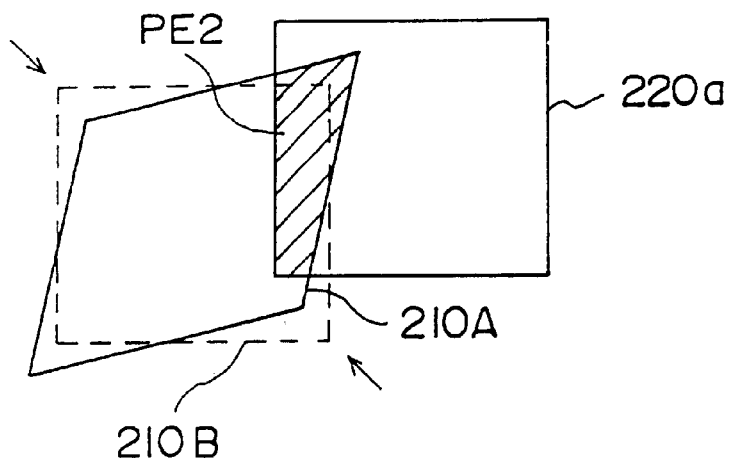
F I G. 21
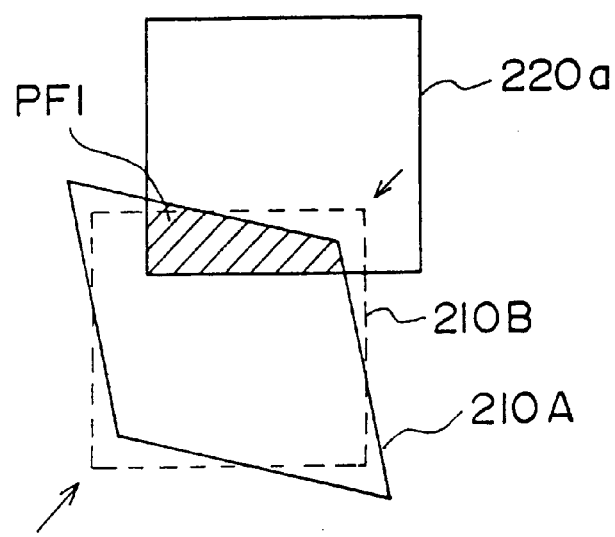

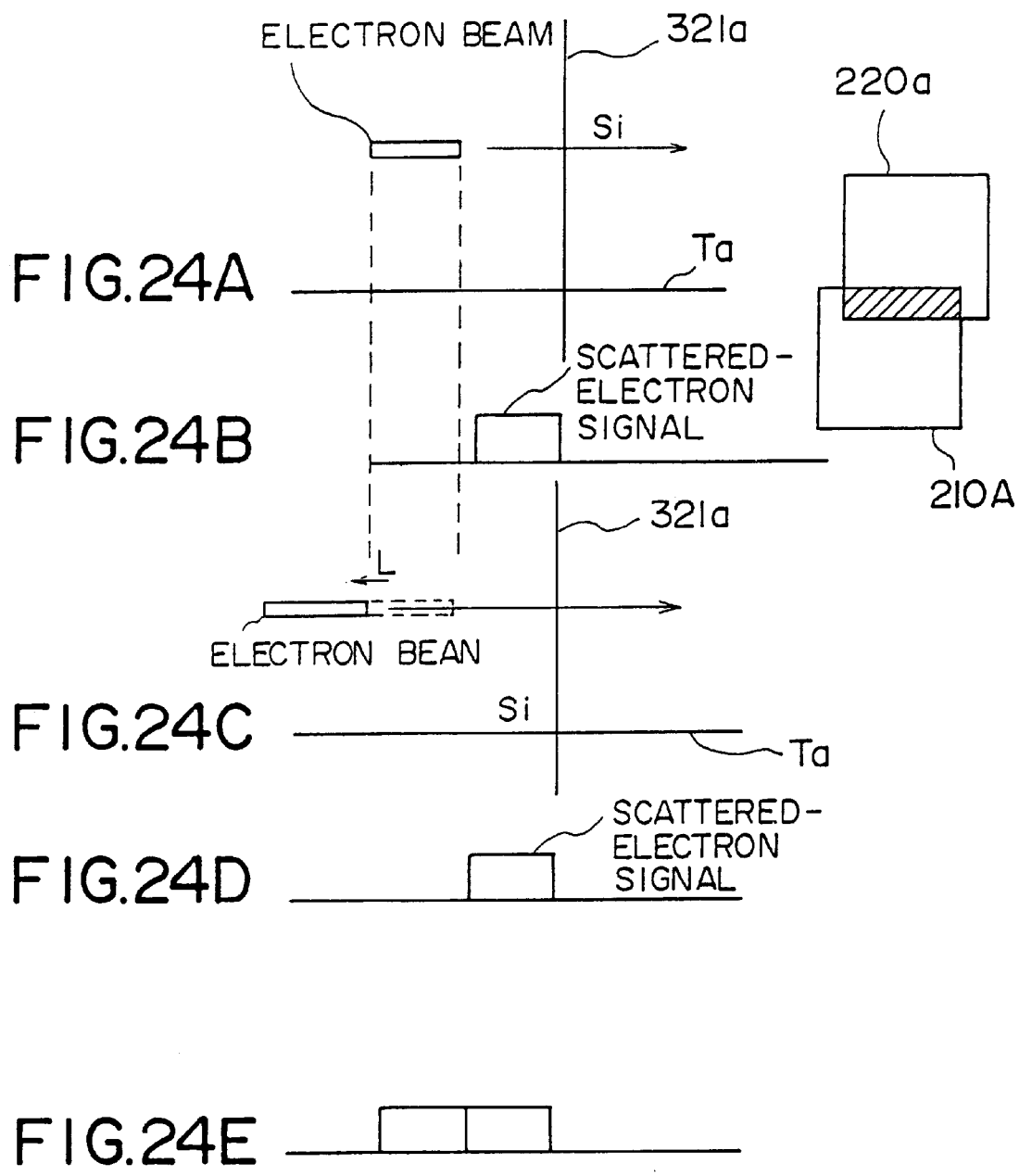

F I G. 27
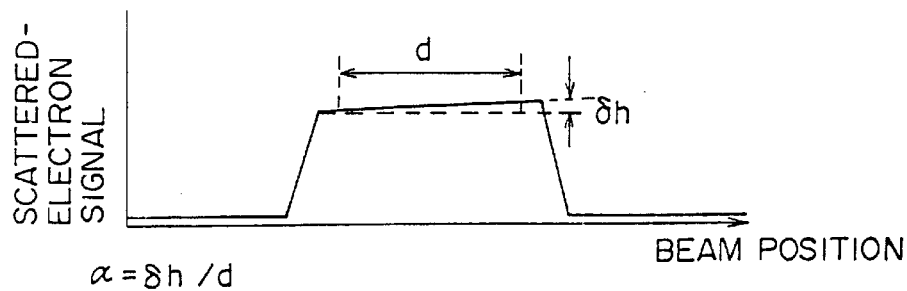
$\alpha = \delta h / d$
FIG. 28A
FIG. 28B
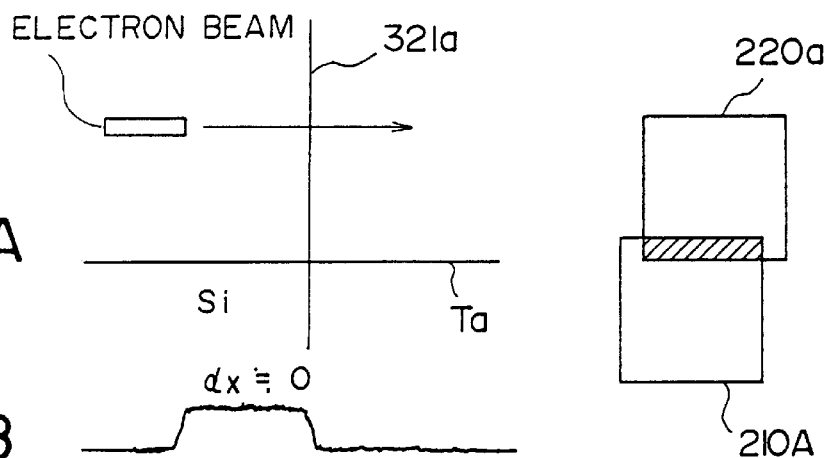
FIG. 28C
FIG. 28D
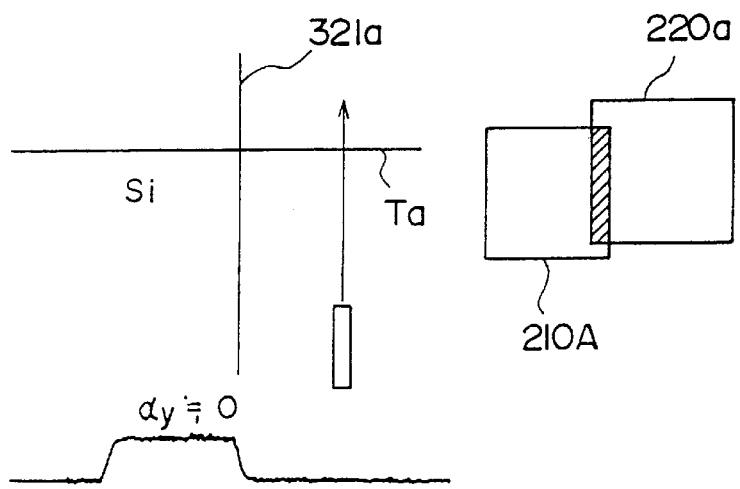

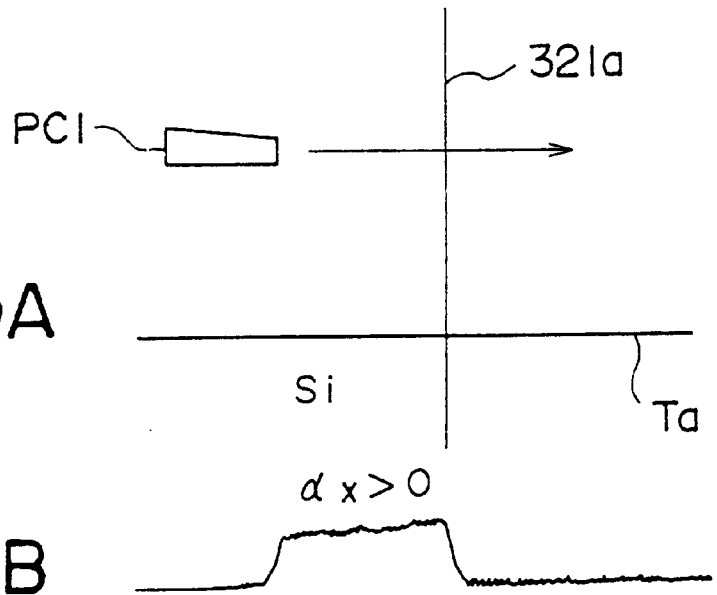
FIG. 29A
FIG. 29B
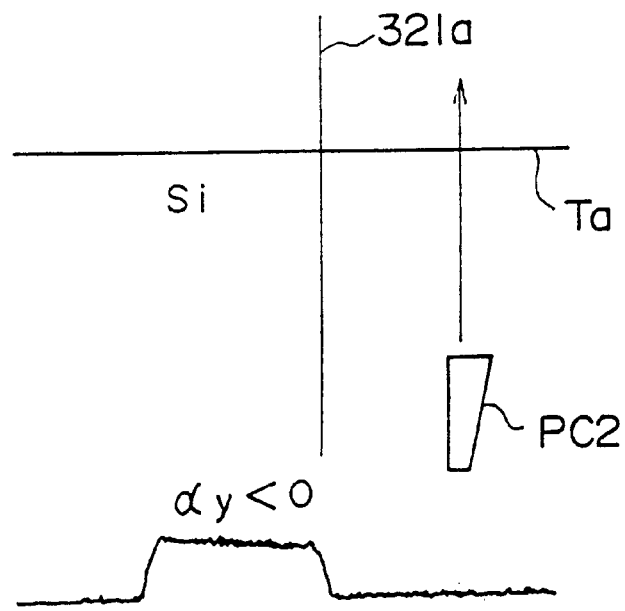
FIG. 29C
FIG. 29D

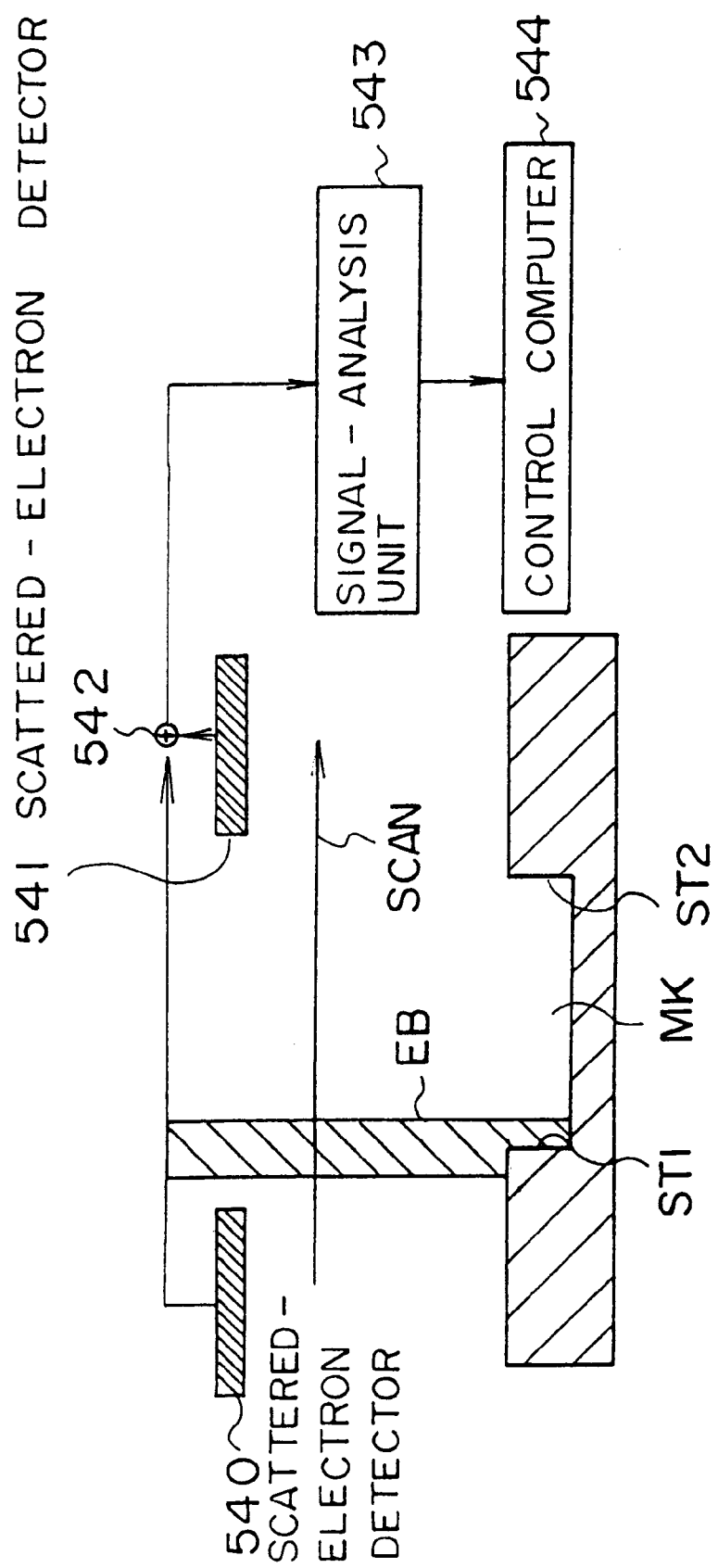

FIG. 70

```
1. PATTERN DATA
   a. POSITION WITHIN SUB-DEFLECTOR-DEFLECTION AREA (SDEFX, SDEFY)
   b. RECTANGULAR-BEAM SIZE (SHAPE)
2. BLOCK DATA
   PATTERN DATA CODE (PDC)
        ├─ MD1 (BSX1, BSY1)
        ├─ MD2 (BSX2, BSY2)
        ├─ MD3 (BSX3, BSY3)
        ├─ MD4 (BSX4, BSY4)
        ├─ DS  (DSX, DSY)
        ├─ DFO
        ├─ MST
        └─ REFCS
3. MAIN-DEFLECTOR DATA
        ├─ MDEF
        ├─ DS
        └─ DF
4. STAGE DATA
```

CHARGED-PARTICLE-BEAM EXPOSURE DEVICE AND CHARGED-PARTICLE-BEAM EXPOSURE METHOD

This application is a divisional of application Ser. No. 09/084,952, filed May 28, 1998, now U.S. Pat. No. 6,137,111; which is a divisional of application Ser. No. 08/711,935, filing date Sep. 11, 1996, now U.S. Pat. No. 5,830,612.

BACKGROUND OF THE INVENTION

1. Field of the Invention

The present invention generally relates to charged-particle-beam exposure devices and charged-particle-beam exposure methods, and particularly relates to a charged-particle-beam exposure device and a charged-particle-beam exposure method which expose a wafer to a charged-particle beam to form a pattern on the wafer.

2. Description of the Related Art

In recent development of increased circuit density of integrated circuits, an exposure technique using a charged-particle beam such as an electron beam has been gradually replacing a conventional photolithography technique as a method of forming a pattern on a semiconductor wafer. An exposure technique using an electron beam includes a variable-rectangle exposure technique and a block exposure technique.

The block exposure technique uses an aperture mask having a plurality of apertures of various pattern shapes. An electron beam is directed to a selected pattern of one or more apertures, and passes through the apertures to form an exposure pattern the same as the selected pattern on the wafer. The aperture mask is provided with aperture patterns repeatedly used during an exposure process. The block exposure technique is particularly effective when most exposure patterns are comprised of a repetition of basic patterns such as in 1G-DRAM chips or 4G-DRAM chips. In this case, patterns which are not repeated on the wafer are formed by using an electron beam having a variable-rectangle shape.

FIG. 1 is a block diagram of an example of an electron-beam-exposure device of the block-exposure type of the related art.

In FIG.1, an electron-beam exposure device 100 includes an exposure-column unit 110 and a control unit 150. The exposure-column unit 110 includes an electron-beam generator 114 having a cathode 111, a grid 112, and an anode 113. The exposure-column unit 110 further includes a first slit 115 shaping the electron beam rectangular, a first lens 116 converging the shaped beam, and a slit deflector 117 deflecting a position of the shaped beam on a block mask 120 based on a deflection signal S1. The exposure-column unit 110 further includes second and third lenses 118 and 119 opposing each other, the block mask 120 mounted movably in a horizontal direction between the second and third lenses 118 and 119, and first-to-fourth deflectors 121 through 124 deflecting the beam between the second and third lenses 118 and 119 based on position information P1 through P4 to select one of a plurality of apertures provided through the block mask 120. The exposure-column unit 110 further includes a blanking 125 cutting off or passing the beam according to a blanking signal, a fourth lens 126 converging the beam, an aperture 127, a refocus coil 128, and a fifth lens 129. The exposure-column unit 110 further includes a dynamic focus coil 130, a dynamic stigmator coil 131, an objective lens 132 projecting the beam onto a wafer W, and a main deflector 133 and a sub-deflector 134 positioning the beam on the wafer according to exposure-position signals S2 and S3. The exposure-column unit 110 further includes a stage 135 carrying the wafer to move it in X–Y directions, and first-to-fourth alignment coils 136 through 139.

The control unit 150 includes memory media 151 comprising a disk or MT recorder for storing design data of integrated circuits, and a CPU 152 controlling the electron-beam exposure device. The control unit 150 further includes a data-management unit 153, an exposure-management unit 159, a mask-stage controlling unit 160, a main-deflector-deflection setting unit 161, and a stage controlling unit 162, all of which are connected via a data bus (i.e., VME bus). Exposure data includes main-deflector data and sub-deflector data, and is stored in a buffer memory 154 via the data-management unit 153 prior to the exposure process. The buffer memory 154 is used as a high-speed buffer for reading the exposure data, thereby negating an influence of low-speed data reading from the memory media 151.

The main-deflector data is set in the main-deflector-deflection setting unit 161 via the exposure-management unit 159. The exposure-position signal S2 is output after the deflection amount is calculated, and is provided to the main deflector 133 via a DAC/AMP 170. Then, the sub-deflection data for exposing a selected field is read from the data-management unit 153, and is sent to a sub-deflector-deflection setting unit 155. In the sub-deflector-deflection setting unit 155, the sub-deflection data is broken down into shot data by a pattern generating unit 156, and is corrected by a pattern-correction unit 157. These circuits operate in a pipeline according to a clock signal generated by a clock setting unit 158.

After the processing of the pattern-correction unit 157, the signal S1 for setting a slit size, mask-deflection signals P1 through P4 for determining a deflected position on the block mask 120 of the beam deflected according to the signal S1 after passing through the first slit 115, the signal S3 for determining a position on the wafer of the beam shaped by the block mask 120, and a signal S4 for correcting distortion and blurring of the beam are obtained. The signal S1, the mask-deflection signals P1 through P4, the signal S3, and the signal S4 are supplied to the exposure-column unit 110 via a DAC(digital-to-analog converter)/AMP(amplifier) 166, a DAC/AMP 167, a DAC/AMP 171, and a DAC/AMP 169. Also, the clock setting unit 158 provides a blanking controlling unit 165 with a B signal. A BLK signal for controlling the blanking operation from the blanking controlling unit 165 is supplied to the blanking 125 via an AMP 168.

An exposure position on the wafer is controlled by the stage controlling unit 162. In doing so, a coordinate position detected by a laser interferometer 163 is supplied to the stage controlling unit 162. Referring to the coordinate position, the stage controlling unit 162 moves the stage 135 by driving a motor 164.

In this manner, the control unit 150 controls the exposure-column unit 110 such that the electron beam emitted from the electron-beam generator 114 is shaped rectangular by the first slit 115, converged by the lenses 116 and 118, deflected by the mask deflectors 121 and 122, and directed to the block mask 120. The beam having passed through the block mask 120 passes through the blanking 125, is converged by the fourth lens 126, deflected to a center of a sub-field of about a 100-μm square by the main deflector 133, and deflected within this sub-field by the sub deflector 134.

A portion of the block mask 120 for forming aperture patterns are made into a thin layer, and the aperture patterns are formed by etching. As a base for the block mask 120, a semiconductor plate such as a Si plate or a metal plate is used.

A mask (block mask) used in the block exposure is provided with a rectangle aperture used by the variable-rectangle exposure and with aperture patterns of various complex shapes. In order to achieve a reliable and accurate exposure by using such a mask, the mask must be accurate and free of defections. In particular, when the block exposure technique is applied to mass manufacturing, a reliability of the mask must be guaranteed, so that an inspection technique for the block mask should be established.

For a thorough inspection of the block mask, three different inspections should be conducted in the same manner as for a conventional photo mask, including inspection of a pattern scale, inspection of a pattern position, and inspection of a pattern surface. Minimum scales of block-mask patterns are 10 to 20 times as large as those of photo-mask patterns. Thus, a conventional photo-mask inspection device can be used for pattern-scale inspection and pattern-position inspection of the block masks. As for the pattern-surface inspection, a size of an intolerable mask deficiency is larger than that for the photo-mask inspection, so that a conventional pattern-deficiency inspection device can be used to conduct an appropriate pattern-surface inspection.

As described above, a preliminary inspection of a block mask is easy. After mounting a block mask preliminarily inspected to a block-exposure-type electron-beam-exposure device, however, it is necessary to constantly check the block mask as to mask deficiencies which may be caused in an operating environment of the device.

For example, in order to keep accurate patterns intact, attachment of dust to the mask should be avoided. In the case of a photo mask, such attachment of dust can be avoided by coating the mask with a transparent layer. In the case of the block mask, however, it is difficult to create so thin a layer as to be transparent to the electron beam, so that satisfactory prevention of dust attachment is hard to achieve in practice. Also, temperature of the mask increases through exposure to the electron beam during an exposure process, so that a risk of mask distortion and mask melting due to the heat cannot be excluded.

Accordingly, a preliminary inspection of a block mask is not sufficient since various factors exist in the exposure device to cause various mask deficiencies. Thus, a way to conduct a mask inspection inside the exposure device becomes necessary.

A method for conducting the mask inspection inside an exposure device includes a method in which an image of an electron beam passing through a mask is visually inspected (Proceedings of the 53rd Convention of Institute of Applied Physics, No.2, 1992). In this method, the electron beam is scanned over the mask to obtain a relation between a scan position of the electron beam and the amount of electrons passing through the mask, and a result obtained as a passing-electron image is inspected.

Since this method relies on a visual inspection to check the electron image, however, an increased complexity or an increased number of mask patterns results in too long an inspection time and less reliable inspection results. It is possible to automatically inspect the electron image by applying image processing, but it is difficult to establish a high-speed and reliable inspection algorithm. Also, the inspection by the method of this reference is carried out for the image of the electron beam passing through the mask pattern, and is not a direct inspection of the pattern projected onto the wafer. Therefore, this method is ineffective when exposure deficiencies are caused by some factors intervening between the mask and the wafer rather than caused by mask deficiencies themselves.

Accordingly, there is a need for a charged-particle-beam exposure device and a charged-particle-beam exposure method which allow mask-pattern inspection in order to prevent pattern-exposure deficiency on a wafer from developing due to mask deficiency or the like.

Moreover, the same problem of exposure-pattern deficiency caused by mask-pattern deficiency or the like is also observed in the variable-rectangle exposure method. This problem in the variable-rectangle exposure method will be described below.

In the variable-rectangle exposure method, an electron beam generated by an electron gun is shaped so as to have a cross section of a desired rectangle shape, and is exposed onto an exposure material such as a wafer or the like. For the creation of the desired rectangle shape, the electron beam is passed through two slits (rectangle apertures), so that the cross section of the electron beam is formed into a shape of the superimposition of the two slits. In this manner, a desired rectangle shape is provided for the cross section of the electron beam. As can be understood, relative positions of the two slits have to be maintained with precision.

There are cases, however, in which the shape of the superimposition is different from the desired pattern because the slits are at angle in a horizontal direction or in a vertical direction with respect to the appropriate position thereof, or in which the cross section of the electron beam is warped by the large amount of deflection for directing the electron beam to a slit. When rotation or distortion is developed in an exposure pattern, a deflector, a distortion correction coil, or the like provided in the electron-beam-exposure device is used for effecting necessary correction.

However, detection of such exposure pattern deficiency is not easy. Generally, an exposure is carried out for a resist layer applied onto a wafer, and a developed pattern thereof is subjected to a visual inspection using an electron microscope or the like in order to check a rotation direction, a rotation amount, a distortion direction, a distortion amount, etc., of the developed pattern. Based on the inspection of the developed pattern, correction amounts are estimated by educated trial and error, and are supplied to the deflector, the correction coil, etc. Then, an exposure, a development, and an inspection through the electron microscope are repeated until errors fall within a tolerable range.

As can be seen, a number of steps are required to carry out the above process. Since the exposure device cannot be used during the above process, the utilization of the exposure device is reduced. Also, correction amounts are obtained by educated guess (trial and error), an adjustment of exposure device in a short time is difficult.

Accordingly, there is a need for a charged-particle-beam exposure device and a charged-particle-beam exposure method in which the cross-sectional shape of an electron beam can be checked without the pattern-check steps to provide appropriate correction amounts.

In summary, there are needs in the field of the charged-particle-beam exposure technique for a device and a method in which the cross-sectional shape of the electron beam can be checked.

In the block-type exposure technique, there is a need for a charged-particle-beam exposure device and a charged-particle-beam exposure method which allow mask-pattern inspection in order to prevent pattern-exposure deficiency on a wafer from developing due to mask deficiency or the like.

In the variable-rectangle exposure technique, there is a need for a charged-particle-beam exposure device and a charged-particle-beam exposure method in which the cross-sectional shape of an electron beam can be checked without the pattern-check steps to provide appropriate correction amounts.

SUMMARY OF THE INVENTION

Accordingly, it is a general object of the present invention to provide a charged-particle-beam exposure device and a charged-particle-beam exposure method which can satisfy the needs described above.

It is another and more specific object of the present invention to provide a charged-particle-beam exposure device and a charged-particle-beam exposure method which allow mask-pattern inspection in order to prevent pattern-exposure deficiency on a wafer from developing due to mask deficiency or the like.

In order to achieve the above objectives according to the present invention, a method of detecting deficiency of an aperture used in a charged-particle-beam exposure process employing at least two exposure columns is disclosed, where each of the two exposure columns passes a charged-particle beam through the aperture formed through a mask to shape a cross section of the charged-particle beam before exposing the charged-particle beam onto an object. The method includes the steps of mounting masks having the same aperture to the at least two exposure columns, scanning, in each of the at least two exposure columns, the charged-particle beam over an area containing a mark on a surface substantially at the same height as the object after passing the charged-particle beam through the same aperture, obtaining, in each of the at least two exposure columns, a signal waveform corresponding to the scan by detecting charged particles scattered by the mark, and comparing the signal waveform between the at least two exposure columns.

According to the method described above, in the electron-beam exposure process using the at least two exposure columns, mask deficiency of the block masks mounted in the electron-beam-exposure device is easily detected by comparing the signal waveforms obtained when the same aperture is used in each of these exposure columns. The same objects can be achieved by a device equipped with functional units for carrying out the above-identified method.

Further, the same objects can be achieved even when only one exposure column is used for an electron-beam exposure process. In this case, a mask having a first aperture and a second aperture which has substantially the same shape as the first aperture is used for obtaining signal waveforms for the first aperture and the second aperture. A comparison of these signal waveforms with each other reveals possible deficiency in the first aperture and the second aperture, thereby providing easy mask-pattern inspection.

Also, the same objects can be achieved by forming a first pattern on an object by using a mask aperture having a shape of said first pattern, forming a second pattern having the same shape as the first pattern on the object by using a variable-rectangle method, and comparing said first pattern and said second pattern on the object. In this case, deficiency in the mask aperture can be detected by using the variable-rectangle method as a reference.

It is still another object of the present invention to provide a charged-particle-beam exposure device and a charged-particle-beam exposure method in which the cross-sectional shape of an electron beam can be checked without the pattern-check steps to provide appropriate correction amounts.

In order to achieve the above objectives according to the present invention, a method of exposing a beam image onto an object after passing a charged-particle beam through a first slit and a second slit successively to form the beam image as a superimposition of the first slit and the second slit is disclosed. The method includes the steps of scanning the beam image in at least one scan direction over a mark provided on one of the object and in proximity of the object; detecting a signal of charged particles scattered by the mark when the mark is scanned; detecting, based on the signal, displacement, rotation, and distortion of an image which the first slit projects onto the second slit; correcting the beam image based on information about the displacement, rotation, and distortion; and exposing the beam image after the correction onto the object.

In the method described above, a length of the detected signal provides information on a length of the beam image, thus revealing whether there is a displacement of the first-slit-projected image relative to the second slit. Also, a slope of the detected signal provides information on rotation and distortion of the first-slit-projected image. More detailed information such as a direction of the displacement, distinction between the rotation and the distortion, and a direction of the rotation or the distortion can be obtained by beam scans in more than one direction over the mark.

Other objects and further features of the present invention will be apparent from the following detailed description when read in conjunction with the accompanying drawings.

BRIEF DESCRIPTION OF THE DRAWINGS

FIGS.2A and 2B are illustrative drawings for explaining a first principle of the present invention;

FIG.14 is an illustrative drawing showing a case in which the first-slit image is displaced toward a positive side in the X direction;

FIG.15 is an illustrative drawing showing a case in which the first-slit image is rotated clockwise by an angle θ with respect to the second slit;

FIG.20 is an illustrative drawing showing another case in which the first-slit image is distorted in directions shown by arrows to become a rhombus;

FIG.21 is an illustrative drawing showing yet another case in which the first-slit image is distorted in directions shown by arrows to become a rhombus;

FIGS.24A through 24E are illustrative drawings showing a method of detecting pattern displacement according to an embodiment of the third principle of the present invention;

FIG.27 is an illustrative drawing for explaining a method of detecting a pattern rotation and a pattern distortion;

FIGS.28A through 28D are illustrative drawings showing a method of detecting the pattern rotation and the pattern distortion;

FIGS.29A through 29D are illustrative drawings showing a method of detecting a rotation when the first-slit image is rotated clockwise as shown in FIG.15 and FIG.16;

FIG.54 is an illustrative drawing showing a conventional configuration for detection of positioning marks based on scattered-electron detectors;

FIG.70 is a table chart showing relations between exposure data and driving signals for elements such as deflectors, correction coils, and the like of FIG.69;

DESCRIPTION OF THE PREFERRED EMBODIMENTS

Figure 1:
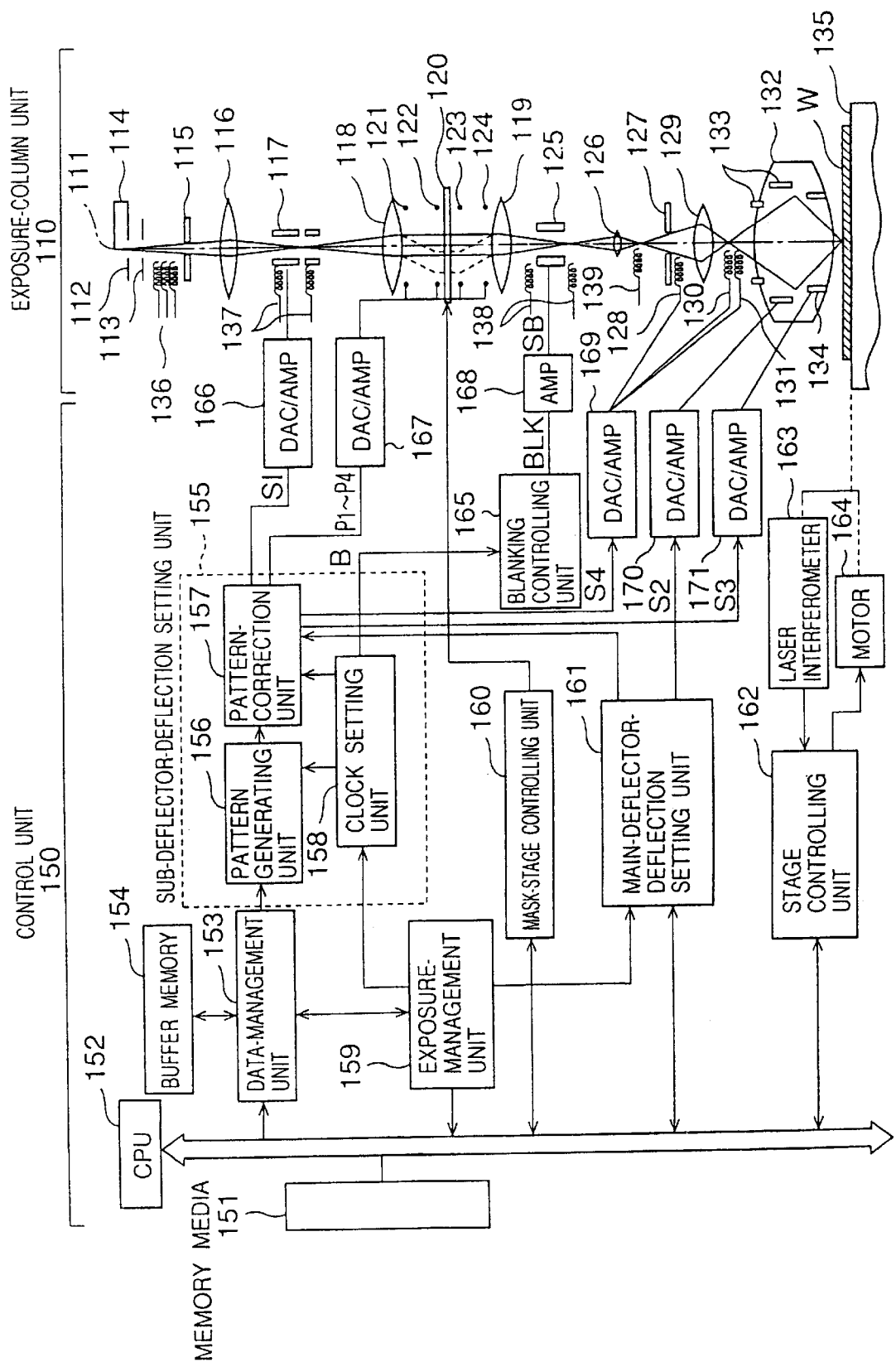
FIG.1 is a block diagram of an example of an electron-beam-exposure device of the block-exposure type of the related art.

In the following, principles and embodiments of the present invention will be described with reference to the accompanying drawings.

FIGS.2A and 2B are illustrative drawings for explaining a first principle of the present invention. FIGS.2A and 2B show a collection of data regarding mask patterns, and deficiency of the mask patterns is detected from the collected data.

As shown in FIG.2A, an electron beam emitted from an electron gun 10 is deflected by a deflector 12 to be directed to a mask pattern (aperture) 13 formed through a block mask 11. The electron beam passing through the mask pattern 13 is then directed to a wafer 14. On the upper surface of the wafer 14 is provided a microdot 15, which scatters electrons of the incident electron beam (also generates secondary electrons). The microdot 15 has a size less than about 0.2 $\mu$m, and is formed from Ta, for example.

A scattered-electron detecting unit 16 detects the scattered electrons from the microdot 15, and outputs a current signal proportional to the detected electron amount.

Scans of the electron beam over the wafer 14 by a deflector 17 provide a signal having temporal changes reflecting a cross-sectional shape of the electron beam, i.e., the mask-pattern shape. For example, the electron beam may be scanned by the deflector 17 in an X direction, and shifted in a Y direction after a completion of one scan in the X direction. A signal waveform obtained by such electron-beam scans can be depicted in a 2-dimensional plane based on an X-direction deflection position and a Y-direction deflection position of the electron beam. FIG.2B shows an example of an image obtained in this manner. In FIG.2B, contour lines indicating detected electron amounts are shown.

In order to detect mask pattern deficiency from the signal waveform obtained in this manner, one of the following two methods may be used.

1) In the case of at least two exposure columns provided in the system, data collection is conducted for the same mask pattern in each column, and signal waveforms from different columns are compared with each other. If a difference exists between these signal waveforms, it is decided that the inspected mask patterns are likely to have deficiencies. Depending on decisions as to how large a size of the deficiency and how significant an effect on an exposure pattern, the mask may be exchanged. Visual inspection may be used along with the automatic signal-waveform comparison in order to make these decisions. Even when the visual inspection is used, likelihood of deficiency is evaluated in advance based on the automatic comparison, and the visual inspection is required for the comparison of signals rather than for an examination of a single signal. Therefore, the visual inspection is easy and effective when making decisions.

2) In the case of a single exposure column, at least two of the same patterns are provided in a block mask, and data collection is conducted for each of these patterns. Signal waveforms of these patterns are stored in storage means to be compared with each other, and a decision is made as to whether there is a deficiency. A procedure after finding a likely deficiency (signal difference) is the same as that described above.

In this manner, according to the first principle of the present invention, mask deficiency of the block mask mounted in the electron-beam-exposure device is easily detected based on a comparison of the signal waveforms. Furthermore, exposure-pattern deficiency caused by some factors intervening between the block mask and the wafer rather than caused by the mask deficiency itself can be detected according to the first principle of the present invention.

Figure 3:
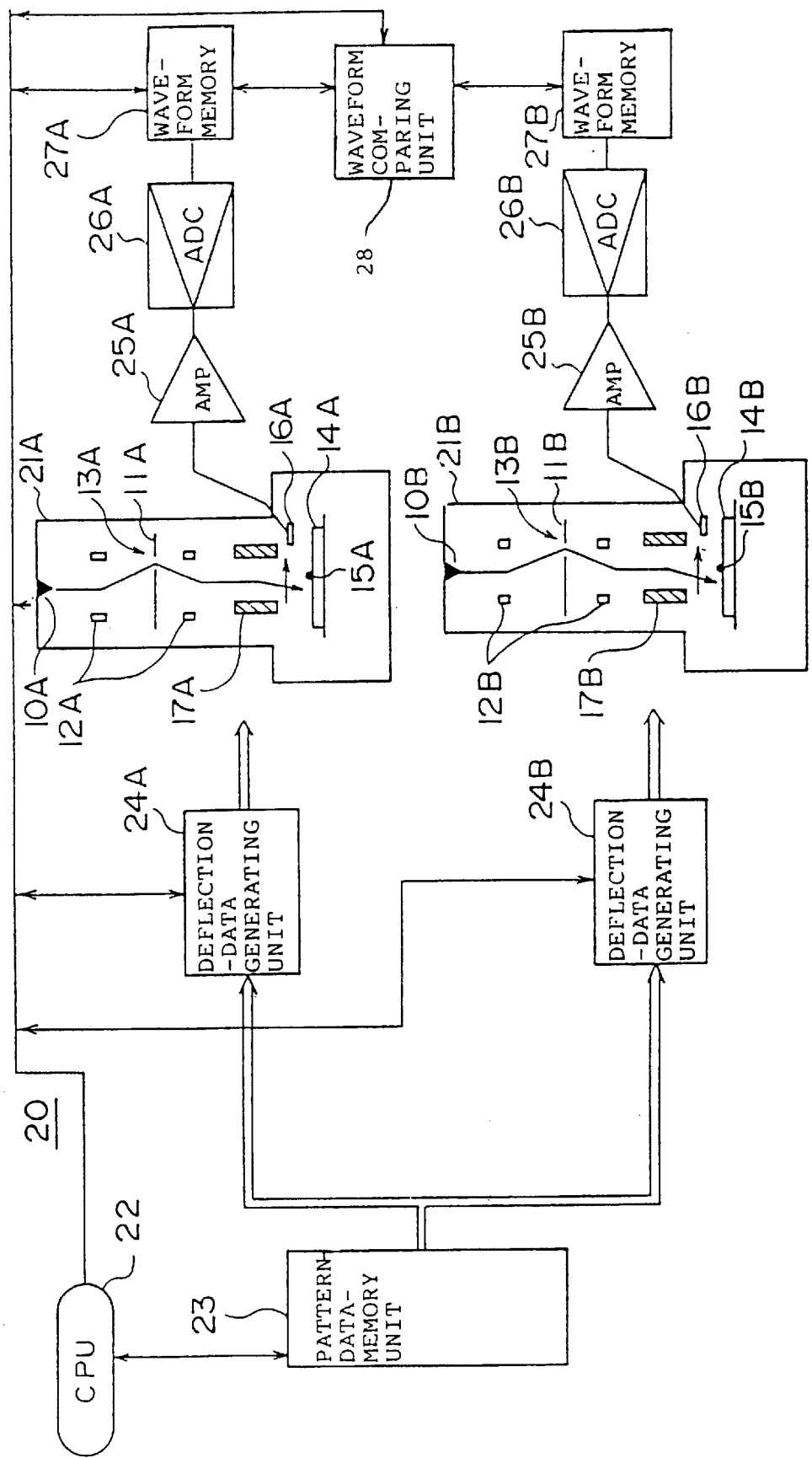
FIG.3 is an illustrative drawing showing a configuration of an electron-beam-exposure device detecting mask deficiency according to a first embodiment of the first principle of the present invention.

FIG.3 is an illustrative drawing showing a configuration of an electron-beam-exposure device 20 detecting mask deficiency according to a first embodiment of the first principle of the present invention.

The electron-beam-exposure device 20 includes two exposure columns 21A and 21B, and includes control systems and signal processing systems separately provided for the two columns. The exposure columns 21A and 21B include electron guns 10A and 10B, block masks 11A and 11B, deflectors 12A and 12B, the same mask patterns 13A and 13B, wafers 14A and 14B, microdots 15A and 15B, scattered-electron detecting units 16A and 16B, and deflectors 17A and 17B, respectively.

The electron-beam-exposure device 20 further includes a CPU 22 for controlling both the exposure columns 21A and 21B and a pattern-data-memory unit 23 for storing pattern data indicating which mask pattern on the block mask is to be used for exposure. For the exposure columns 21A and 21B, respectively, the electron-beam-exposure device 20 further includes deflection-data generating units 24A and 24B, amplifiers 25A and 25B for amplifying signals from the scattered-electron detecting units, AD converters 26A and 26B for converting analog signals from the amplifiers to digital signals, and waveform memories 27A and 27B for storing the digital signals from the AD converters. The deflection-data generating units 24A and 24B generate mask-deflection data for deflecting the electron beam to a selected pattern on the block mask and deflection data for scanning the electron beam on the wafer according to the pattern data from the pattern-data-memory unit 23.

The electron-beam-exposure device 20 further includes a waveform comparing unit 28 for comparing signal waveforms stored in the waveform memories 27A and 27B.

First, a mask pattern of the block masks 11A and 11B is selected for inspection. In this example, the mask pattern to be inspected is the mask patterns 13A and 13B. Thus, the deflection-data generating units 24A and 24B read pattern data regarding the mask patterns 13A and 13B, respectively, from the pattern-data-memory unit 23 under the control of the CPU 22. The deflection-data generating units 24A and 24B generate mask-deflection data for deflecting the electron beams to the mask patterns 13A and 13B, respectively, based on the pattern data. Using the mask-deflection data, the deflectors 12A and 12B deflect the electron beams such that the electron beams are directed to the selected mask patterns 13A and 13B, respectively. Further, the deflection-data generating units 24A and 24B generate deflection data for scanning the electron beams based on the pattern data. Using the deflection data, the deflectors 17A and 17B scan the electron beams over the wafers.

When the microdots 15A and 15B on the wafers 14A and 14B, respectively, are exposed to the electron beams, the scattered-electron detecting units 16A and 16B detect scattered electrons. Since the electron beams are scanned by the deflectors 17A and 17B, signals detected by the scattered-electron detecting units 16A and 16B have temporal variations reflecting shapes of the mask patterns 13A and 13B, respectively. These signals are stored in the waveform memories 27A and 27B via the amplifiers 25A and 25B and the AD converters 26A and 26B, respectively.

The scanning of the electron beam over the wafer is conducted by deflecting the electron beam to positions dispersed at predetermined intervals in the X direction and the Y direction within a predetermined area on the wafer. By using the electron-beam positions scanned in such a manner as addresses, the signals are stored in the waveform memories 27A and 27B. The amount of scale reduction of the electron beam from the mask to the wafer is the same for both exposure columns 21A and 21B. Therefore, the two signal waveforms stored in the waveform memories 27A and 27B become the same by adjusting the beam positions with an addition of an offset. Namely, even when positions of the microdots 15A and 15B are slightly different from each other, the two signal waveforms coincide with each other if these signals are stored with an appropriate shift in the memory addresses, i.e., a shift of the electron-beam scan positions.

The waveform comparing unit 28 reads the waveforms from the waveform memories 27A and 27B, and compares these waveforms with each other. The comparison of the waveforms is conducted as a comparison of one-dimensional signals rather than a comparison of images having two dimensions, so that complex two-dimensional pattern processing is not necessary. For example, one waveform may be subtracted from the other waveform, and an absolute value of the difference may be checked to determine whether it exceeds a predetermined value. A semiconductor device such as a DSP (digital signal processor) or the like having arithmetic operation functions may be used as the waveform comparing unit 28.

A difference between the two waveforms indicates that either one of the mask patterns 13A or 13B has a defect. In this case, it is possible to rely on a visual inspection to determine which one of the mask patterns 13A and 13B has the defect. However, an automatic determination process as follows is preferably conducted. That is, when a defect is likely to exist, either both masks are replaced, or one of the masks is replaced with a subsequent inspection. A subsequent inspection after the replacement of one of the masks will be repeated until no difference is detected between the two signal waveforms. In this manner, a deficient mask can be removed.

Figure 4:
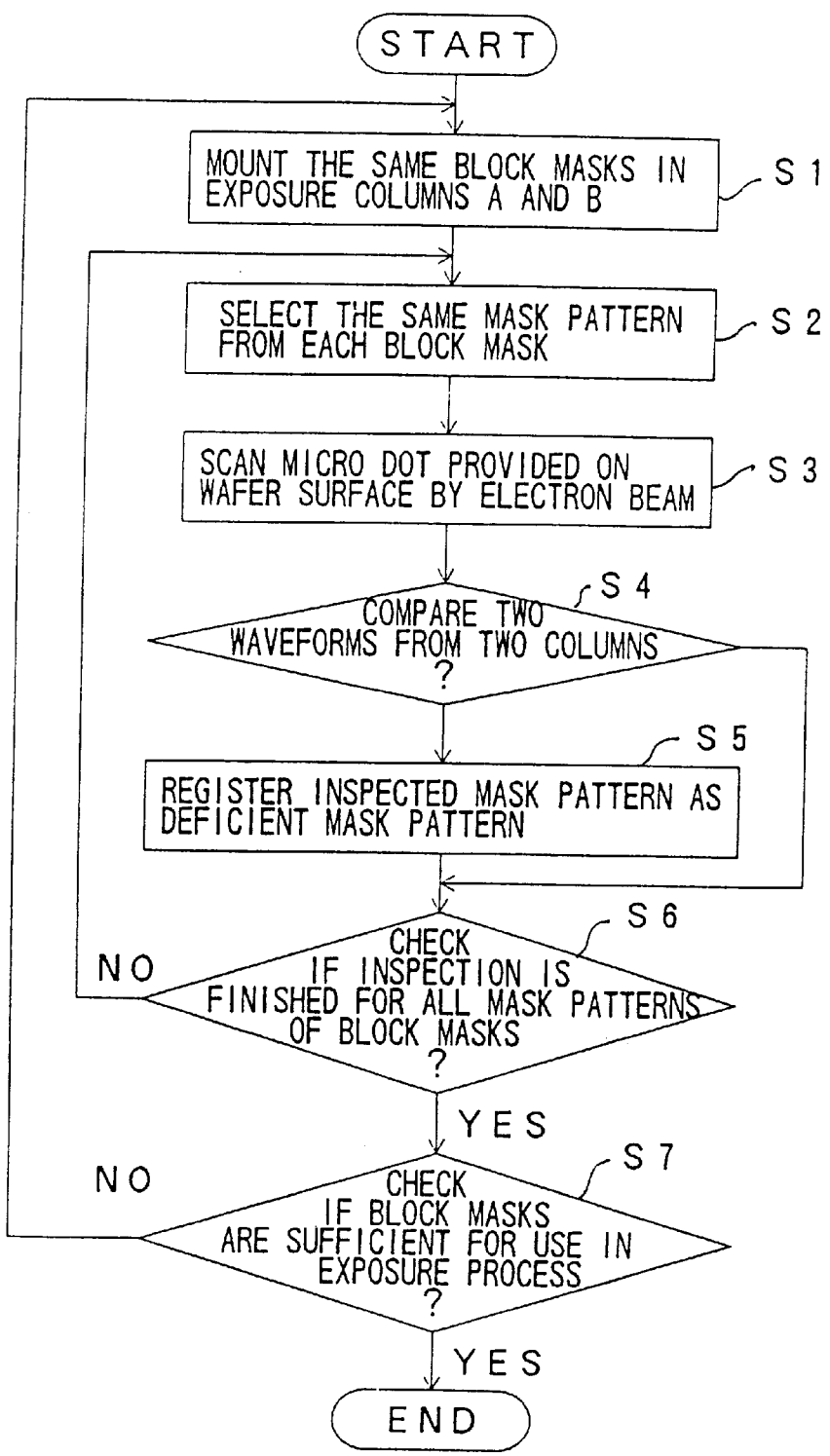
FIG.4 is a flowchart of a mask-inspection process according to the first embodiment of the first principle of the present invention.

FIG.4 is a flowchart of a mask-inspection process according to the first embodiment of the first principle of the present invention.

At a step S1, the same block masks are mounted in exposure columns A and B.

At a step S2, the same mask pattern is selected from each block mask.

At a step S3, a microdot provided on a wafer surface (i.e., provided at the same height as a wafer surface to be actually exposed) is scanned by the electron beam in each column.

At a step S4, two waveforms from the two columns are compared to check whether a difference larger than a predetermined threshold value exists between the two waveforms. If such a difference exists, the procedure goes to a step S5. Otherwise, the procedure goes to a step S6.

At the step S5, the inspected mask pattern is registered as a deficient mask pattern.

At the step S6, a check is made whether the inspection is finished for all the mask patterns of the block masks. If it is, the procedure goes to a step S7. Otherwise, the procedure goes back to the step S2.

At the step S7, a check is made if the block masks are sufficient for use in an exposure process. If they are sufficient, the procedure ends. If the block masks are not sufficient, the procedure goes back to the step S1.

According to the first embodiment of the first principle of the present invention as described above, in the electron-beam exposure method using two exposure columns, mask deficiency of the block masks mounted in the electron-beam-exposure device is easily detected by comparing signal waveforms obtained from the two exposure columns.

Figure 5:
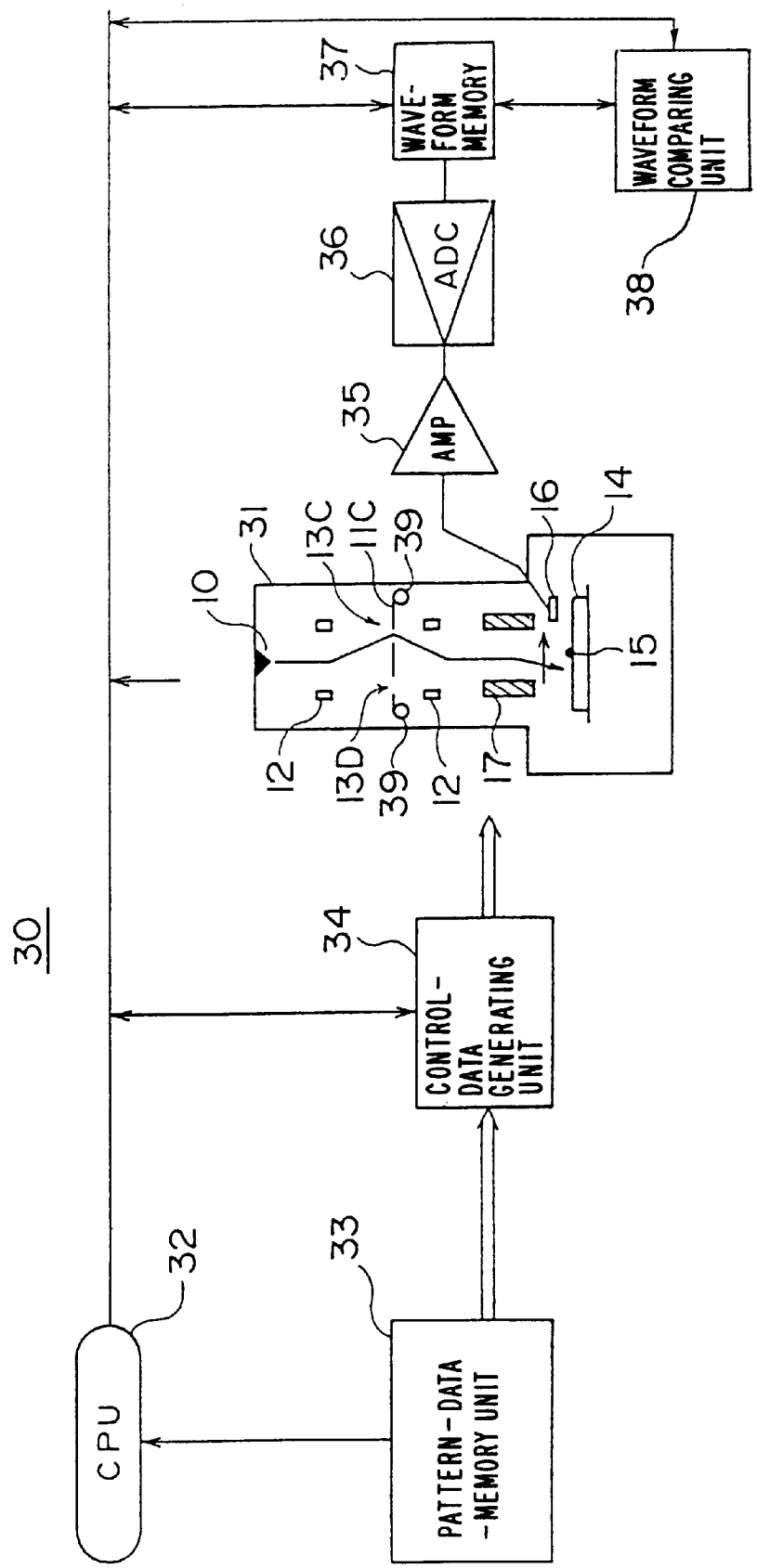
FIG.5 is an illustrative drawing showing a configuration of an electron-beam-exposure device detecting mask deficiency according to a second embodiment of the first principle of the present invention.

FIG.5 is an illustrative drawing showing a configuration of an electron-beam-exposure device 30 detecting mask deficiency according to a second embodiment of the first principle of the present invention. In the second embodiment, a mask inspection is carried out in the case of a single exposure column. In FIG.5, the same elements as those of FIG.2 are referred to by the same numerals, and a description thereof will be omitted.

The electron-beam-exposure device 30 of the second embodiment includes an exposure column 31, a CPU 32, a pattern-data-memory unit 33, a control-data generating unit 34, an amplifier 35, an AD converter 36, a waveform memory 37, and a waveform comparing unit 38. A block mask 11C is provided in the exposure column 31, and has the same mask patterns 13C and 13D.

In the second embodiment, the same mask patterns 13C and 13D are provided for the block mask 11C, and a comparison is made between these two mask patterns to detect mask deficiency. Also, the exposure column 31 further includes a mask carrying stage 39 for carrying the block mask 11C.

In general, a structural arrangement of a block mask is such that a plurality of mask areas are provided for one block mask with each mask area containing a plurality of mask patterns. Within a mask area, the electron beam can be directed to any position through deflection. When mask patterns in another mask area are to be used, the block mask is shifted in a horizontal direction by the mask carrying stage, so that the pertinent mask area is located near an axis of the electron beam, thereby allowing a selection of a mask pattern in that mask area by the deflected electron beam.

In the second embodiment, the mask patterns 13C and 13D described above are provided one each for different mask areas. Then, the mask carrying stage 39 is used for shifting the block mask 11C to successively select one of the mask patterns 13C and 13D. The reason why the same mask patterns are provided one each for different mask areas is because the provision of the same mask patterns in the same mask area leads to ineffective use of space during an actual exposure process. That is, this is not an inherent feature of the first principle of the present invention.

First, the mask pattern 13C of the block masks 11C is selected for inspection. Thus, the control-data generating unit 34 reads pattern data regarding the mask pattern 13C from the pattern-data-memory unit 33 under the control of the CPU 32. Based on the pattern data, the control-data generating unit 34 generates mask-carrying-stage data for shifting a mask area of the mask pattern 13C near to the axis of the electron beam and mask-deflection data for deflecting the electron beam to the mask pattern 13C. Based on the mask-carrying-stage data, the mask carrying stage 39 brings the mask area of the mask pattern 13C near to the axis of the electron beam. Using the mask-deflection data, the deflector 12 deflects the electron beam such that the electron beam is directed to the selected mask pattern 13C. The deflector 17 scans the electron beam over the wafer.

When the microdot 15 on the wafer 14 is exposed to the electron beam, the scattered-electron detecting unit 16 detects scattered electrons. Since the electron beam is scanned by the deflector 17, a signal detected by the scattered-electron detecting unit 16 has temporal variations reflecting the shape of the mask pattern 13C. This signal is stored in the waveform memory 37 via the amplifier 35 and the AD converter 36.

After the waveform data of the mask pattern 13C is collected, waveform data of the mask pattern 13D is collected in the same manner. The waveform data of the mask pattern 13C and the waveform data of the mask pattern 13D are stored at different addresses in the waveform memory 37. The waveform comparing unit 38 reads the two waveforms from the waveform memory 37 to compare them.

A difference between the two waveforms indicates that either one of the mask pattern 13C or 13D has a defect. In this case, it is possible to rely on a visual inspection to determine which one of the mask patterns 13C and 13D has the defect. However, an automatic determination process as follows is preferably conducted. That is, when a defect is likely to exist, the mask is replaced with a subsequent inspection. A subsequent inspection after the replacement of the mask will be repeated until no difference is detected between the two signal waveforms. In this manner, a deficient mask is excluded.

Figure 6:
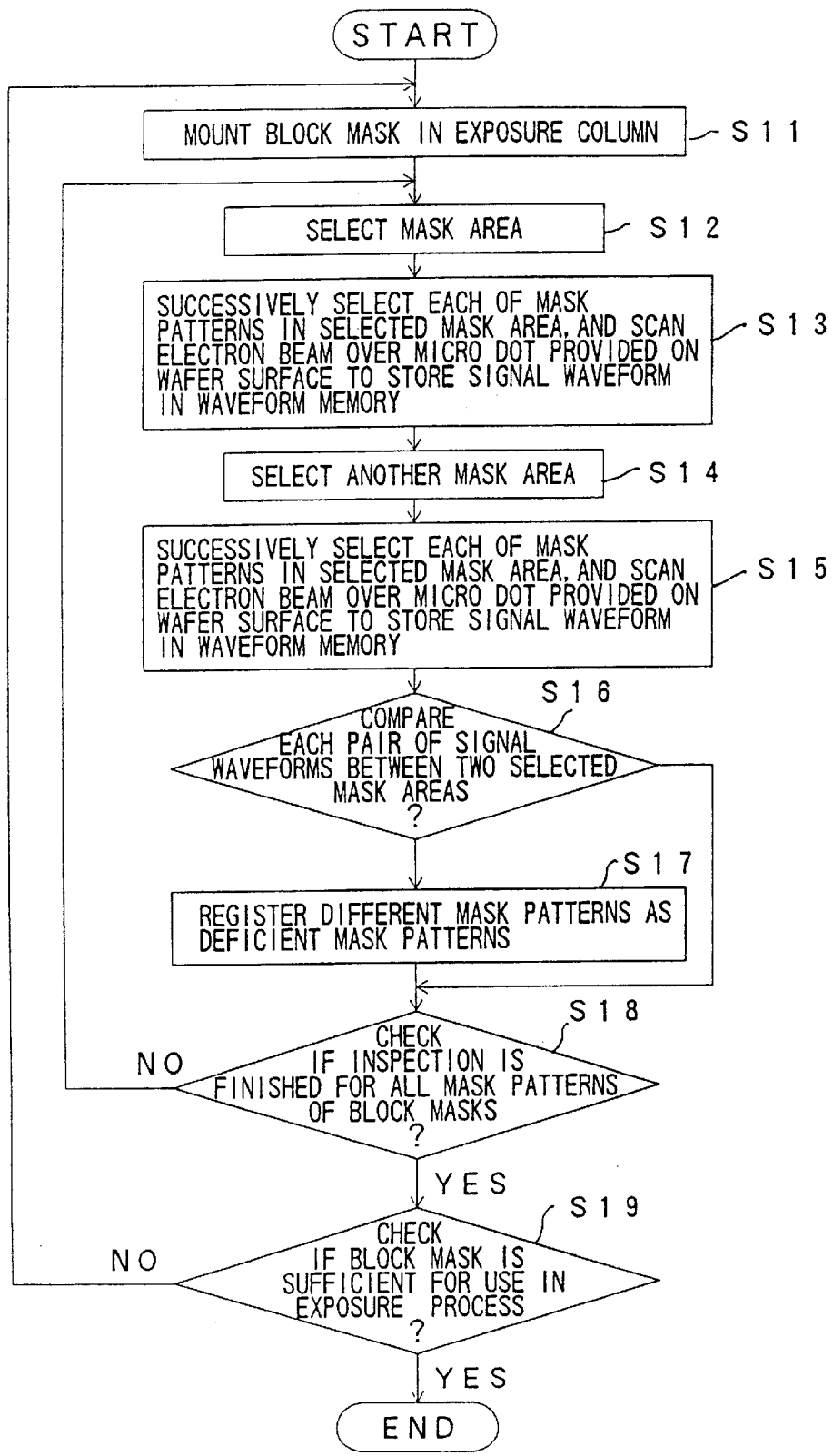
FIG.6 is a flowchart of a mask-inspection process according to the second embodiment of the first principle of the present invention.

FIG.6 is a flowchart of a mask-inspection process according to the second embodiment of the first principle of the present invention.

At a step S11, a block mask having the same mask patterns in at least two mask areas is mounted in an exposure column.

At a step S12, a mask area is selected.

At a step S13, each of the mask patterns in the selected mask area is successively selected, and a microdot provided on a wafer surface (i.e., provided at the same height as a wafer surface to be actually exposed) is scanned by the electron beam to store a signal waveform in a waveform memory.

At a step S14, another mask area having the same mask patterns is selected by shifting a mask-carrying stage.

At a step S15, each of the mask patterns in the selected mask area is successively selected, and a microdot provided on a wafer surface (i.e., provided at the same height as a wafer surface to be actually exposed) is scanned by the electron beam to store a signal waveform in a waveform memory.

At a step S16, each pair of signal waveforms stored in the waveform memory are compared between the two selected mask areas to check whether a difference larger than a predetermined threshold value exists between the two waveforms. If such a difference exists, the procedure goes to a step S17. Otherwise, the procedure goes to a step S18.

At the step S17, each mask pattern having the difference is registered as a deficient mask pattern.

At the step S18, a check is made whether the inspection is finished for all the mask patterns of the block masks. If it is, the procedure goes to a step S19. Otherwise, the procedure goes back to the step S12.

At the step S19, a check is made if the block mask is sufficient for use in an exposure process. If it is sufficient, the procedure ends. If the block mask is not sufficient, the procedure goes back to the step S11.

According to the second embodiment of the first principle of the present invention as described above, mask deficiency of the block mask mounted in the electron-beam-exposure device is easily detected by comparing signal waveforms obtained from the same mask patterns provided on the same block mask.

In the first or second embodiment of the first principle described above, the inspection of FIG.4 or FIG.6 may be carried out twice, once before an exposure process and once after the exposure process. In this case, a pattern defect caused by the exposure process (e.g., pattern damage caused by heat) can be detected.

Also, it is apparent that an inspection can be exclusively focused on the pattern deficiency caused by an exposure process by collecting data of the same mask pattern once before the exposure process and once after the exposure process. That is, two signal waveforms before and after the exposure process are compared to determine if there is mask deficiency caused by the exposure process.

Figure 7:
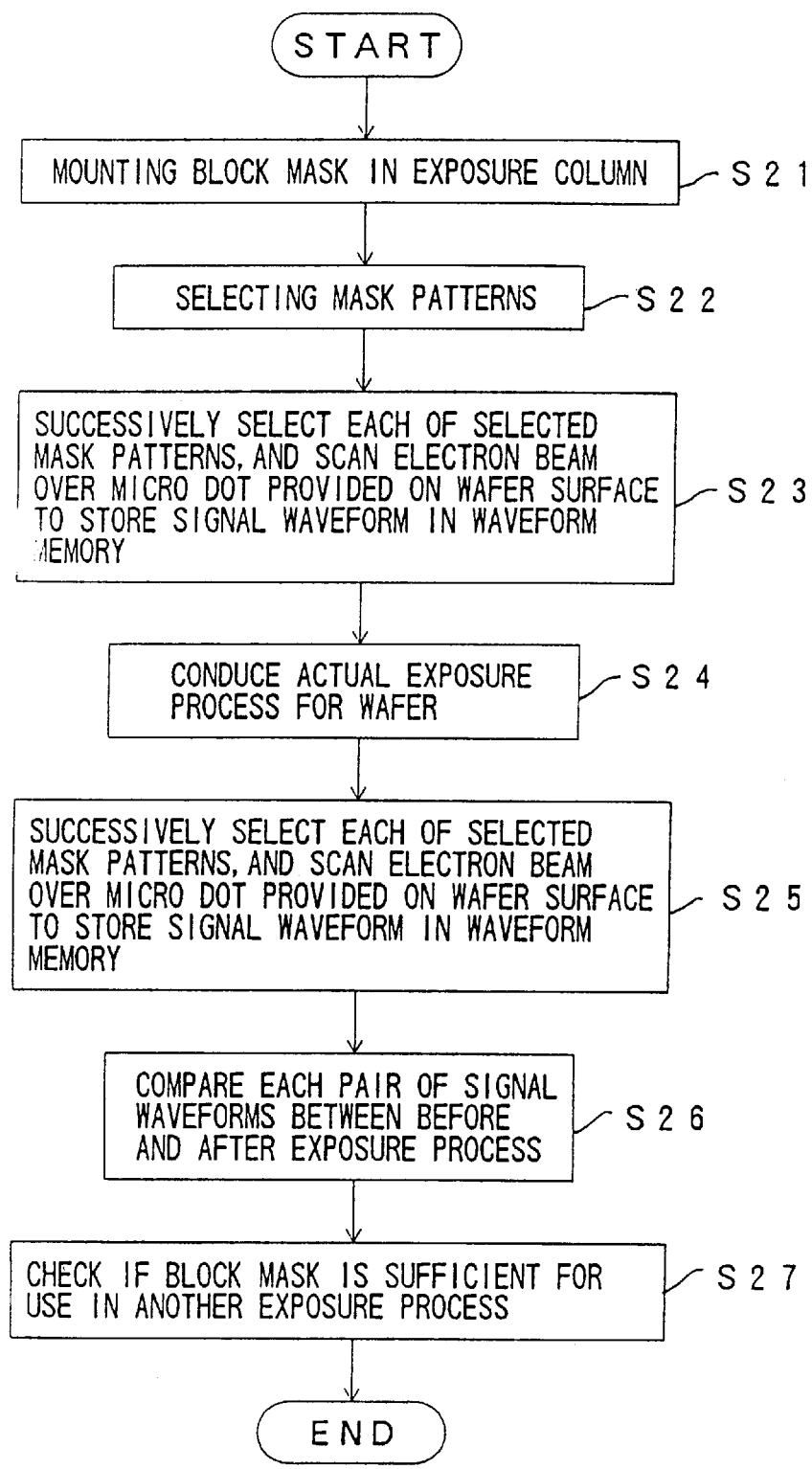
FIG.7 is a flowchart of a process of detecting pattern deficiency caused by an exposure process according to a third embodiment of the first principle of the present invention.

FIG.7 is a flowchart of a process of detecting pattern deficiency caused by an exposure process according to a third embodiment of the first principle of the present invention.

At a step S21, a block mask is mounted in an exposure column.

At a step S22, mask patterns to be inspected are selected.

At a step S23, each of the selected mask patterns is successively exposed to the electron beam, and a microdot provided on a wafer surface (i.e., provided at the same height as a wafer surface to be actually exposed) is scanned by the electron beam to store a signal waveform in a waveform memory.

At a step S24, an actual exposure process for a wafer is conducted.

At a step S25, each of the selected mask patterns is successively exposed to the electron beam, and a microdot provided on a wafer surface (i.e., provided at the same height as a wafer surface to be actually exposed) is scanned by the electron beam to store a signal waveform in a waveform memory.

At a step S26, each pair of signal waveforms stored in the waveform memory before and after the exposure process are compared to check whether a difference larger than a predetermined threshold value exists between the two waveforms.

At the step S27, a check is made to determine if the block mask is sufficient for use in another exposure process. This ends the procedure.

According to the third embodiment of the first principle of the present invention as described above, mask deficiency caused by an exposure process is easily detected by comparing signal waveforms obtained from the same mask pattern before and after the exposure process.

Figure 8:
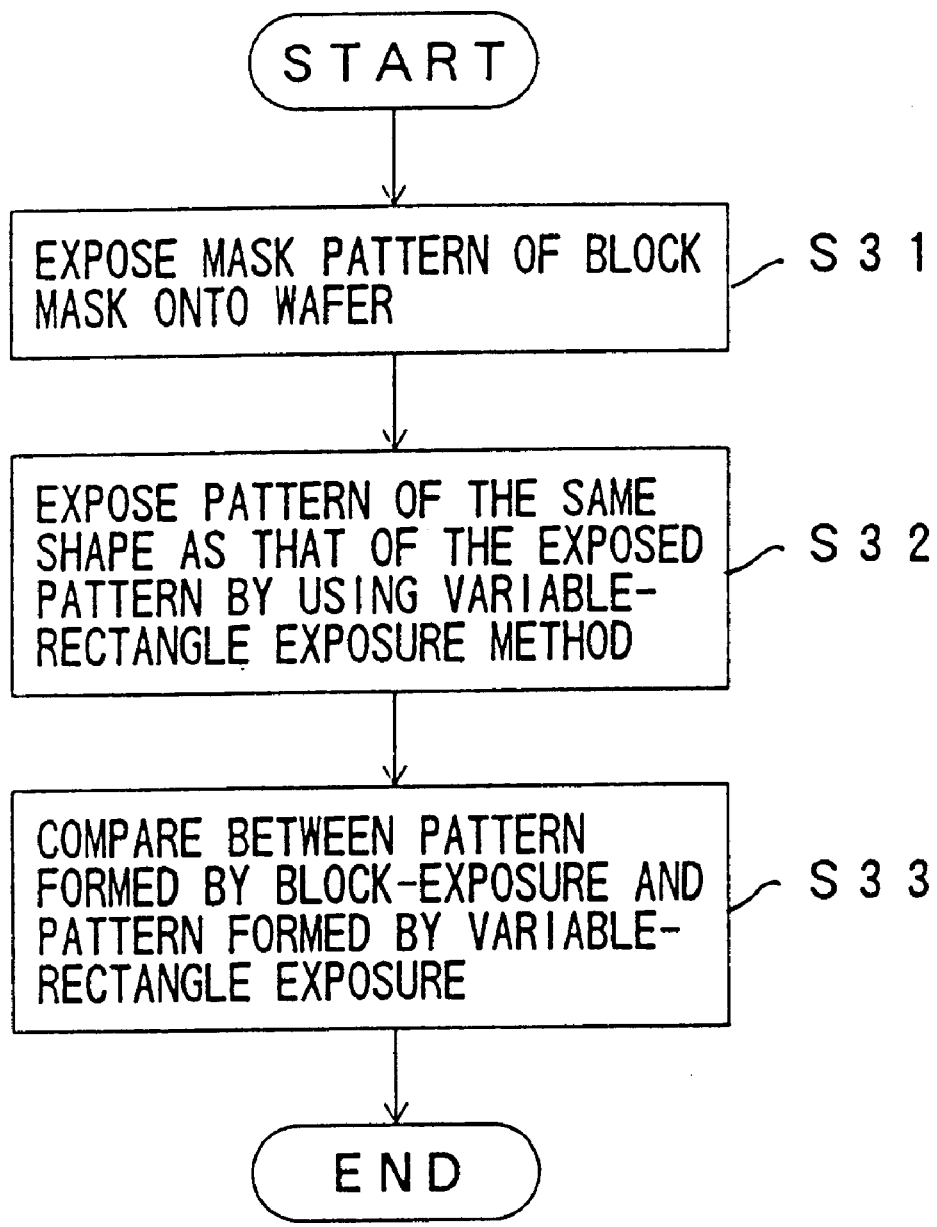
FIG.8 is a flowchart of a mask-pattern-inspection process according to a second principle of the present invention.

FIG.8 is a flowchart of a mask-pattern-inspection process according to a second principle of the present invention.

In the mask-pattern-inspection method according to the second principle of the present invention, at a step S31, a mask pattern of a block mask is exposed onto a wafer.

At a step S32, a pattern of the same shape as that of the exposed pattern is exposed by using the variable-rectangle exposure method.

At a step S33, a comparison is made between the pattern formed by the block-exposure and the pattern formed by the variable-rectangle exposure.

In the variable-rectangle exposure, a given pattern is represented by dividing the pattern into a plurality of rectangles having a different size and shape, and each rectangle is successively exposed to together form a whole pattern. Therefore, when the variable-rectangle exposure is used, shape data of the pattern to be exposed is necessary. In the mask-pattern-inspection method according to the second principle of the present invention, the pattern exposed by the variable-rectangle exposure method is the same pattern as the mask pattern used for the block exposure method, so that shape data of the mask pattern used for having created the block mask can be used without any change. Therefore, there is no need to create other shape data in advance in order to inspect the mask pattern according to the second principle of the present invention.

Also, if a pair of patterns to be compared are exposed on different chips, the same test procedure as used in the test of a conventional photomask, i.e., a comparison of two chips with each other, can be employed. Namely, a conventional comparison-inspection device can be used for the inspection of the mask pattern.

As described above, according to the second principle of the present invention, a mask-pattern inspection is easily carried out by comparing two exposed patterns of the same shape, with one of the exposed patterns exposed by the block exposure method and the other exposed by the variable-rectangle exposure method.

Figure 9:
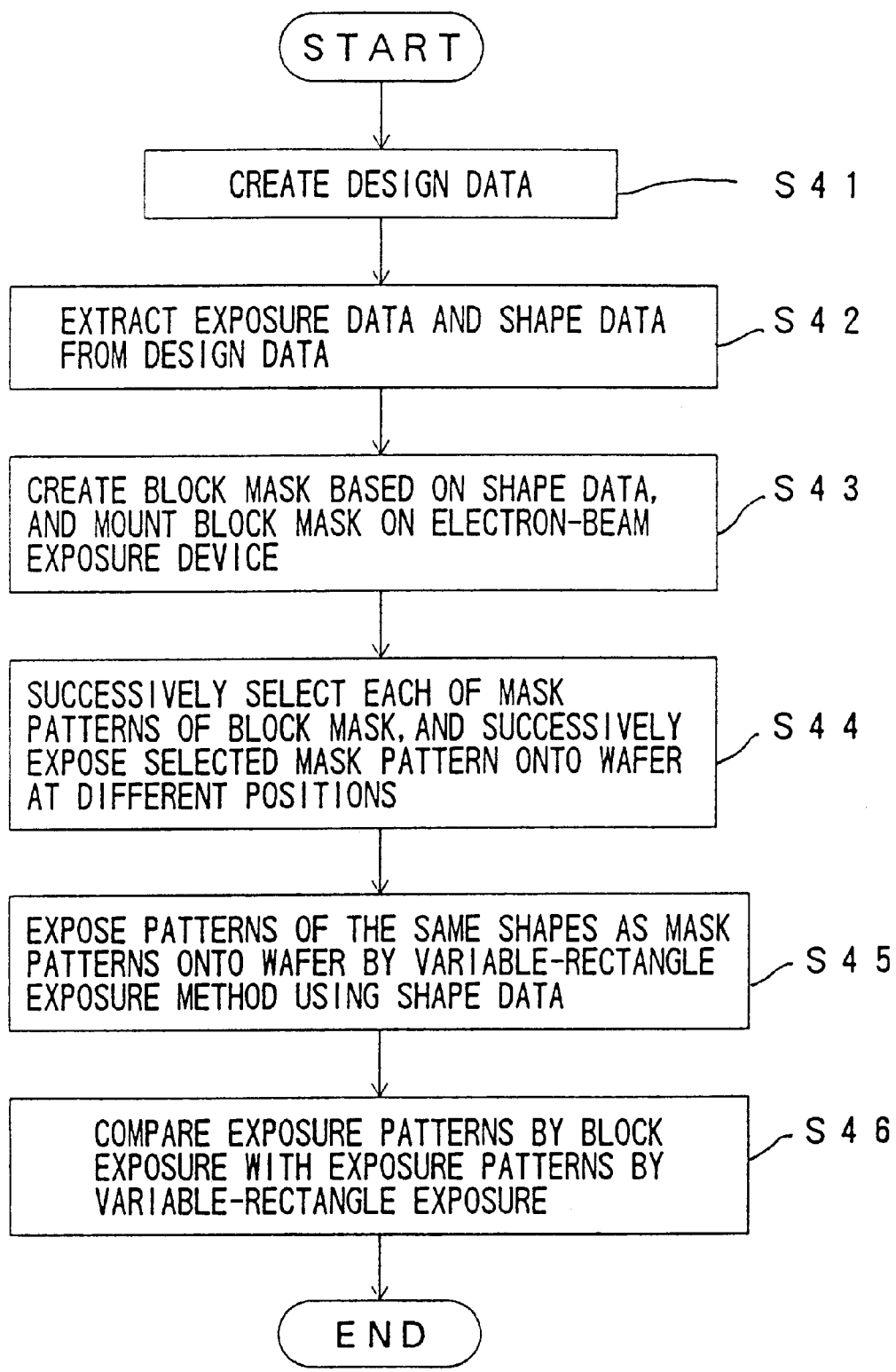
FIG.9 is a flowchart of a mask-pattern-inspection process according to an embodiment of the second principle of the present invention.

FIG.9 is a flowchart of a mask-pattern-inspection process according to an embodiment of the second principle of the present invention.

At a step S41, design data is created.

At a step S42, exposure data and shape data are extracted from the design data in a block-extraction process. Namely, repeating portions of the design data are extracted, and the exposure data used for exposing the repeating portions by the block exposure method is created, i.e., the pattern data indicating which mask pattern is exposed at which position on the wafer is created. As for portions other than the repeating portions, the exposure data for the variable-rectangle exposure method is created, i.e., data indicating which rectangle is exposed at which position on the wafer is created. Further, the shape data representing a shape of each mask pattern is generated for the creation of a block mask.

At a step S43, the block mask is created based on the shape data, and is mounted on an electron-beam exposure device.

The steps up to the step S43 are necessary steps for conducting an exposure process by the block exposure method. Namely, in the exposure process by the block exposure method, the block mask and the exposure data described above are used for exposing patterns on a wafer in accordance with the design data. Steps after the step S43 are the steps of the mask-pattern inspection of the block mask.

Figure 10A:
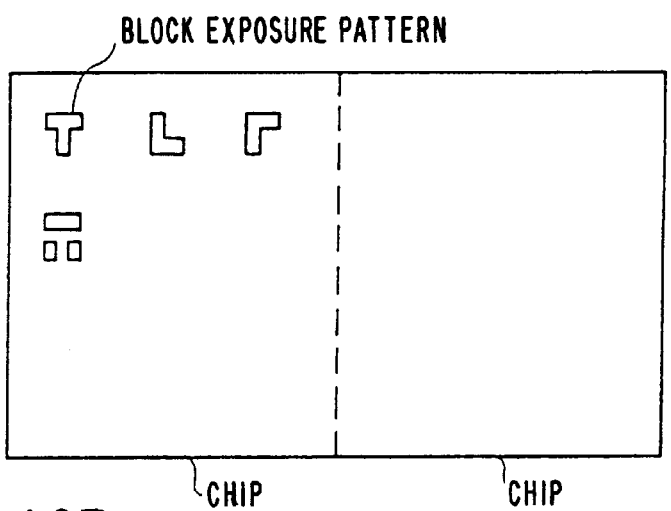
FIG.10A is an illustrative drawing showing an example of a wafer on which mask patterns are exposed at different positions.

At a step S44, each of the mask patterns of the block mask is successively selected to be exposed onto the wafer at different positions thereof. FIG.10A is an illustrative drawing showing an example of a wafer on which mask patterns are exposed at different positions.

Figure 10B:
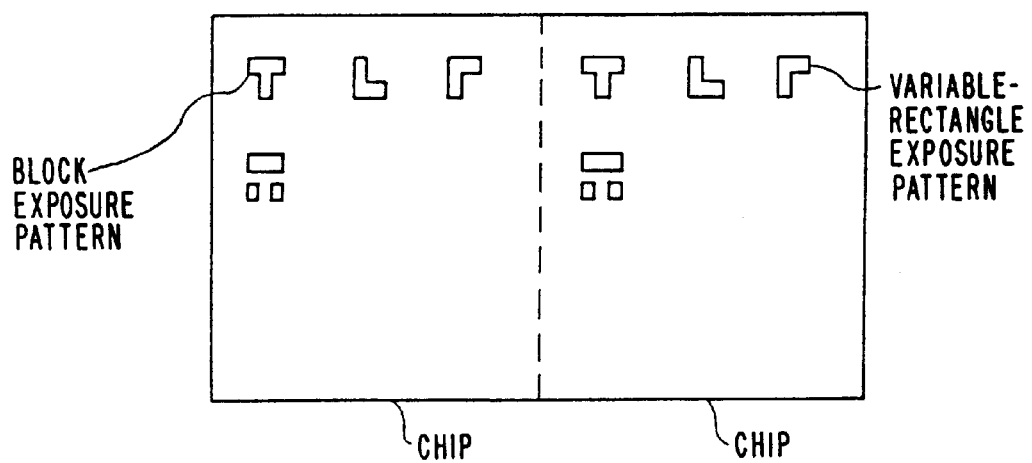
FIG.10B is an illustrative drawing showing an example of a wafer on which patterns having the same shapes as the mask patterns are exposed by the variable-rectangle exposure method.

At a step S45, patterns having the same shapes as the mask patterns are exposed onto the wafer by the variable-rectangle exposure method using the shape data. Pattern exposures by the variable-rectangle exposure method are made to a chip adjacent to the chip on which the block exposures are carried out. FIG.10B is an illustrative drawing showing an example of the wafer on which patterns having the same shapes as the mask patterns are exposed by the variable-rectangle exposure method.

At a step S46, the exposure patterns by the block exposure and the exposure patterns by the variable-rectangle exposure are compared with each other. In this comparison, a conventional comparison-inspection device can be used as previously described. This ends the procedure.

At the step S44 and the step S45 described above, the mask patterns may be exposed onto the wafer in the same size as when these mask patterns are exposed during an actual exposure process. In order to achieve more precise pattern inspection, however, it is preferable to expose patterns expanded to be larger than the size used in the actual exposure process.

For the pattern inspection of this embodiment, a glass board coated with a thin metal layer (e.g., Cr wafer) is preferably used, and a pattern is transferred onto the metal layer by etching. This is because a sharper pattern than a resist pattern can be formed on the metal layer on the glass board to achieve more reliable inspection by using the comparison-inspection device.

As described above, according to the embodiment of the second principle of the present invention, two patterns of the same shape are exposed by the block exposure method and by the variable-rectangle exposure method, so that the mask-pattern inspection is easily carried out by comparing these two patterns. Since the pattern inspection is carried out by using as reference the patterns exposed by the variable-rectangle exposure method, a pattern distortion and an error in size reduction from the block mask to the wafer in the block exposure method are also checked.

In the following, a third principle of the present invention will be described with reference to the accompanying drawings.

Figure 11:
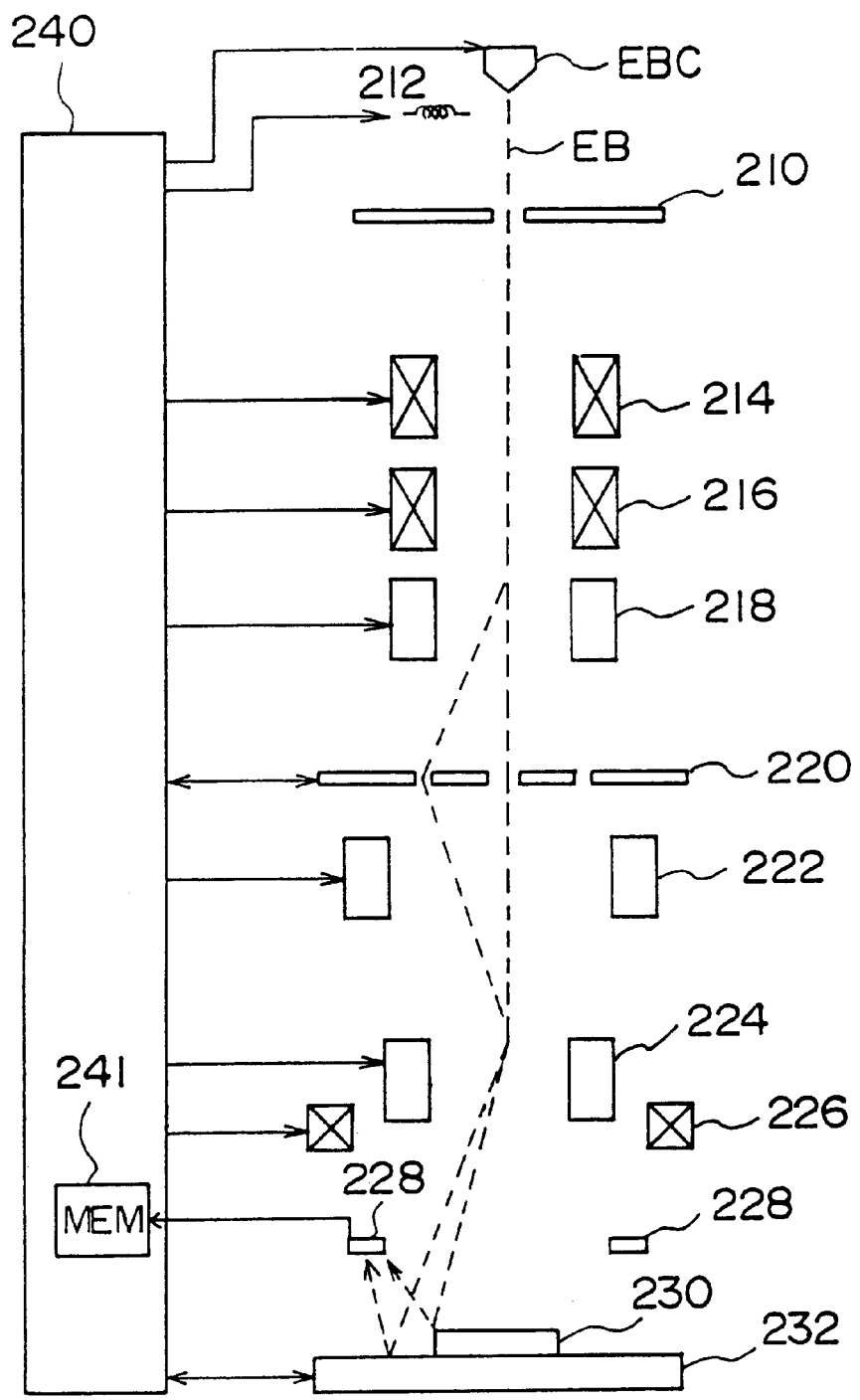
FIG.11 is an illustrative drawing showing a system configuration of an electron-beam exposure device according to an embodiment of a third principle of the present invention.

FIG.11 is an illustrative drawing showing a system configuration of an electron-beam exposure device according to an embodiment of the third principle of the present invention. The electron-beam exposure device of FIG.11 includes an electron-beam gun EBG, a first-slit plate 210, an alignment coil 212, a rotation-correction coil 214, a distortion-correction coil 216, a deflector 218, a second-slit plate 220, a deflector 222, a deflector 224, a projection lens 226, a scattered-electron detecting unit 228, a wafer 230, a stage 232, and a control unit 240.

An electron beam EB is aligned to an axis by the alignment coil 212 to pass through a first slit (aperture) of the first-slit plate 210. The first slit shapes a cross section of the electron beam EB into a rectangle shape in a normal condition. The rotation-correction coil 214 is any type of means for correcting rotation of the first-slit image of the electron beam EB. The distortion-correction coil 216 is any type of means for correcting distortion of the first-slit image of the electron beam EB. The deflector 218 is a static-charge deflector for deflecting the electron beam EB.

The electron beam EB deflected by the deflector 218 forms the first-slit image on the second-slit plate 220. Then, the electron beam EB passes through an aperture (second slit) of the second-slit plate 220, and is deflected back to the axis by the deflector 222. The deflector 224 deflects the electron beam EB to direct it to a desired position on the wafer 230. The projection lens 226 forms an image on the wafer 230. The stage 232 carries the wafer 230, and is movable in a horizontal direction.

The control unit 240 drives and controls the deflectors and coils described above, and will be described later in detail. In brief, the control unit 240 is provided with exposure data to generate exposure patterns, and drives the deflectors and the like according to the generated exposure patterns.

The scattered-electron detecting unit 228 is used for detecting a positioning mark provided on the wafer 230. When the electron-beam exposure device is used for creating an integrated circuit, a plurality of patterns need to be overlaid one over another to form a desired structure. Thus, an exposure of each pattern is conducted such that a given pattern is precisely overlaid on a previously formed pattern by checking the coordinate position of the previously formed pattern. For this reason, positioning marks formed from metal to scatter a large number of electrons are formed on the wafer 230.

In this embodiment, the electron beam EB is directed to a beam-shape-detection pattern formed on a holder (stage 232), and the scattered-electron detecting unit 228 is used for detecting scattered electrons to measure the beam shape. Then, correction amounts are obtained according to a predetermined algorithm. Therefore, without the steps of an exposure, a development, and a check by a microscope, a beam-shape adjustment can be made by providing the correction amount as a feedback input. Marks formed on the wafer 230 may also be used for the same purpose as the beam-shape-detection pattern.

Figure 12:
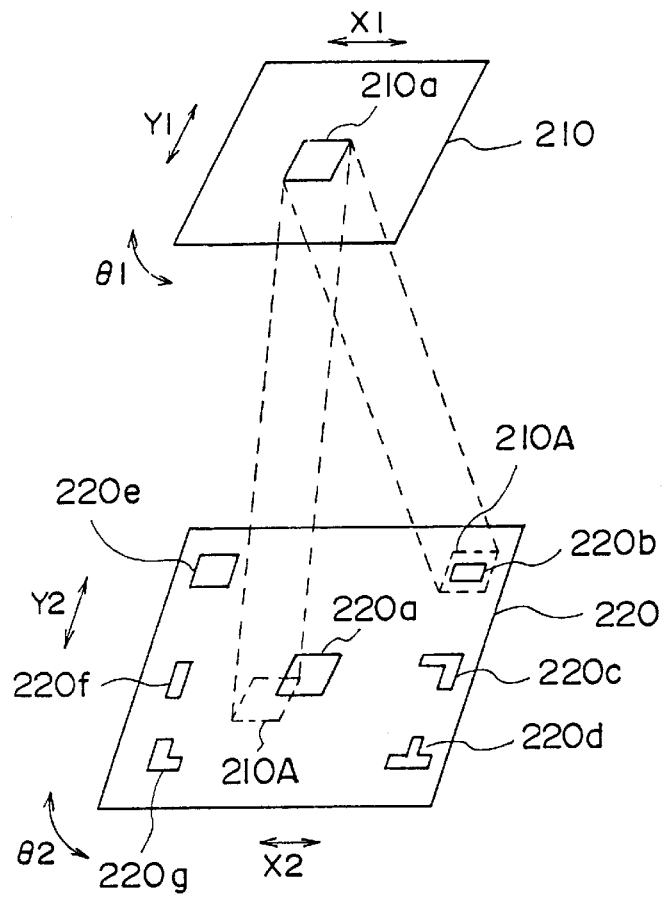
FIG.12 is an illustrative drawing for explaining a relation between a first slit of a first-slit plate and a second slit of a second-slit plate.

FIG.12 is an illustrative drawing for explaining a relation between the first slit of the first-slit plate 210 and the second slit of the second-slit plate 220. A first slit 210a of a rectangular shape is formed through the first-slit plate 210, and forms the cross section of the electron beam EB into a rectangular shape. A second slit 220a of a rectangular shape is formed through the second-slit plate 220. The second slit 220a is positioned at the center of the second-slit plate 220, for example, and is surrounded by apertures 220b through 220g having various shapes. An image of the first slit 210a of the electron beam EB formed on the second-slit plate 220 is combined with the second slit 220a to create a cross section having a desired rectangle shape.

In the electron-beam exposure device, the second-slit plate 220 is provided with a plurality of apertures having various shapes of frequently-used-mask patterns, so that the throughput of the device can be enhanced. The apertures 220b through 220g are such apertures. The electron beam EB is directed to a selected one of the apertures 220b through 220g, so that a pattern of the selected one of the apertures can be exposed onto the wafer 230.

As long as a relative positional relation between the second slit 220a and the image of the first slit 210a formed on the second-slit plate 220 is appropriate, a pattern exposed onto the wafer 230 will have a desired shape. If the slit plates are displaced in a X direction and/or in a Y direction, or are at an angle, the desired pattern cannot be formed. Also, when the electron beam EB is deflected by a large amount to the pattern 220b, for example, an image of the first slit 210a may be distorted into a rhombus.

In the following, various cases will be described, in which the relative position between the second slit 220a and the image of the first slit 210a formed on the second-slit plate 220 is displaced, or the image of the first slit 210a is distorted. An algorithm for feeding back the correction amounts for these various cases is provided by the third principle of the present invention.

Figure 13:
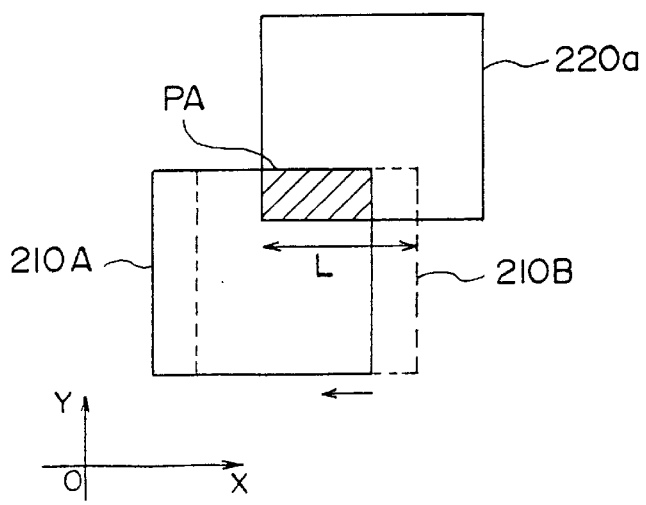
FIG.13 is an illustrative drawing showing a case in which a first-slit image of the first slit is displaced toward a negative side in an X direction.

FIG.13 is an illustrative drawing showing a case in which a first-slit image 210A of the first slit 210a is displaced toward a negative side in the X direction. A rectangle 210B shown by dotted lines shows a desired position of the first-slit image 210A. Thus, when an upper part of the first-slit image 210A is superimposed with a lower part of the second slit 220a, a resulting pattern PA has a length in the X direction shorter than a desired length L. A relative position between the two slits is all that matters here, so that the same applies when the second slit 220a is displaced toward a positive side in the x direction.

FIG.14 is an illustrative drawing showing a case in which the first-slit image 210A is displaced toward a positive side in the X direction. As a result, when an upper part of the first-slit image 210A is superimposed with a lower part of the second slit 220a, a resulting pattern PB has a length in the X direction longer than a desired length L.

FIG.15 is an illustrative drawing showing a case in which the first-slit image 210A is rotated clockwise by an angle e with respect to the second slit 220a. As a result, when an upper part of the first-slit image 210A is superimposed with a lower part of the second slit 220a, a resulting pattern PC1 has a distorted shape.

Figure 16:
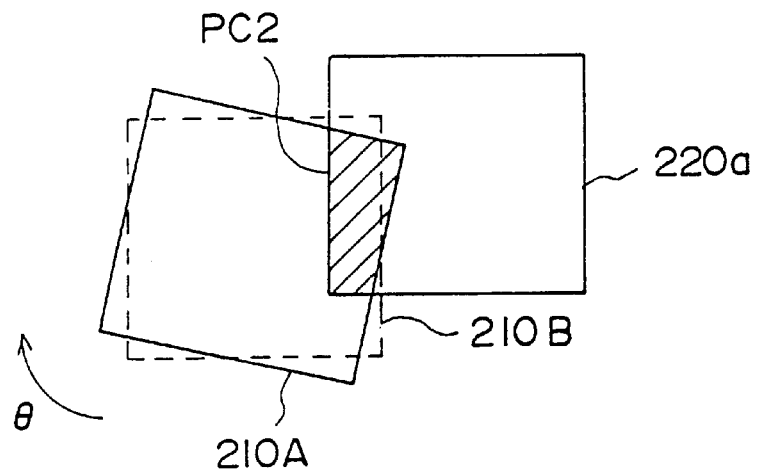
FIG.16 is an illustrative drawing showing another case in which the first-slit image is rotated clockwise by an angle θ with respect to the second slit.

FIG.16 is an illustrative drawing showing another case in which the first-slit image 210A is rotated clockwise by an angle θ with respect to the second slit 220a. As a result, when a right part of the first-slit image 210A is superimposed with a left part of the second slit 220a, a resulting pattern PC2 has a distorted shape.

Figure 17:
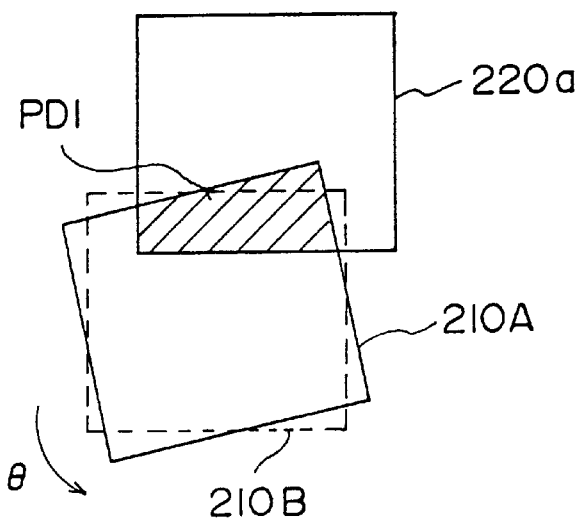
FIG.17 is an illustrative drawing showing a case in which the first-slit image is rotated counter-clockwise by an angle θ with respect to the second slit.

FIG.17 is an illustrative drawing showing a case in which the first-slit image 210A is rotated counter-clockwise by an angle θ with respect to the second slit 220a. As a result, when an upper part of the first-slit image 210A is superimposed with a lower part of the second slit 220a, a resulting pattern PD1 has a distorted shape.

Figure 18:
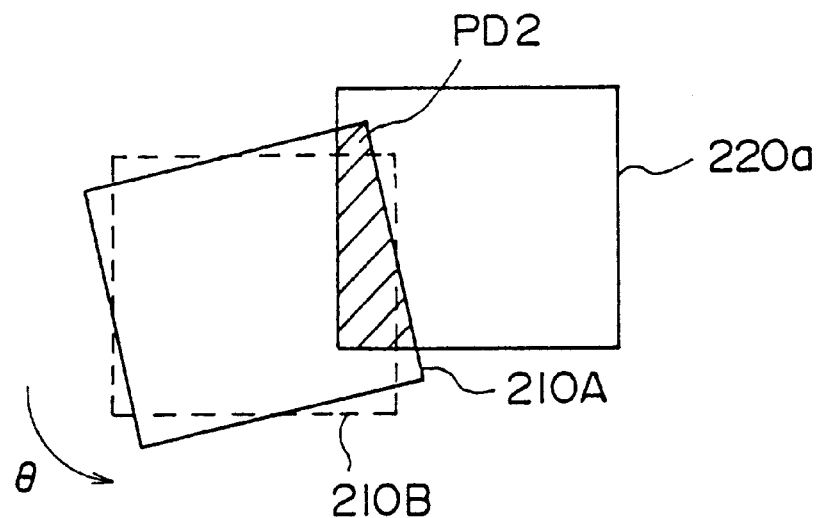
FIG.18 is an illustrative drawing showing another case in which the first-slit image is rotated counter-clockwise by an angle θ with respect to the second slit.

FIG.18 is an illustrative drawing showing another case in which the first-slit image 210A is rotated counter-clockwise by an angle θ with respect to the second slit 220a. As a result, when a right part of the first-slit image 210A is superimposed with a left part of the second slit 220a, a resulting pattern PC2 has a distorted shape.

Figure 19:
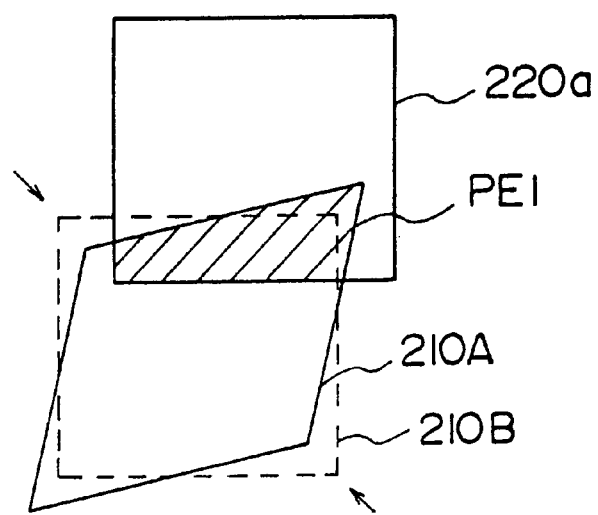
FIG.19 is an illustrative drawing showing a case in which the first-slit image is distorted in directions shown by arrows to become a rhombus.

FIG.19 is an illustrative drawing showing a case in which the first-slit image 210A is distorted in directions shown by arrows to become a rhombus. As a result, when an upper part of the first-slit image 210A is superimposed with a lower part of the second slit 220a, a resulting pattern PE1 has a distorted shape.

FIG.20 is an illustrative drawing showing another case in which the first-slit image 210A is distorted in directions shown by arrows to become a rhombus. As a result, when a right part of the first-slit image 210A is superimposed with a left part of the second slit 220a, a resulting pattern PE2 has a distorted shape.

FIG.21 is an illustrative drawing showing yet another case in which the first-slit image 210A is distorted in directions shown by arrows to become a rhombus. As a result, when a upper part of the first-slit image 210A is superimposed with a lower part of the second slit 220a, a resulting pattern PF1 has a distorted shape.

Figure 22:
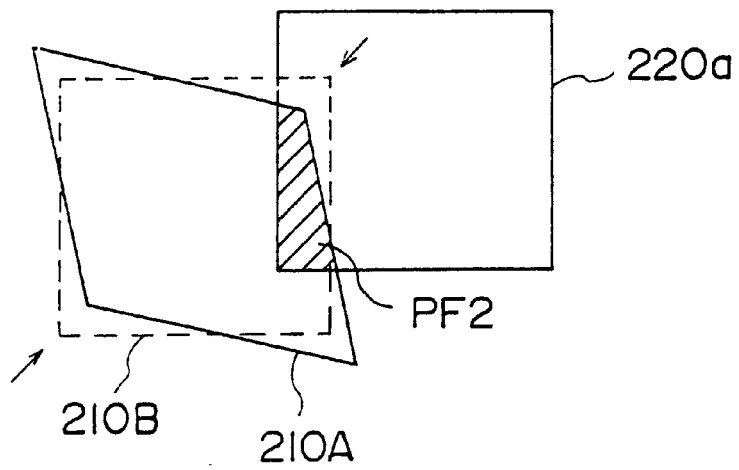
FIG.22 is an illustrative drawing showing still another case in which the first-slit image is distorted in directions shown by arrows to become a rhombus.

FIG.22 is an illustrative drawing showing still another case in which the first-slit image 210A is distorted in directions shown by arrows to become a rhombus. As a result, when a right part of the first-slit image 210A is superimposed with a left part of the second slit 220a, a resulting pattern PF2 has a distorted shape.

The positional displacements (horizontal displacements and rotational displacement) and the image distortions described above are typical examples observed when the first slit is superimposed on the second slit in the electron-beam exposure device of FIG.11. Thus, if these cases are detected by a predetermined algorithm without relying on a visual inspection, a correction process can be automatized to reduce the number of steps required for the beam adjustment.

Figure 23:
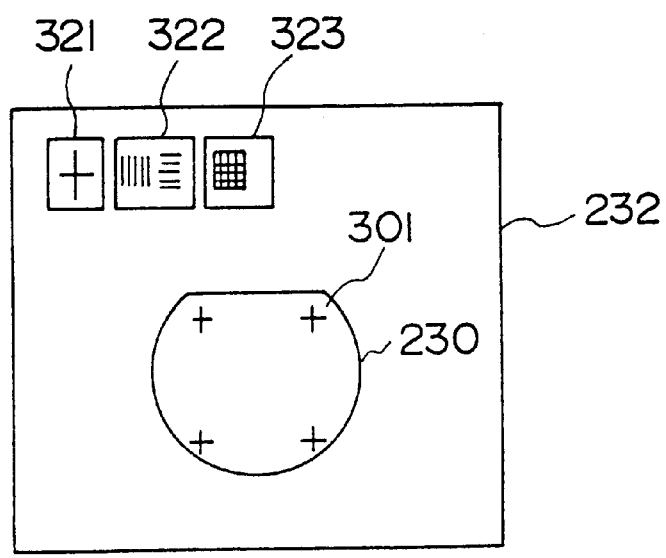
FIG.23 is a plan view of an example of a stage and a wafer carried thereon.

FIG.23 is a plan view of an example of the stage 232 and the wafer 230 carried thereon. As described with reference to FIG.1, positioning marks 301 for detecting the coordinates of the wafer are formed on an upper surface of the wafer 230. The positioning marks 301 are scanned by the electron beam EB, and the scattered-electron detecting unit 228 detects the scattered electrons to measure the position of the positioning marks 301. In this embodiment, chips 321 through 323 formed from silicon or the like are provided on the stage 232, carrying patterns of predetermined shapes formed from metal layers such as Ta. The electron beam after the superimposition of the first slit on the second slit is scanned over these patterns, and the scattered electrons are detected to measure the above-described displacement or distortion.

Most typically, a cross-shape pattern formed by perpendicularly crossing two lines as shown on the chip 321 is effective. As described before, the positioning marks 301 on the wafer 230 can be used for the same purpose as the cross-shape pattern on the chip 321.

In the following, a method of detecting pattern displacement and pattern distortion will be described.

FIGS.24A through 24E are illustrative drawings showing a method of detecting pattern displacement according to the embodiment of the third principle of the present invention.

As shown in FIG.24A, the electron beam after the superimposition is scanned over the cross-shape pattern 321a in the X direction. As a result, a scattered-electron signal waveform as shown in FIG.24B is obtained. Then, as shown in FIG.24C, the electron beam is displaced by a distance L equal to the length of the desired superimposed pattern, and is scanned over the cross-shape pattern 321a in the X direction. As a result, a scattered-electron signal waveform as shown in FIG.24D is obtained. Then, scattered-electron waveforms of FIGS.24B and 24D are combined with each other such that axes of the waveforms corresponding to the scan position match between these two waveforms. As a result, the combined signal as shown in FIG.24E is obtained.

In this example, no displacement is assumed (i.e., the superimposed cross-sectional shape of the electron beam aptly has a desired shape), so that the combined signal of FIG.24E is a continuous signal with a constant magnitude.

Figure 25A:
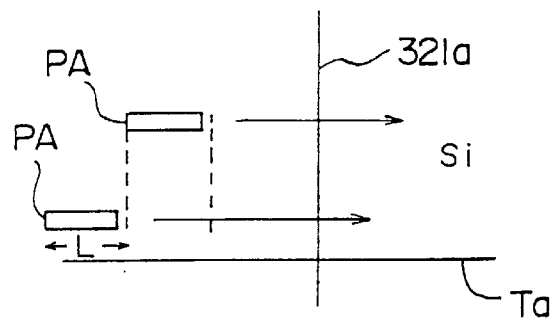
FIGS.25A through 25G are illustrative drawings showing a detection of pattern displacement when a superimposed image has a shorter length than a desired length.
Figure 25B:
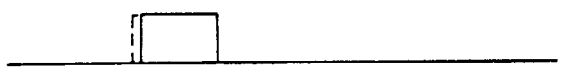
Figure 25C:
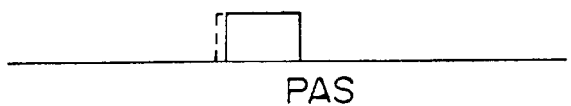
Figure 25D:
Figure 25E:
Figure 25F:
Figure 25G:
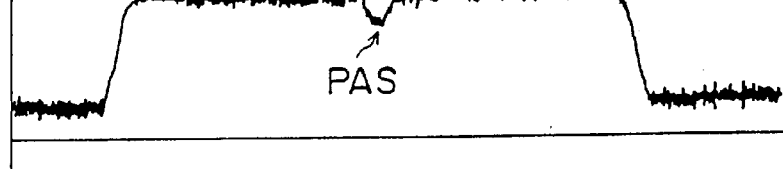

FIGS.25A through 25G are illustrative drawings showing a detection of pattern displacement when a superimposed image PA (FIG.13) has a shorter length than a desired length. As shown in FIG.25A, the superimposed image PA is scanned over the cross-shape pattern 321a in the X direction, and is again scanned with a displacement by the desired pattern length L. Based on the scattered-electron signals thus obtained as shown in FIGS.25B and 25C, a combined signal of FIG.25D is obtained. As shown in FIG.25D, the combined signal has a gap as indicated as PAS because the superimposed image PA has a shorter length than the desired length L. FIGS.25E through 25F show exemplary waveforms of actual scattered-electron signals, and correspond to FIGS.25B through D, respectively.

When the gap PAS is detected in the combined signal as shown in FIG.25D, such a gap indicates a negative displacement in the X direction as shown in FIG.13. Thus, a correction amount can be fed back according to the size of the gap PAS.

Figure 26A:
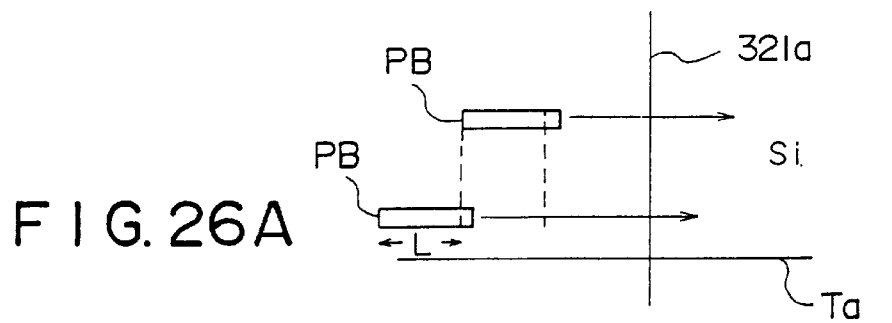
FIGS.26A through 26G are illustrative drawings showing a detection of pattern displacement when a superimposed image has a longer length than a desired length.
Figure 26B:
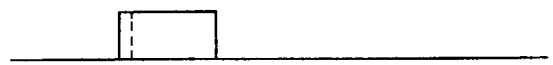
Figure 26C:
Figure 26D:
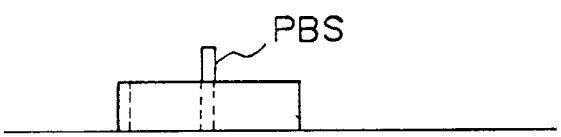
Figure 26E:
Figure 26F:
Figure 26G:
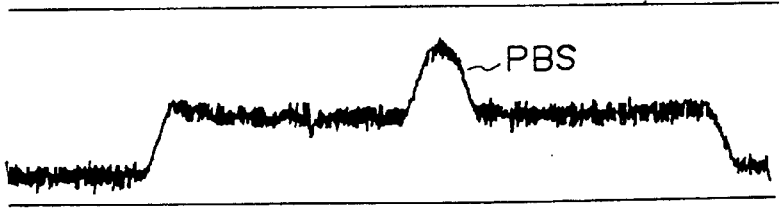

FIGS.26A through 26G are illustrative drawings showing a detection of pattern displacement when a superimposed image PB (FIG.14) has a longer length than a desired length. As shown in FIG.26A, the superimposed image PB is scanned over the cross-shape pattern 321a in the X direction, and is again scanned with a displacement by the desired pattern length L. Based on the scattered-electron signals thus obtained as shown in FIGS.26B and 26C, a combined signal of FIG.26D is obtained. As shown in FIG.26D, the combined signal has a protrusion as indicated as PBS because the superimposed image PB has a longer length than the desired length L. FIGS.26E through 26F show exemplary waveforms of actual scattered-electron signals, and correspond to FIGS.26B through 26D, respectively.

When the protrusion PBS is detected in the combined signal as shown in FIG.26D, such a protrusion indicates a positive displacement in the X direction as shown in FIG.14. Thus, a correction amount can be fed back according to the size of the protrusion PBS.

As described above, when a relative positional displacement exists in the X direction as shown in FIG.13 and FIG.14, such a displacement is detected by twice scanning the superimposed image of the electron beam over the cross-shape pattern in the X direction. When the combined signal obtained by combining the signals of the two scans has a protrusion, the displacement must be in such a direction so as to elongate the pattern length. On the other hand, a gap in the combined image indicates that the displacement must be in such a direction so as to shorten the pattern length. In the same manner, when a relative positional displacement between the two slits exists in the Y direction, such a displacement is detected by twice scanning the superimposed image of the electron beam over the cross-shape pattern in the Y direction. Then, a direction of the displacement can be determined by checking whether the combined scattered-electron signal has a gap or a protrusion. Also, scans successively conducted in the X direction and in the Y direction enable a detection of a displacement of either direction.

In the following, a method of detecting pattern rotation and pattern distortion as shown in FIG.15 through FIG.22 will be described.

FIG.27 is an illustrative drawing for explaining the method of detecting the pattern rotation and the pattern distortion. In the third principle of the present invention, when a detection of the pattern rotation and pattern distortion is required, a check is made whether a scattered-electron signal obtained by scanning a superimposed electron-beam image has a slope $\alpha$, and whether the slope $\alpha$ is a negative slope or a positive slope. In detail, the superimposed beam image as shown in FIG.15 through FIG.22 is scanned in the X direction and in the Y direction over the cross-shape pattern 321a, and the slopes $\alpha$ of the scattered-electron signals for the two scans are examined as a combination to detect the pattern rotation and the pattern distortion.

FIGS.28A through 28D are illustrative drawings showing a method of detecting the pattern rotation and the pattern distortion. In principle, a beam image created by superimposing the upper part of the first slit image 210A and the lower part of the second-slit 220a is scanned over the cross-shape pattern 321a in the X direction, and then a beam image created by superimposing the right part of the first-slit image 210A and the left part of the second-slit 220a is scanned over the cross-shape pattern 321a in the Y direction. Then, a combination of the two scattered-electron signals obtained by these scans are examined to detect a rotation direction and a distortion direction.

FIGS.28A through 28D show a case in which neither rotation nor distortion is present. The beam image obtained by superimposing the upper part and the lower part is scanned in the X direction over a Y-direction bar of the cross-shape pattern 321a. A scattered-electron signal obtained by the scan is shown in FIG.28B. Since no rotation nor distortion is present, the slope $\alpha$ of the signal is zero. In the same manner, as shown in FIG.28C, the beam image obtained by superimposing the right part and the left part is scanned in the Y direction over an X-direction bar of the cross-shape pattern 321a. A scattered-electron signal obtained by this scan is shown in FIG.28D. The slope $\alpha$ of this signal is also zero.

FIGS.29A through 29D are illustrative drawings showing a method of detecting a rotation when the first-slit image 210A is rotated clockwise as shown in FIG.15 and FIG.16. The procedure for the detection is the same as that described with reference to FIGS.28A through 28D. With a clockwise rotation as shown in FIG.15, a beam image PC1 created by superimposing the upper part and the lower part has a distorted quadrilateral shape thinning toward the right-hand side thereof. A scattered-electron-signal waveform obtained by using such a shape has a positive a as shown in FIG.29B. On the other hand, a beam image PC2 created by superimposing the right part and the left part has a distorted quadrilateral shape thinning toward the bottom side thereof. A scattered-electron-signal waveform obtained by using such a shape has a negative a as shown in FIG.29D. When the slopes $\alpha$ of the two scattered-electron signals have opposite signs, rotation must be present. In this case, the scattered-electron signal of FIG.29B, which is obtained by the scan over the Y-direction bar of the cross-shape pattern 321a, has the positive slope $\alpha$. Thus, the rotation must be clockwise.

When a counterclockwise rotation is present as shown in FIG.17 or FIG.18, the slopes $\alpha$ of the two scattered-electron signals have opposite signs, as can be understood from the figures. In this case, however, the scattered-electron signal which is obtained by the scan over the Y-direction bar of the cross-shape pattern 321a has a negative slope $\alpha$.

Figures 30A, 30B, 30C, 30D:
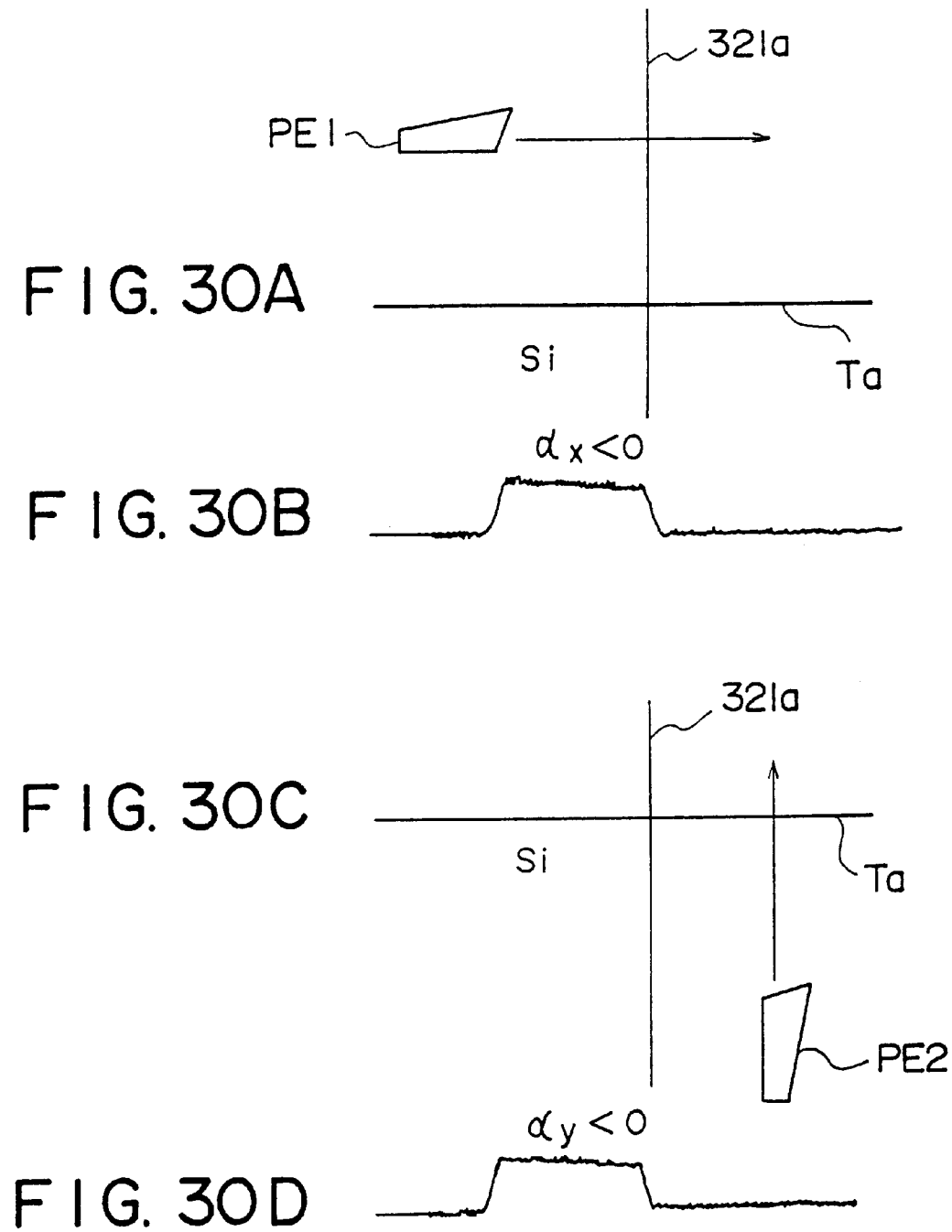
FIGS.30A through 30D are illustrative drawings showing a method of detecting a distortion when the first-slit image is distorted into a rhombus as shown in FIG.19 and FIG.20.

FIGS.30A through 30D are illustrative drawings showing a method of detecting a distortion when the first-slit image 210A is distorted into a rhombus as shown in FIG.19 and FIG.20. The procedure for the detection is the same as that described with reference to FIGS.28A through 28D. With a distortion into a rhombus as shown in FIG.19, a beam image PE1 created by superimposing the upper part and the lower part has a distorted quadrilateral shape thinning toward the left-hand side thereof. A scattered-electron-signal waveform obtained by using such a shape has a negative a as shown in FIG.30B. On the other hand, a beam image PE2 created by superimposing the right part and the left part as shown in FIG.20 has a distorted quadrilateral shape thinning toward the bottom side thereof. A scattered-electron-signal waveform obtained by using such a shape has a negative $\alpha$ as shown in FIG.30D. When the slopes $\alpha$ of the two scattered-electron signals have the same sign, the distortion must be present. In this case, the two scattered-electron signals have the negative slopes $\alpha$. Thus, the distortion must be as shown in FIG.19 and FIG.20 as opposed to those shown in FIG.21 and FIG.22. That is, the first-slit image 210A is distorted into a rhombus slanted to the right.

When a rhombus created by the distortion is slanted to the left as shown in FIG.21 and FIG.22, the slopes $\alpha$ of the scattered-electron signals have the same sign, and this sign is positive as can be understood from the figures. That is, the same sign of the slopes means the presence of a distortion, and the positive sign indicates that the distortion is of a rhombus slanted to the left.

A procedure of the detection method described above is as follows:

(1) scanning a beam image created by superimposing the upper part and the lower part of the two slits in the positive direction of the X axis over the Y-direction metal bar to obtain a first scattered-electron signal;

(2) displacing the beam image by a correct beam length L in the negative direction of the X axis and repeating the same scan to obtain a second scattered-electron signal;

(3) superimposing the first and second scattered-electron signals such that the start positions of the scans coincide with each other to obtain a first combined signal;

(4) scanning a beam image created by superimposing the right part and the left part of the two slits in the positive direction of the Y axis over the X-direction metal bar to obtain a third scattered-electron signal;

(5) displacing the beam image by a correct beam length L in the negative direction of the Y axis and repeating the same scan to obtain a fourth scattered-electron signal;

(6) superimposing the third and fourth scattered-electron signals such that the start positions of the scans coincide with each other to obtain a second combined signal;

(7) checking whether the first combined signal has a gap or a protrusion, wherein a gap means a negative displacement of the first-slit image 210A in the X direction and a protrusion means a positive displacement of the first-slit image 210A in the X direction;

(8) checking whether the second combined signal has a gap or a protrusion, wherein a gap means a negative displacement of the first-slit image 210A in the Y direction and a protrusion means a positive displacement of the first-slit image 210A in the Y direction, (9) checking the slope $\alpha x$ of the first or second scattered-electron signal and the slope $\alpha y$ of the third or fourth scattered-electron signal, wherein opposite signs of the slopes $\alpha x$ and $\alpha y$ mean the presence of rotation, with a positive slope $\alpha x$ indicating a clockwise rotation and a negative slope $\alpha x$ indicating a counterclockwise rotation, and the same sign of the slopes $\alpha x$ and $\alpha y$ means the presence of distortion, with a negative sign indicating the distortion into a rhombus slanted to the right and a positive sign indicating the distortion into a rhombus slanted to the left, where the slopes $\alpha x$ and $\alpha y$ may be detected from equivalent signals obtained separately from the first through fourth scattered-electron signals; and

(10) feeding back correction data generated based on the information of the above-described step (9) to adjust the beam, which correction data is specifically provided to the rotation-correction coil 214, the distortion-correction coil 216, and the deflector 218.

Figure 31:
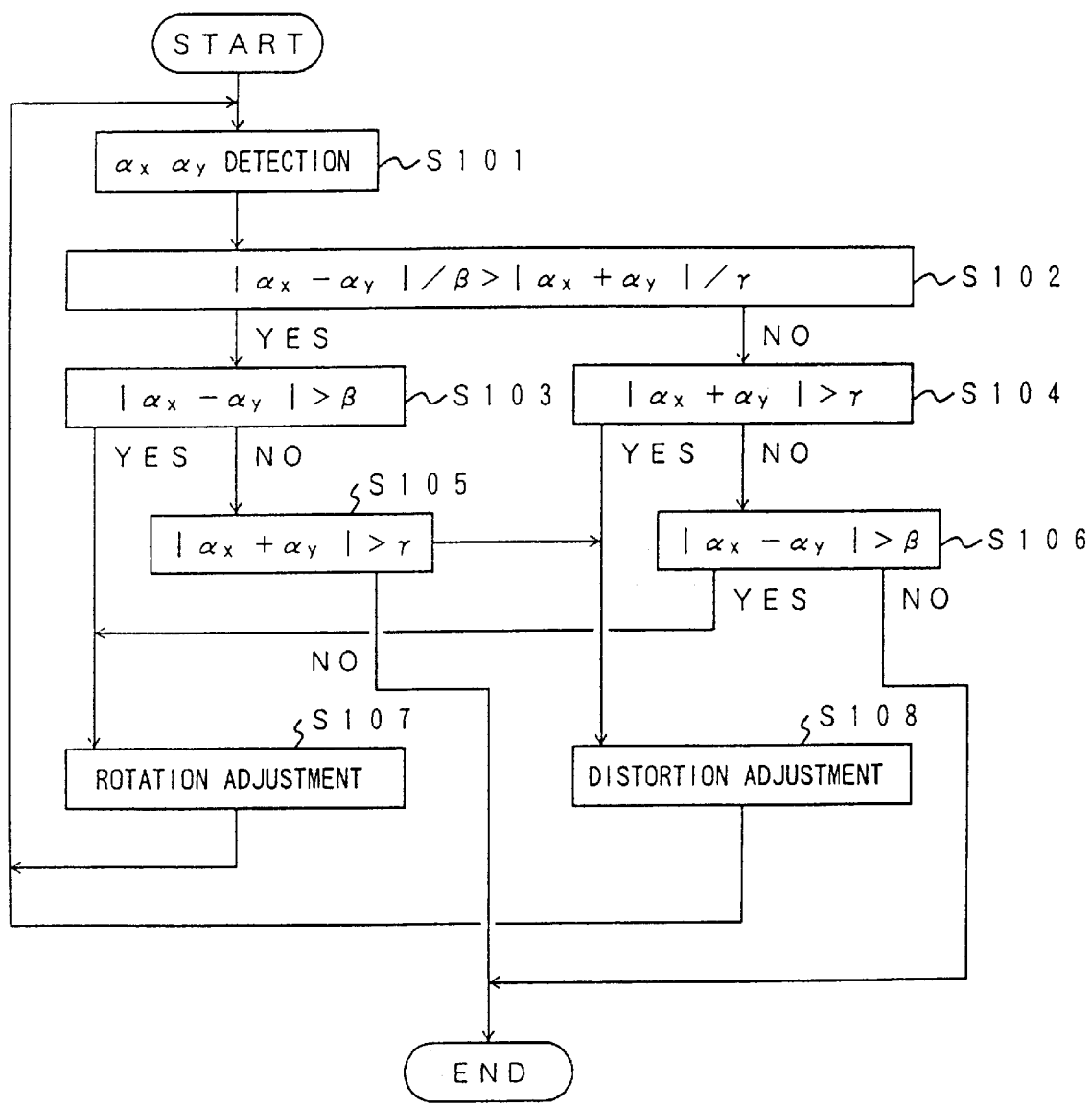
FIG.31 is a flowchart of a process of rotation and distortion adjustments.

FIG.31 is a flowchart of a process of rotation and distortion adjustments.

At a step S101, the slopes $\alpha x$ and $\alpha y$ of the scattered-electron signals are obtained in the same manner as described above.

At a step S102, a value obtained by dividing an absolute value of a difference between the slopes $\alpha x$ and $\alpha y$ by a predetermined tolerance level $\beta$ for rotation is compared with a value obtained by dividing an absolute value of a sum of the slopes $\alpha x$ and $\alpha y$ by a predetermined tolerance level $\tau$. This comparison is made in order to give priority to one which has the largest ratio against the tolerance level. This priority may not have to be given. If the inequality of the step S102 is true, an effect of the rotation is the largest, so that the procedure goes to a step S103 to carry out a rotation correction first. If the inequality of the step S102 is false, an effect of the distortion is the largest, so that the procedure goes to a step S104 to carry out a distortion correction first. In either case, the adjustment will be repeated until the relevant value becomes smaller than the tolerance level.

At the step S103, a check is made whether the absolute value of the difference between the slopes $\alpha x$ and $\alpha y$ is larger than the tolerance level $\beta$. If it is, the procedure goes to a step S107 to carry out the rotation correction. In detail, a current having correction amount is supplied to the rotation-correction coil 214 of FIG.11. If the absolute value is not larger than the tolerance level $\beta$, the rotation is within the tolerance level, so that the procedure goes to a step S105 to check a distortion level.

At the step S105, a check is made whether the absolute value of the sum of the slopes $\alpha x$ and $\alpha y$ is larger than the tolerance level $\tau$. If it is, the procedure goes to a step S108 to carry out the distortion correction. In detail, a current having a correction amount is fed to the distortion-correction coil 216 of FIG.11. If the absolute value is not larger than the tolerance level $\tau$, the procedure ends.

At the step S104 when the distortion correction is given priority at the step S102, a check is made whether the absolute value of the sum of the slopes $\alpha x$ and $\alpha y$ is larger than the tolerance level $\tau$. If it is, the procedure goes to a step S108 to carry out the distortion correction. If the absolute value is not larger than the tolerance level $\tau$, the distortion is within the tolerance level, so that the procedure goes to a step S106 to check a rotation level.

At the step S106, a check is made whether the absolute value of the difference between the slopes $\alpha x$ and $\alpha y$ is larger than the tolerance level $\beta$. If it is, the procedure goes to the step S107 to carry out the rotation correction. Otherwise, the procedure ends.

As previously described, opposite signs of the slopes $\alpha x$ and $\alpha y$ means the presence of rotation. The process of the flowchart of FIG.31 is based on an assumption that the absolute values of the difference between the slopes $\alpha x$ and $\alpha y$ reflects the degree of the rotation. Likewise, this process is based on an assumption that the absolute value of the sum of the slopes $\alpha x$ and $\alpha y$ reflects the degree of the distortion.

Accordingly, the directions of the rotation and the distortion are detected at the steps S107 and S108, respectively, based on the signs of the slopes $\alpha x$ and $\alpha y$. Then, based on the degrees of the rotation and the distortion, the correction amounts are obtained.

Figure 32:
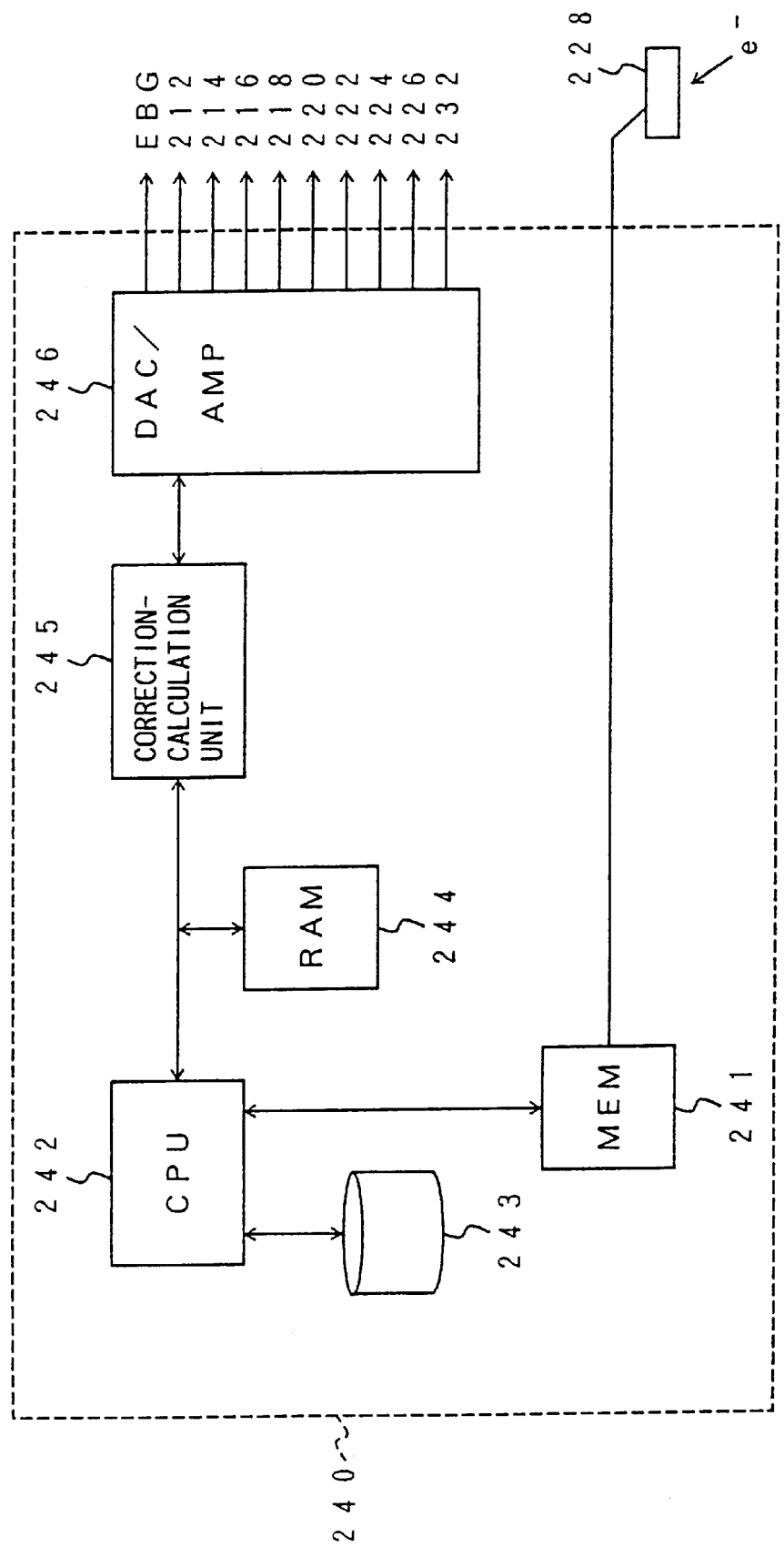
FIG.32 is a block diagram of a configuration of a control unit of the electron-beam exposure device shown in FIG.11.

FIG.32 is a block diagram of a configuration of the control unit 240 of the electron-beam exposure device shown in FIG.11. A CPU 242 and a memory media 243 such as a hard drive are provided by a workstation, for example. The memory media 243 store programs for converting the exposure data into data of driving signals, which are fed to the electron-beam exposure device. The exposure data externally provided is stored in the memory media 243, and, then, the CPU 242 calculates pattern data for the exposure process by using these programs. The generated pattern data is temporarily stored in a RAM 244.

Scattered-electron signals detected by the scattered-electron detecting unit 228 are temporarily stored in a memory 241. Rotation and distortion are detected based on the above-described algorithm by using these scattered-electron signals, and the correction amount are calculated and supplied to the correction-calculation unit 245. Finally, a DAC/AMP unit 246, which is a digital-to-analog converter and an amplifier, outputs digital signals obtained by combining the data for the exposure process, the correction amount, and the like. A program of the algorithm for detecting the rotation and the distortion is stored in the memory media 243.

As described above, according to the third principle of the present invention, the superimposed beam is scanned over the metal pattern on the stage 232, and the obtained scattered-electron signals are used for detecting the directions and degrees of the rotation as well as the distortion. Then, the beam adjustment is carried out by feeding back the detected correction amount. Thus, the beam adjustment can be carried out without conducting an actual exposure process and a developing process. The above description of the third principle has been provided with reference to the use of the electron beam. It is apparent, however, that the third principle of the present invention can be applied to the use of any type of a charged-particle beam.

As described above, the beam adjustment according to the third principle of the present invention does not need an actual exposure, development, an inspection by a microscope, or the like, thereby requiring a work time significantly reduced compared to the beam adjustment of the prior art. When a total exposure process including the beam adjustment and the actual beam exposure is considered, the time length required in total is significantly reduced. Therefore, throughput of the total exposure process can be considerably boosted.

Moreover, the present invention concerns another problem, and a description thereof will be provided below.

An increase in the density of the semiconductor integrated circuit leads to an increased recognition of significance of a charged-particle-beam method utilizing an electron beam, an ion beam, or the like. An electron beam can be made so fine as to create a micro-pattern having a size smaller than 1 μm. In an electron-beam exposure process, however, a pattern has to be drawn with one stroke of an electron beam, and a smaller pattern requires a smaller beam. Thus, an electron-beam exposure process requires a large amount of time to finish exposure of one wafer.

As previously described, the block-exposure method is available to counter this problem. The block-exposure method uses a mask having a plurality of block patterns arranged in a matrix configuration, and each of the block patterns corresponds to a particular exposure pattern. An electron beam emitted from an electron gun is passed through a rectangular slit to shape a cross section of the electron beam into a rectangular shape. Then, the rectangular beam is passed through a selected block pattern on the mask to expose the selected pattern onto a resist on a wafer.

A block pattern on the mask is selected when the rectangular beam is deflected to that block pattern by a mask deflector provided in an exposure column. Since the mask has a large size, the mask position has to be shifted by a mask stage when a block pattern outside the deflector's deflection range is to be selected. That is, a selected block pattern is shifted into the deflection range by the mask stage, and, then, the deflector deflects the rectangular beam to the selected pattern.

A unit of the shift by the mask stage is a mask area. Once a center of the mask area is brought to the optical axis of the exposure column, any mask pattern within the mask area can be selected by the mask deflector.

In this manner, the mask stage provided in the exposure column should be shifted, and the rectangular beam should be deflected to a selected block pattern on the mask. Unfortunately, coordinates of the mask stage may be displaced relative to the coordinate system of the exposure device, and/or coordinates of the mask may be displaced when it is mounted to the exposure device.

Generally, at least one rectangular pattern for the variable-rectangle exposure method is provided in each mask area on the mask. A slit for shaping the electron beam emitted from the electron gun into a rectangular shape is superimposed on the rectangular pattern on the mask, thereby providing a rectangular beam having a desired shape and size.

Typically, displacement of the coordinates is corrected by trial and error by detecting the rectangular beam with a beam-amount-detection device such as a Faraday cup provided on the wafer stage and by monitoring the reading of the beam-amount-detection device. That is, the mask is shifted by the mask stage to position the center of a mask area at the optical axis of the exposure column, and the rectangular beam is passed through the rectangular pattern of this mask area to detect the resulting superimposed pattern with the Faraday cup. Then, displacement of an X–Y position of the mask, an angle φ of the mask, and a deviation of the coordinate system of the mask stage from orthogonality with respect to the X–Y directions are corrected.

However, such a method takes time and is not sufficiently accurate, leading to a decrease in throughput of the exposure process and to inaccurate superimposition of the exposure.

Accordingly, there is a need for a charged-particle-beam exposure method and a charged-particle-beam exposure device which can easily detect the displacement of the mask.

Also, there is a need for a charged-particle-beam exposure method and a charged-particle-beam exposure device which can easily detect the deviation of the coordinate system of the mask stage from orthogonality.

Further, there is a need for a charged-particle-beam exposure method and a charged-particle-beam exposure device which can easily detect the rotation angle φ of the mask in addition to the displacement of the mask in the X–Y directions.

A fourth principle of the present invention addresses the needs described above.

In the following, embodiments of the fourth principle will be described with reference to the accompanying drawings. However, the scope of the present invention is not intended to be limited to these embodiments.

Figure 33:
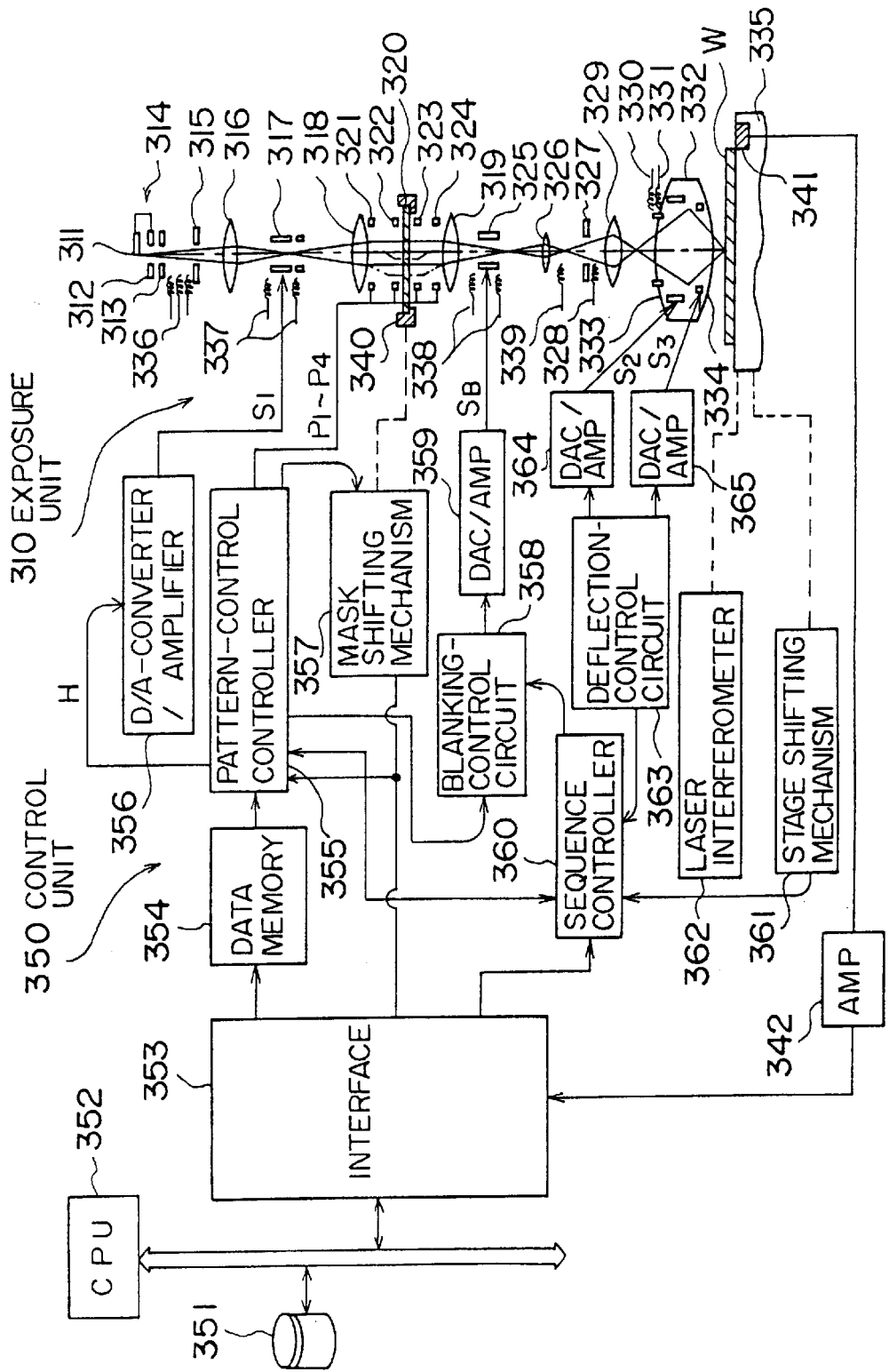
FIG.33 is an illustrative drawing showing an entire configuration of an exposure device which employs an electron beam as a charged-particle beam.

FIG.33 is an illustrative drawing showing an entire configuration of an exposure device which employs an electron beam as a charged-particle beam. In the following, a description of the fourth principle will be given by taking an electron beam as an example. It is apparent, however, that the present invention is not limited to the use of an electron beam, but can be applied to exposure methods and devices utilizing various charged-particle beams.

The exposure device of FIG.33 includes an exposure unit 310 and a control unit 350. Various lenses and deflectors provided in the exposure unit 310 are controlled by the control unit 350. In the control unit 350, pattern data stored in a storage unit 351 such as a hard drive is provided through an interface 353 to convert the pattern data into various driving signals required for exposure. The lenses and deflectors in the exposure unit 310 are driven by these driving signals.

A description of the exposure unit 310 will be provided first. An electron gun 314 serving as an electron-beam generator includes a cathode electrode 311, a grid electrode 312, and an anode electrode 313. An electron beam is directed to a first slit 315 via an alignment coil 336 and a lens (not shown). The first slit 315 has a rectangular aperture to shape a cross section of the electron beam into a rectangular shape. A resulting rectangular beam is passed through a slit deflector 317 after a lens 316. The slit deflector 317 is controlled by a deflection signal S1. A alignment coil 337 is provided for an alignment purpose.

In order to shape the electron beam into a desired pattern, a mask 320 which has a plurality of apertures including a rectangular aperture and various block-pattern apertures is provided. Electromagnetic lenses 318 and 319 and deflectors 321 through 324 are provided above or below the mask 320 to deflect the electron beam to a selected block pattern. The mask 320 is mounted on a stage 340 movable in horizontal directions.

A mask shifting mechanism 357 is used for shifting the stage 340 such that a center of a selected mask area of the mask 320 is positioned at an optical center of an exposure column. Then, the deflectors 321 through 324 deflect the rectangular beam such that the rectangular beam passes through a selected block pattern. The slit deflector 317 is used for a fine shift of the rectangular beam when a variable-rectangle beam is formed or when only part of the block pattern is used.

The electron beam thus shaped is passed through a blanking electrode 325 to which a blanking signal SB is applied, so that on/off states of the electron beam onto a wafer W are controlled by the blanking electrode 325. An alignment coil 338 is also provided besides the blanking electrode 325.

The electron beam passes through a lens 326 and a round aperture 327 when an on state is selected by the blanking electrode 325. The round aperture 327 is a kind of diaphragm whose aperture size is controllable, and controls a convergency angle of the electron beam. Finally, a shape of the electron beam is adjusted by a refocus coil 328 and an electromagnetic lens 329. A focus coil 330 focuses the electron beam on a surface of an exposure target, and a stigmator coil 331 is used for astigmatism correction.

Finally, a size of the electron beam is reduced to an exposure size by a projection lens 332. A main deflector 333 and a sub-deflector 334, respectively controlled by exposure-position determination signals S2 and S3, deflect the electron beam to a desired position on a surface of the wafer. The main deflector 333 is an electromagnetic deflector, and the sub-deflector 334 is an electrostatic deflector.

In the following, the control unit 350 will be described. As previously described, the data of the exposure pattern is stored in the storage unit 351. A CPU 352 reads out the data from the storage unit 351 to obtain data for drawing patterns. The data for drawing patterns is supplied to a data memory 354 and a sequence controller 360 via the interface 353. The data for drawing patterns includes position data and mask data, the position data indicating positions on the wafer W to which the electron beam is to be directed, and the mask data indicating which block patterns on the mask 320 are to be selected.

A pattern-control controller 355 provides the deflectors 321 through 324 with position signals P1 through P4 which indicate a block mask on the mask 320 according to the mask data. Also, the pattern-control controller 355 calculates a correction value H according to a difference between a desired pattern shape and a selected aperture shape, and feeds it to a D/A-converter/amplifier 356. The D/A-converter/amplifier 356 supplies a correction deflection signal S1 to the slit deflector 317. Further, the pattern-control controller 355 controls the mask shifting mechanism 357 according to a position of the selected aperture to shift the stage 340 carrying the mask 320 in a horizontal direction.

A blanking-control circuit 358 supplies a blanking signal SB to the blanking electrode 325 via an amplifier 359 according to a control signal from the pattern-control controller 355. This blanking signal SB controls the on/off states of the electron beam.

The sequence controller 360 receives the position data from the interface 353 to control a pattern drawing sequence. A stage shifting mechanism 361 shifts a stage 335 in a horizontal direction based on a control signal provided from the sequence controller 360. A shift amount of the stage 335 is detected by a laser interferometer 362, and is fed to a deflection-control circuit 363. The deflection-control circuit 363 supplies the deflection signals S2 and S3 to the main deflector 333 and the sub-deflector 334, respectively, according to the shift amount as well as the exposure position data provided from the sequence controller 360. Generally, the main deflector 333 deflects the electron beam within a deflection field of a 2-to-10-mm square, and the sub-deflector 334 deflects the electron beam within a sub-field of a 100-$\mu$m square, for example.

The stage 335 includes a Faraday cup 341 which serves as a beam-amount detection device for generating an electric signal responsive to a current amount of the electron beam. An output signal of the Faraday cup 341 is amplified by an amplifier 342 before being supplied to the interface 353.

Figure 34:
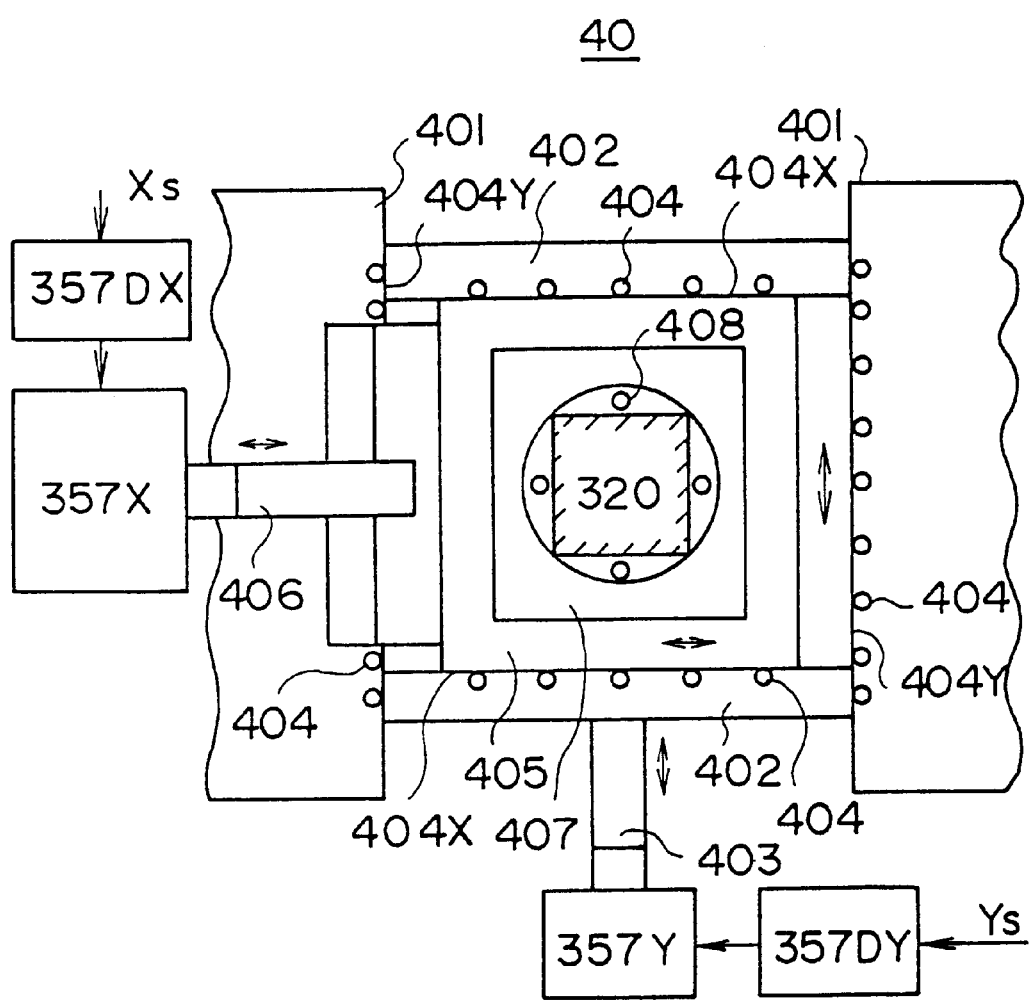
FIG.34 is an illustrative drawing showing a configuration of a stage of FIG.33.

FIG.34 is an illustrative drawing showing a configuration of the stage 340. In FIG.34, an X-direction driver 357DX, an X-direction linear actuator 357X, a Y-direction driver 357DY, and a Y-direction linear actuator 357Y of the mask shifting mechanism 357 are also shown. The X-direction driver 357DX provides a pulse signal to the X-direction linear actuator 357X according to stage-position data Xs provided from the pattern-control controller 355, and the Y-direction driver 357DY provides a pulse signal to the Y-direction linear actuator 357Y according to stage-position data Ys provided from the pattern-control controller 355. The X-direction linear actuator 357X and the Y-direction linear actuator 357Y are actuators which convert an electric signal into a driving force by using a piezo device or the like.

Fixed members 401 are fixed to the exposure column, for example, and Y stages 402 are mounted to the fixed members 401 on Y-direction sliding surfaces 404Y. The Y stages 402 are shifted by the Y-direction linear actuator 357Y via an arm 403 in a direction shown by an arrow. An X stage 405 is mounted to the Y stages 402 via X-direction sliding surfaces 404X. The X stage 405 is shifted by the X-direction linear actuator 357X via an arm 406 in a direction shown by an arrow. Bearings 404 are provided to effect smooth shifts.

A mask holder 407 holding the mask 320 is mounted on the X stage 405. Pins 408 are provided to hold the mask 320.

As shown in FIG.34, the stage 340, when mounted in the exposure column, may not have an X-direction shift and a Y-direction shift which are completely orthogonal with each other. In this case, a deviation from the orthogonality should be detected for the correction of the mask-stage movement. This deviation from the orthogonality rarely changes even when the mask 320 is exchanged. Thus, once detected, there is no need to measure the deviation again.

When the mask 320 is exchanged, the mask 320 may be displaced in the X direction or/and the Y direction, and, also, may be misplaced at an angle (as a result of a horizontal rotation).

Figure 35:
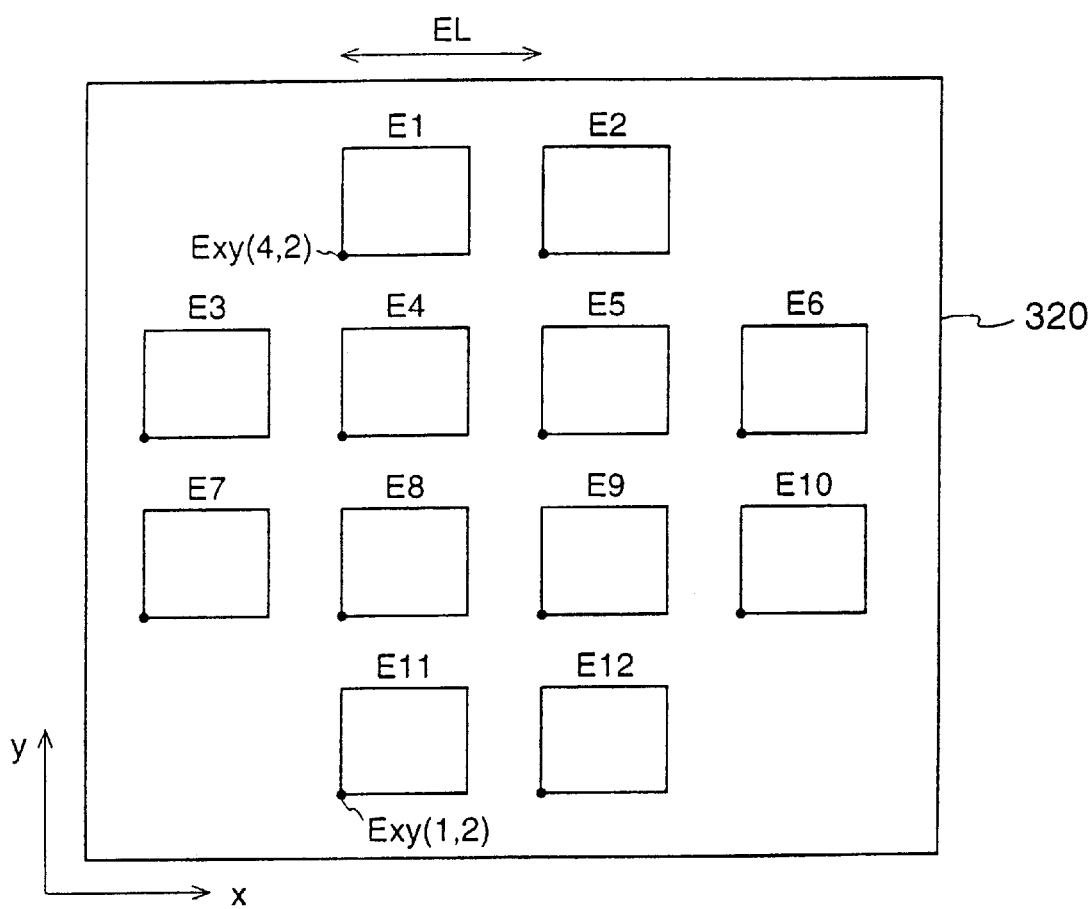
FIG.35 is a plan view of a mask of FIG.33.

FIG.35 is a plan view of the mask 320. On the mask 320, a plurality of areas E1 through E12 are provided at predetermined intervals EL in a matrix configuration. A size of one area corresponds to a size of the deflection range within which the electron beam can be deflected on the mask 320. For example, one area is a 1-to-5-mm square, which is within a deflection range of the deflectors 321 through 324. A reference point Exy is provided for each of the areas E1 through E12. An area coordinate Exy(1,2), for example, indicates the area E11. Likewise, an area coordinate Exy(4, 2) indicates the area E1.

Figure 36:
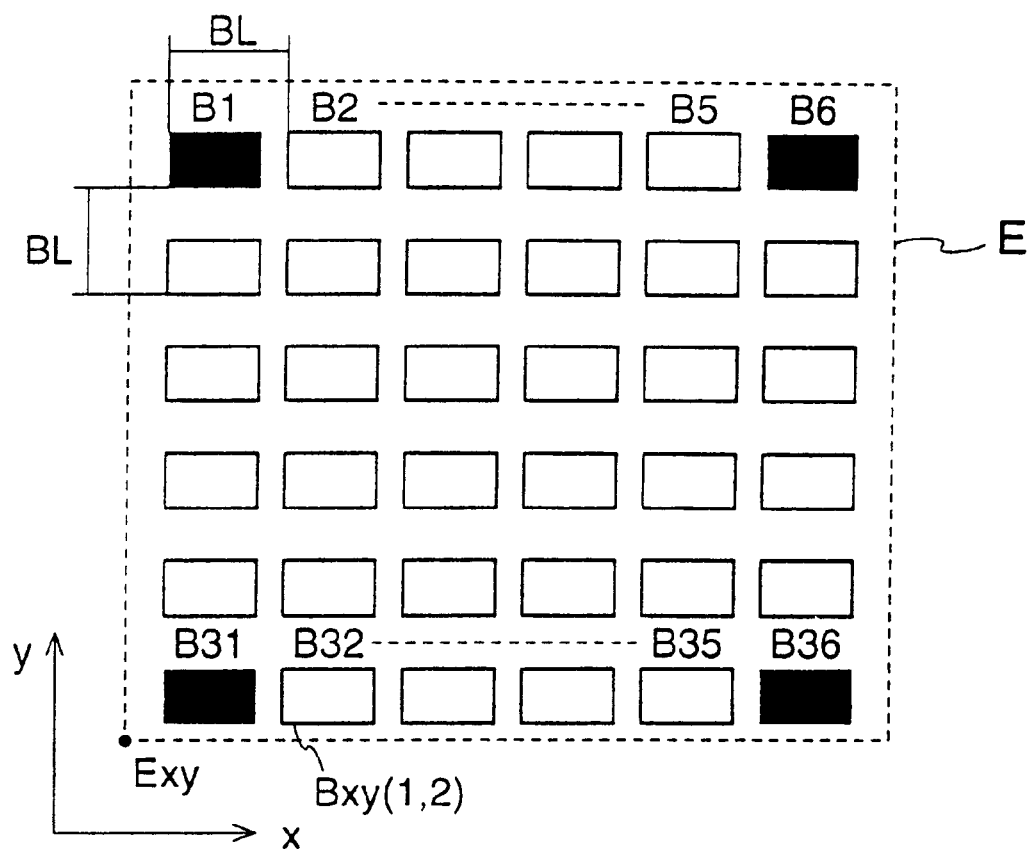
FIG.36 is a plan view of an area E of FIG.35.

FIG.36 is a plan view of an area E (one of the areas E1 through E12). In the area E, a plurality of block masks B1 through B36 are provided at predetermined intervals BL in a matrix arrangement. A size of a block mask corresponds to the cross-sectional size of the rectangular beam on the mask 320, and is a 100-to-500-$\mu$m rectangle. A reference point in each of the block masks B1 through B36 is provided with a X–Y coordinate. As shown in FIG.36, a block coordinate Bxy(1,2) indicates the reference point of the block mask B32. In FIG.36, the blocks B1, B6, B31, and B36 at the four corners of the area E are hatched to show that these blocks are apertures for the variable-rectangle method.

The stage 340 is shifted according to an area coordinate Exy. Then, the rectangular beam is deflected by the deflectors 321 through 324 according to a block coordinate Bxy, so as to be directed to a selected block mask in the area E. Thus, the shift of the stage (mask stage) 340 should be carried out by taking into consideration the displacements of the mask 320 in the X direction and the Y direction as well as the angular displacement generated when the mask 320 is mounted on the stage 340.

Figure 37:
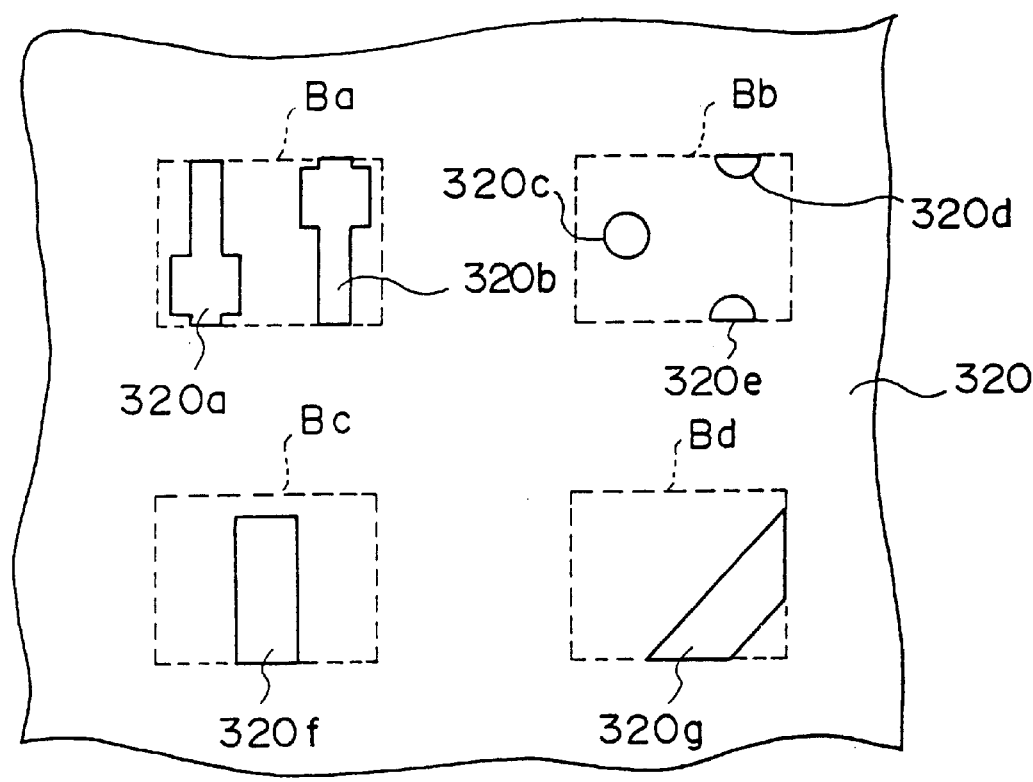
FIG.37 is an enlarged plan view of a block mask provided in the area E.

FIG.37 is an enlarged plan view of a block mask provided in the area E. In the figure, four block masks Ba, Bb, Bc, and Bd are shown. The block masks are provided with apertures 320a through 320g. Repeated exposures of a pattern of the block mask Ba with appropriate shifts, for example, results in the creation of a wiring pattern.

As described above, the mask stage is mounted to the exposure column of the exposure device, and the mask 320 is mounted on the mask stage. Accordingly, when the mask stage is initially mounted, the deviation of the mask stage from orthogonality as well as the displacements in the X–Y directions and the angle φ of the mask 320 should be detected. Also, when the mask 320 is replaced, the displacements in the X–Y directions and the angle φ of the mask 320 should be detected.

Figure 38:
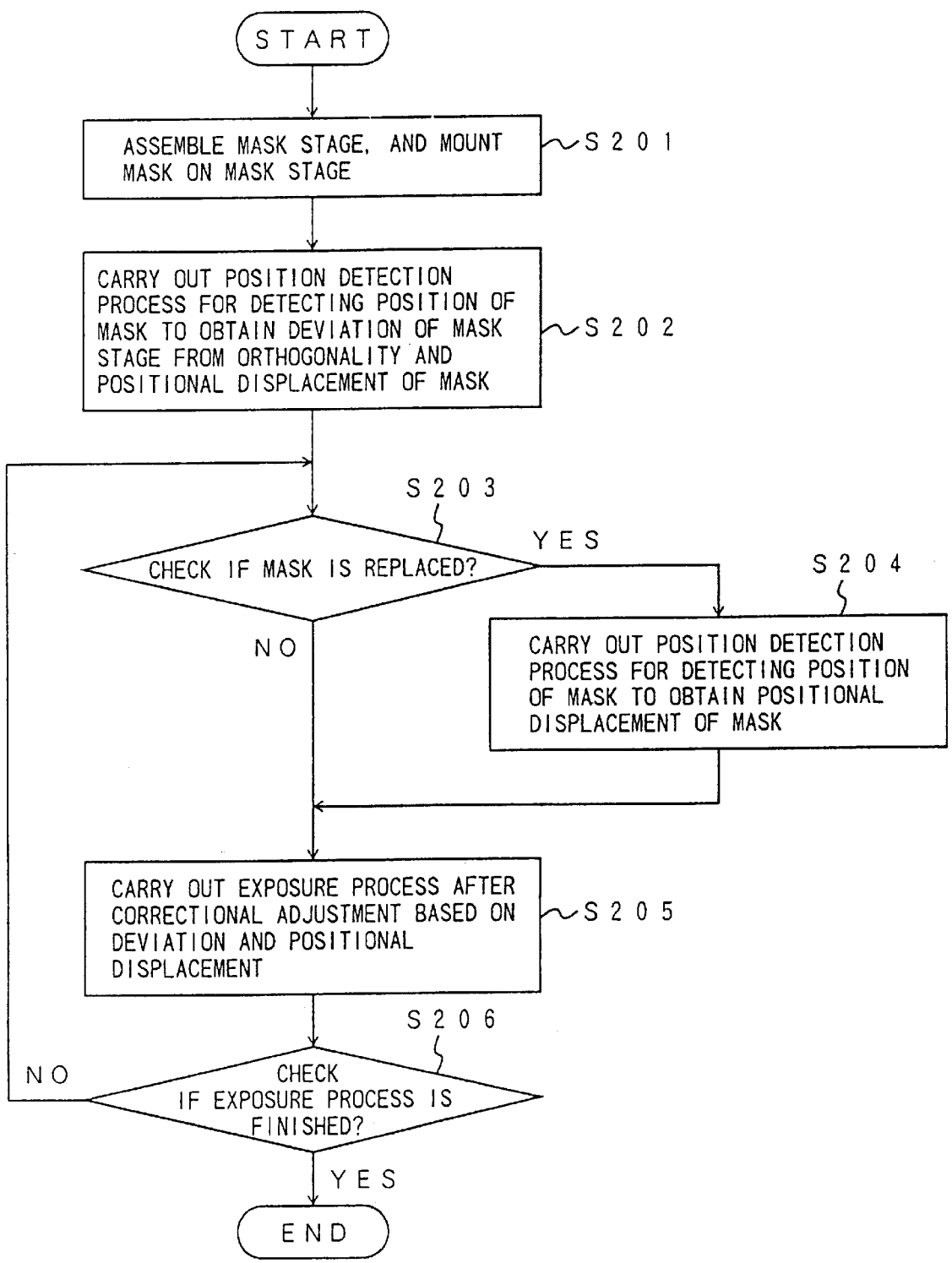
FIG.38 is a flowchart showing a relationship between the charged-particle-beam exposure process and a displacement detection process.

FIG.38 is a flowchart showing a relationship between the charged-particle-beam exposure process and a displacement detection process.

At a step S201, the mask stage is assembled, and the mask is mounted on the mask stage.

At a step S202, a position detection process for detecting a position of the mask is carried out to obtain a deviation of the mask stage from orthogonality and a positional displacement of the mask.

At a step S203, a check is made whether the mask is replaced. If the answer is affirmative, the procedure goes to a step S204. Otherwise, the procedure goes to a step S205. Initially, the procedure goes to the step S205.

At the step S205, an exposure process is carried out after correction values obtained based on the deviation and the positional displacement are supplied to the mask shifting mechanism 357, etc., to carry out an initial adjustment.

At a step S206, a check is made whether the exposure process is finished. If it is, the procedure ends. Otherwise, the procedure goes back to the step S203.

When other block masks not present on the mask 320 become necessary, the mask is replaced. Then, the check at the step S203 gives an affirmative answer.

At the step S204, the position detection process for detecting a position of the mask is carried out to obtain a positional displacement of the mask. Then, correction values obtained from this positional displacement are used in a subsequent exposure process for shifting the mask stage and deflecting the electron beam.

Figure 39:
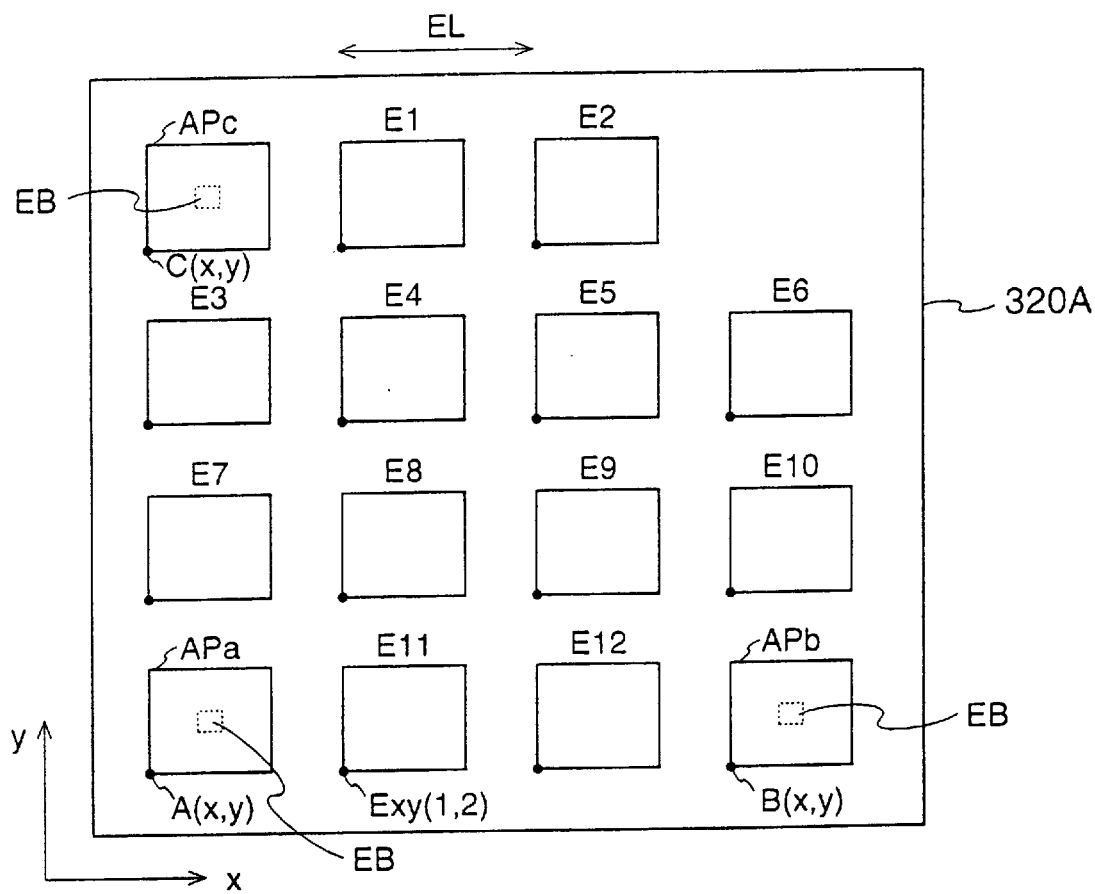
FIG.39 is a plan view of a mask improved for the purpose of detecting a mask position according to a fourth principle of the present invention.

FIG.39 is a plan view of a mask improved for the purpose of detecting the mask position according to the fourth principle of the present invention. A mask 320A of FIG.39 differs from the mask 320 of FIG.35 only in that apertures APa, APb, and APc for position detection are provided at corners of the mask. A size of these apertures APa, APb, and APc is equivalent to the size of the areas E1 through E12, i.e., about 1-to-5-mm square. Strictly speaking, the size of these apertures APa, APb, and APc should be such that the rectangular beam EB can be invariably passed through these apertures despite a positional variation of the mask stage 340. Thus, it is important that, when the mask 320A is mounted on the mask stage 340, the mask stage 340 can be shifted to position one of the apertures APa, APb, and APc at a beam position of the rectangular beam EB without failure.

Detection of the mask position is carried out by using the mask 320A containing the large apertures APa, APb, and APc. A method of detection will be described below.

Figure 40:
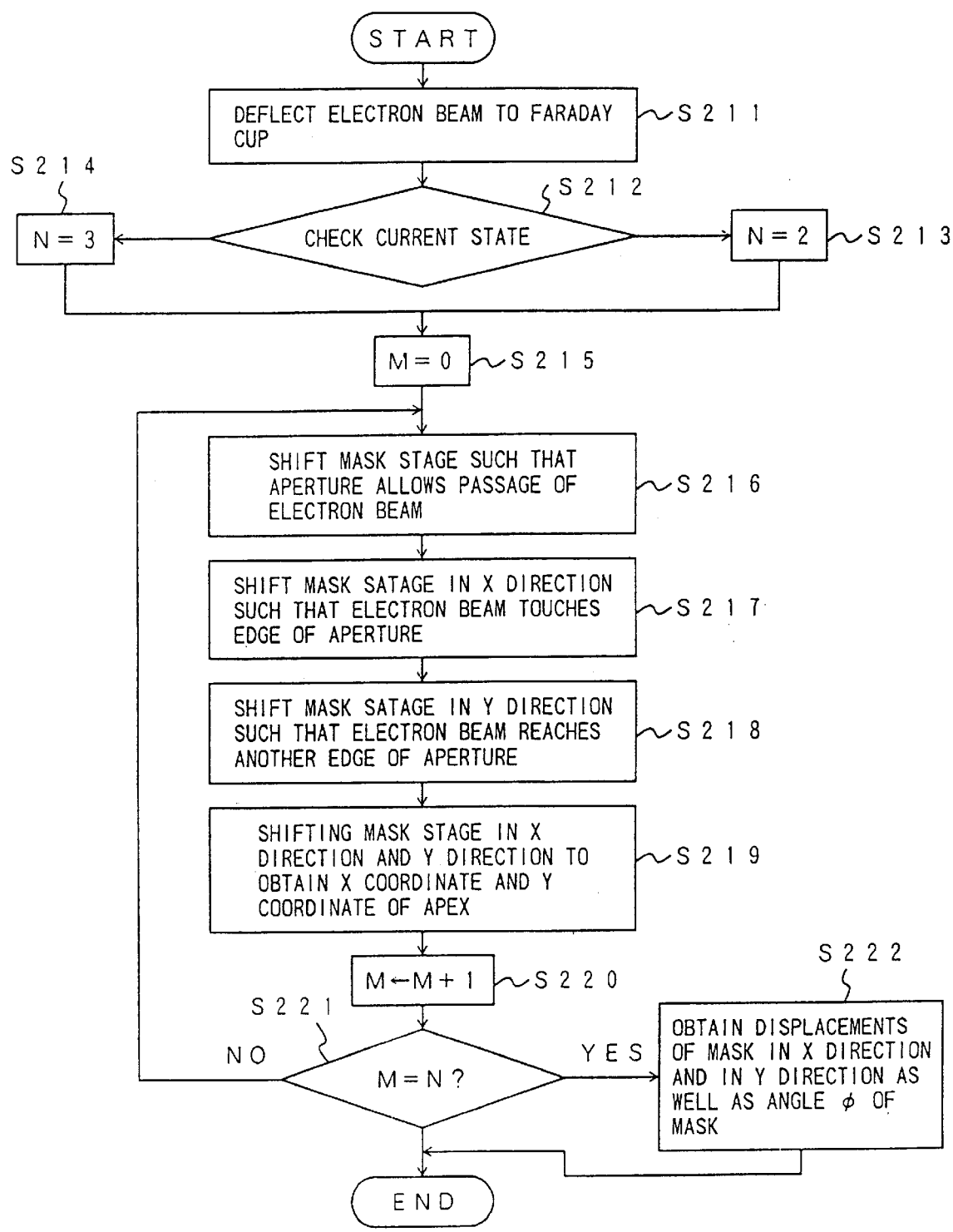
FIG.40 is a flowchart of a process of detecting a mask position.

FIG.40 is a flowchart of a process of detecting the mask position.

At a step S211, the electron beam is deflected by the main deflector 333 and the sub-deflector 334 such that the electron beam is directed to the Faraday cup 341. In this case, the Faraday cup 341 may be positioned at a predetermined location. Alternately, the Faraday cup 341 may be shifted to the position of the optical axis of the exposure column by shifting the stage 335 carrying the wafer W through the stage shifting mechanism 361.

At a step S212, a check is made whether the current state is the initial state or right after the replacement of the mask. If it is the initial state immediately after the mounting of the mask stage 340, the procedure goes to a step S214, where a variable N is set to 3. If the current state is immediately after the replacement, the procedure goes to a step S213, where the variable N is set to 2.

At a step S215, a variable M is set to 0.

At a step S216, the mask stage 340 is shifted such that an aperture AP (one of the apertures APa, APb, and APc) allows the passage of the electron beam EB. Preferably, the aperture AP is positioned on the optical axis of the exposure column. Alternately, the deflectors 321 through 324 are used for passing the electron beam EB through the aperture AP.

Figure 41:
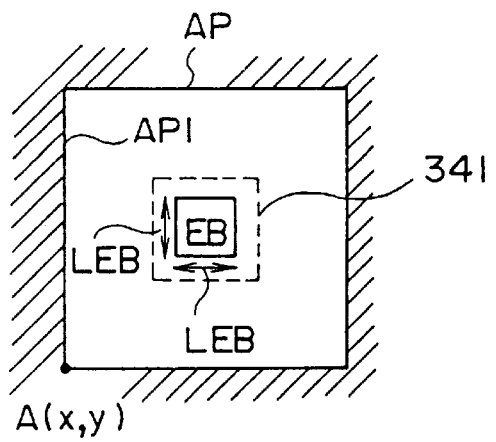
FIG.41 is an illustrative drawing showing a relation between an electron beam and an aperture at a first stage of the mask-position detection process.

FIG.41 is an illustrative drawing showing a relation between the electron beam EB and the aperture AP at this stage. As shown in FIG.41, the electron beam (rectangular beam) EB passes through the aperture AP. The electron beam EB is also in a position to be detected by the Faraday cup 341 on the stage (wafer stage) 335.

The detection of the mask position according to the fourth principle of the present invention is based on a position detection of an apex A(x,y), which is one of the apexes of the aperture AP. Once the position of the apex A(x,y) is found in the coordinate system of the exposure device, displacements of the mask in the X direction and in the Y direction can be obtained. Also, when a position of the apex B(x,y) of the aperture APb is detected in addition to the position of the apex A(x,y), the angle (rotation) φ of the mask can be obtained. Further, when a position of the apex C(x,y) of the aperture APc is detected in addition to the positions of the apexes A(x,y) and B(x,y), the deviation of the mask stage from orthogonality can be obtained. The apertures APa, APb, and APc should be located at three positions which are not in line, and, preferably, are located as far as possible from each other.

Figure 42:
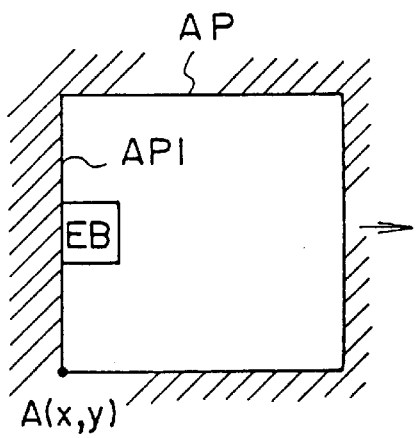
FIG.42 is an illustrative drawing showing a relation between the electron beam and the aperture AP at a second stage.
Figure 43:
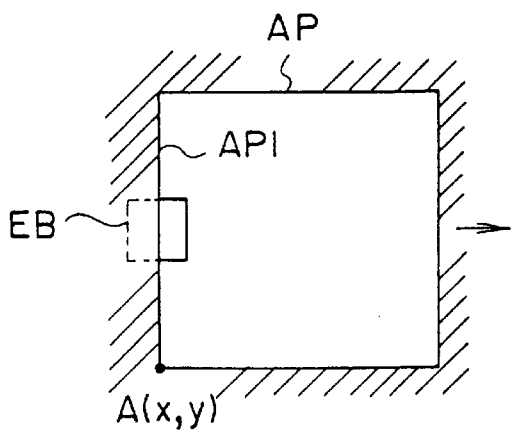
FIG.43 is an illustrative drawing showing a relation between the electron beam and the aperture when a beam detection signal is half of its maximum magnitude.

FIG.42 is an illustrative drawing showing a relation between the electron beam EB and the aperture AP at a second stage. As shown in FIG.42, the mask stage is shifted in a direction shown by an arrow (to increase an X coordinate thereof), and the beam detection signal from the Faraday cup 341 is monitored. When the electron beam EB reaches an edge AP1 of the aperture AP, the beam detection signal starts to decrease. The mask stage is further shifted until the beam detection signal becomes half of its maximum magnitude, and the position of the mask stage is detected. FIG.43 is an illustrative drawing showing a relation between the electron beam EB and the aperture AP when the beam detection signal is half of its maximum magnitude.

Figure 44:
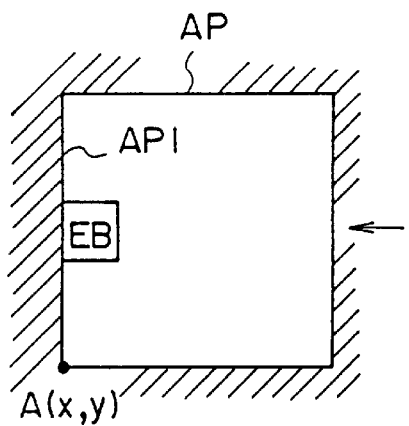
FIG.44 is an illustrative drawing showing a relation between the electron beam and the aperture when the electron beam touches an edge of the aperture.

Then, the mask stage is shifted back, so that the electron beam EB touches the edge AP1 of the aperture AP. FIG.44 is an illustrative drawing showing a relation between the electron beam EB and the aperture AP when the electron beam EB touches the edge AP1 of the aperture AP. The process described above is carried out at a step S217.

Namely, at the step S217, the mask stage is shifted in the X direction such that the electron beam EB touches the edge AP1 of the aperture AP.

Figure 45:
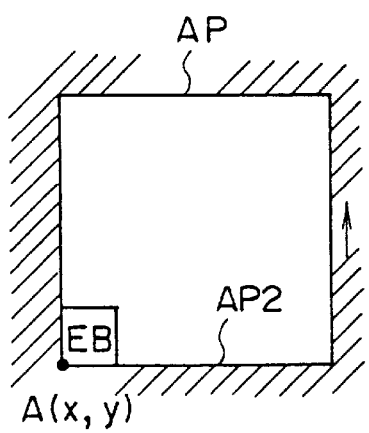
FIG.45 is an illustrative drawing showing a relation between the electron beam and the aperture when the electron beam reaches another edge.

Then, the mask stage is shifted in a Y direction to increase a Y coordinate thereof, and the beam detection signal is monitored to detect when the electron beam EB reaches another edge AP2 adjacent to the edge AP1. FIG.45 is an illustrative drawing showing a relation between the electron beam EB and the aperture AP when the electron beam EB reaches the edge AP2. This process is carried out at a step S218.

Namely, at the step S218, the mask stage is shifted in the Y direction such that electron beam EB reaches the edge AP2 of the aperture AP.

Figure 46:
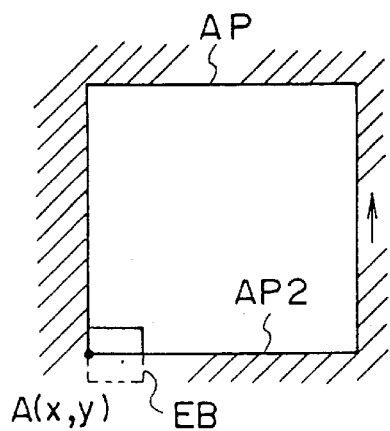
FIG.46 is an illustrative drawing showing a relation between the electron beam and the aperture when the beam detection signal is half of its maximum magnitude.

Then, the mask stage is further shifted until the beam detection signal becomes half of its maximum magnitude. FIG.46 is an illustrative drawing showing a relation between the electron beam EB and the aperture AP when the beam detection signal is half of its maximum magnitude.

Figure 47:
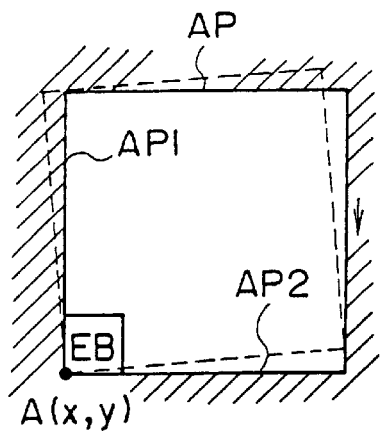
FIG.47 is an illustrative drawing showing a relation between the electron beam and the aperture when the electron beam touches an edge of the aperture.

Then, the mask stage is shifted back, so that the electron beam EB touches the edge AP2 of the aperture AP. In this manner, a Y coordinate of the apex A(x,y) is obtained. FIG.47 is an illustrative drawing showing a relation between the electron beam EB and the aperture AP when the electron beam EB touches the edge AP2 of the aperture AP.

Figure 48:
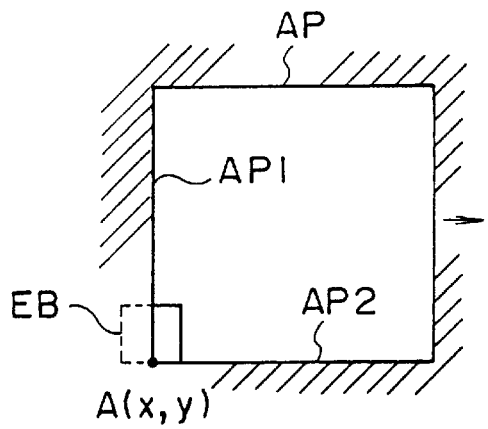
FIG.48 is an illustrative drawing showing a relation between the electron beam and the aperture when the beam detection signal is half of its maximum magnitude.

Then, the mask stage is shifted in the X direction to increase the X coordinate thereof until the beam detection signal becomes half of its maximum magnitude. FIG.48 is an illustrative drawing showing a relation between the electron beam EB and the aperture AP when the beam detection signal is half of its maximum magnitude.

Figure 49:
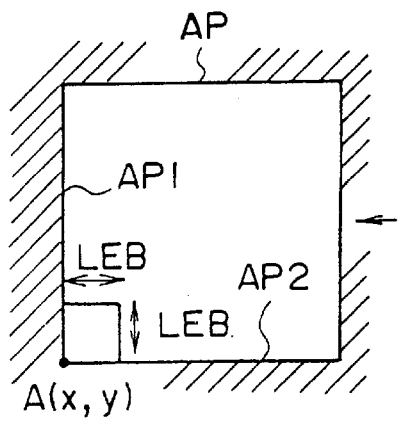
FIG.49 is an illustrative drawing showing a relation between the electron beam and the aperture when the electron beam touches another edge of the aperture.

Then, the mask stage is shifted back, so that the electron beam EB touches the edge AP1 of the aperture AP. In this manner, an X coordinate of the apex A(x,y) is obtained. FIG.49 is an illustrative drawing showing a relation between the electron beam EB and the aperture AP when the electron beam EB touches the edge AP1 of the aperture AP. The process described above is carried out at a step S219.

Namely, at the step S219, the mask stage is shifted in the X direction and the Y direction to obtain the X coordinate and the Y coordinate of the apex A(x,y).

When the mask is at an angle as shown by dotted lines in FIG.47, the X coordinate of the apex A(x,y) cannot be detected correctly by a process shown in FIG.42 through FIG.44. This is the reason why the X coordinate of the apex A(x,y) is detected by the shifts of the mask stage after the electron beam EB is positioned close to the apex A(x,y).

Figure 50:
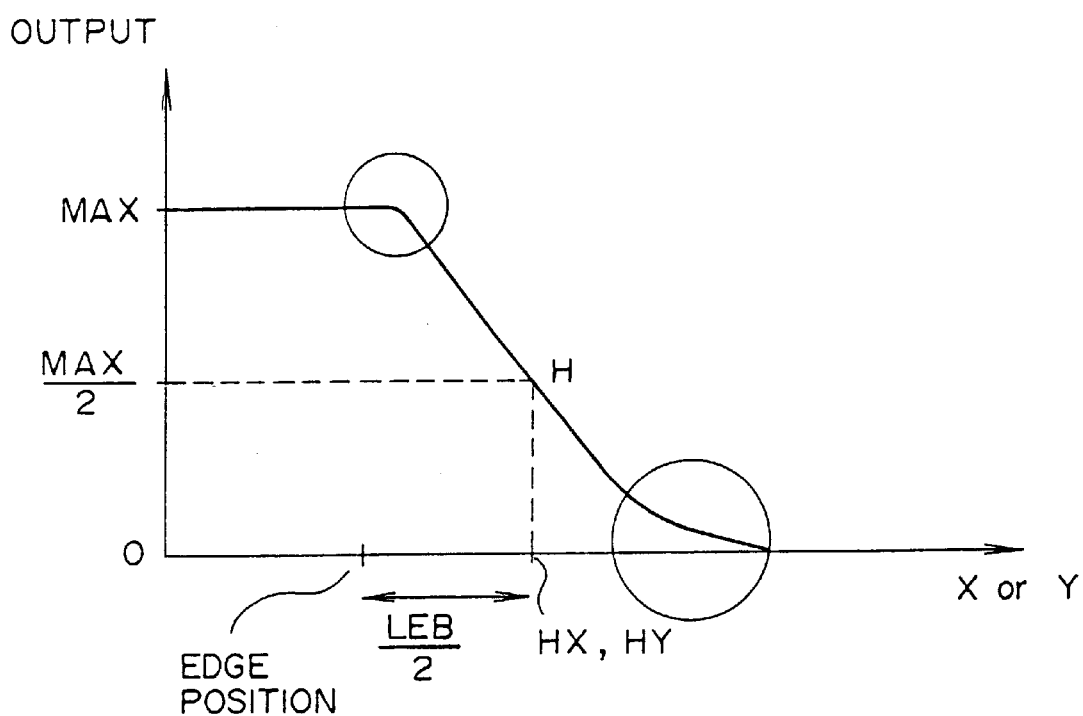
FIG.50 is an illustrative drawing showing a method of obtaining coordinates of an apex by detecting a position of the electron beam at a position of half the maximum magnitude thereof.

FIG.50 is an illustrative drawing showing a method of obtaining coordinates of the apex A(x,y) by detecting the position of the electron beam EB at a position of half the maximum magnitude thereof. Despite the rectangular shape formed by the first slit 315, the electron beam EB inevitably has a gradual intensity change at an edge thereof. Thus, when the electron beam EB is shifted across an edge of the aperture AP, the Faraday cup 341 detects a beam intensity as shown in FIG.50. In FIG.50, the ordinate shows a beam intensity, and the abscissa shows a position of the mask stage. As shown in the figure, the intensity of the electron beam EB is not sharp at an edge, so that the beam intensity is detected as a signal of a gradual change, especially at encircled points. Thus, if the electron beam EB were to stay at a position shown in FIG.47, an accurate detection of the position of the apex A(x,y) cannot be provided.

In the fourth principle of the present invention, the mask (the mask stage) is shifted up to a point H where the detected magnitude of the electron beam EB becomes half the magnitude Max when the electron beam EB fully passes the aperture AP. In a range around the midpoint, the beam intensity has substantially a linear change. Then, the mask is shifted back by half a length LEB which is a side length of the electron beam EB having a known size. This position is detected as a correct edge position (correct apex position). Accordingly, the point of the detection is not necessarily the point of half the maximum magnitude Max. As long as this point is within a linearly changing range, it can be ¼ or ⅓ of the maximum magnitude Max.

With reference back to FIG.40, after carrying out the processes of the steps S216 through S219, the variable M is incremented by 1 at a step S220.

At a step S221, a check is made whether the variable M is equal to the variable N. If it is, the procedure goes to a step S222. Otherwise, the procedure goes back to the step S216 to carry out the processes of the steps S216 through S219 for another aperture (one of the remaining two apertures). That is, when the current state is the initial state (N=3) immediately after the assembling of the mask stage 340, the remaining two apertures are further subjected to the detection of the apex position. On the other hand, only one of the remaining two apertures is subjected to the detection of the apex position when the current state is immediately after the replacement (N=2).

At a step S222, displacements of the mask 320A in the X direction and in the Y direction as well as the angle φ of the mask 320A are obtained. If the current state is the initial state, the deviation from orthogonality of the mask stage 340 is further obtained based on the positions of the three apexes.

Figure 51:
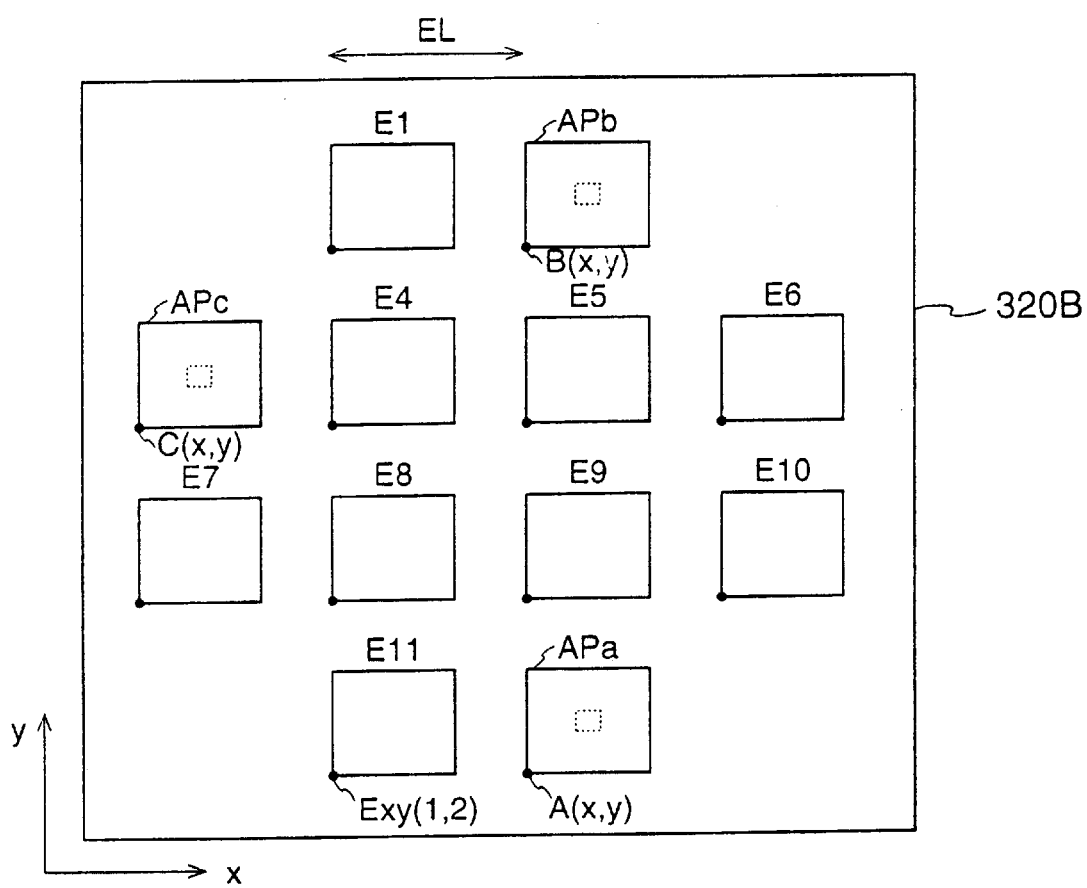
FIG.51 is an illustrative drawing showing a variation of the improved mask.

FIG.51 is an illustrative drawing showing a variation of the improved mask. In a mask 320B of FIG.51, the apertures APa, APb, and APc are provided at positions of the areas E2, E3, and E12 of the mask 320 shown in FIG.35. As shown in FIG.51, the apertures APa, APb, and APc are preferably provided as far as possible from each other.

Figure 52:
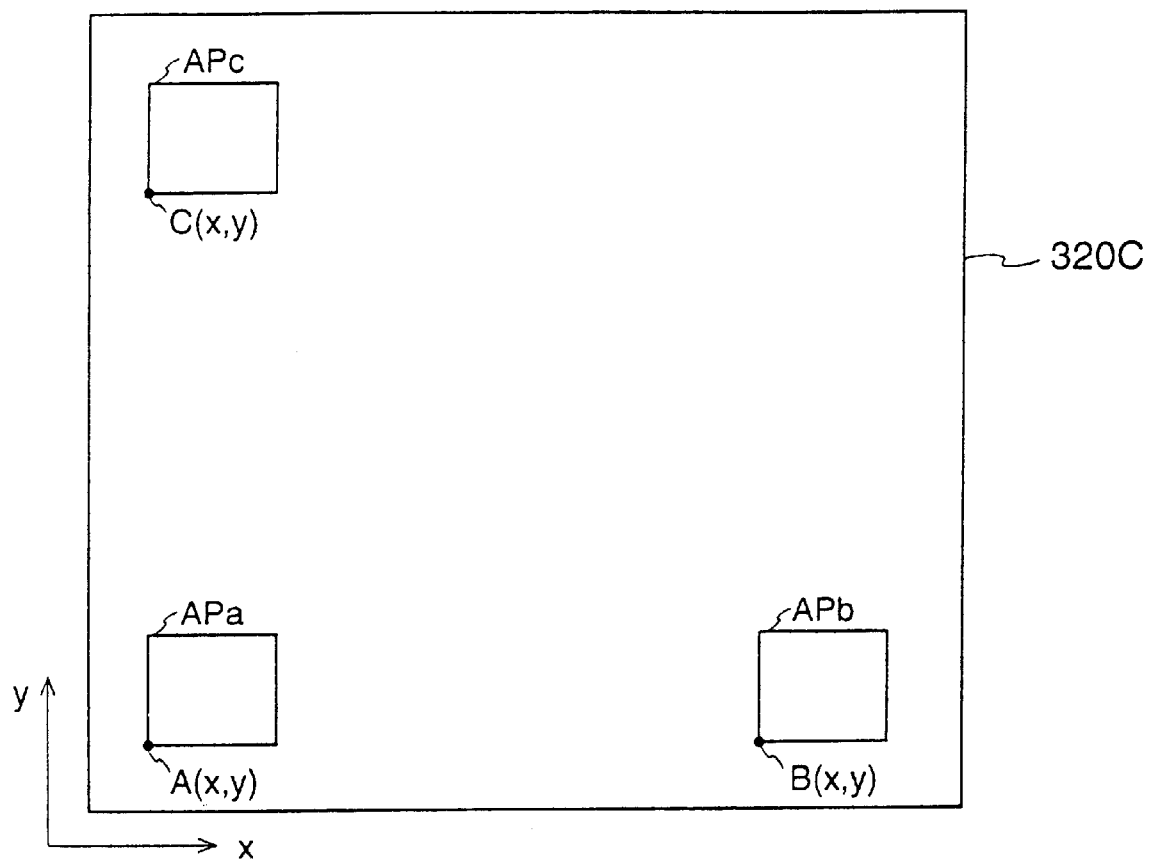
FIG.52 is an illustrative drawing showing another variation of the improved mask.

FIG.52 is an illustrative drawing showing another variation of the improved mask. In a mask 320C of FIG.52, the apertures APa, APb, and APc are provided substantially at three corners thereof, and block masks which would be used in an exposure process are not provided. That is, the example of FIG.52 shows a mask which is only used for the detection of the displacements, the angle, and the deviation.

In the manner described above, the X-direction displacement, the Y-direction displacement, and the angle φ of the mask as well as the deviation of the mask stage from the orthogonality are detected. In the following, a method of correction of these errors will be described.

First, a correction is made to a shift amount of the mask stage by the mask shifting mechanism 357 based on the deviation from the orthogonality. For example, when a shift direction of the mask stage is deviated from the Y direction, a correction is made to a shift amount of the mask stage in the X direction, and vice versa.

Then, a correction is made to a shift amount of the mask stage by the mask shifting mechanism 357 based on the X-direction displacement and the Y-direction displacement. The mask stage is generally capable of making a highly accurate shift. Thus, only a correction to the shift amount of the mask stage should be sufficient most of the time. If a sufficient accuracy is not achieved by this, a correction for a fine adjustment is made to a deflection voltage of the deflectors 321 through 324 for selecting a block mask in an area on the mask 320.

As for the angle (rotation) φ of the mask, correction is the same as the displacement correction. Namely, a correction is made to a shift amount of the mask stage, and, if this is not sufficient, a correction is made to the deflection voltage of the deflectors 321 through 324.

Further, when the mask is rotated at an angle, the rectangular beam directed to a block mask should also be rotated. Thus, the lens 316 is used for beam-rotation correction after the beam passes through the first slit 315. The rotated beam which passes through the mask to be shaped into an exposure pattern should be rotated back to its original angle before an exposure onto the wafer. Thus, the lens 326 is used for rotation correction to rotate the beam back.

When the rotation correction is made by the lens 316 or the like, various corrections to other lenses become necessary according to the rotation correction. Thus, these various corrections are made to other lenses for compensation.

The position detection algorithm and a computer program for obtaining the correction values based on the detected values are stored in the storage unit 351, which is computer readable media.

Figure 53:
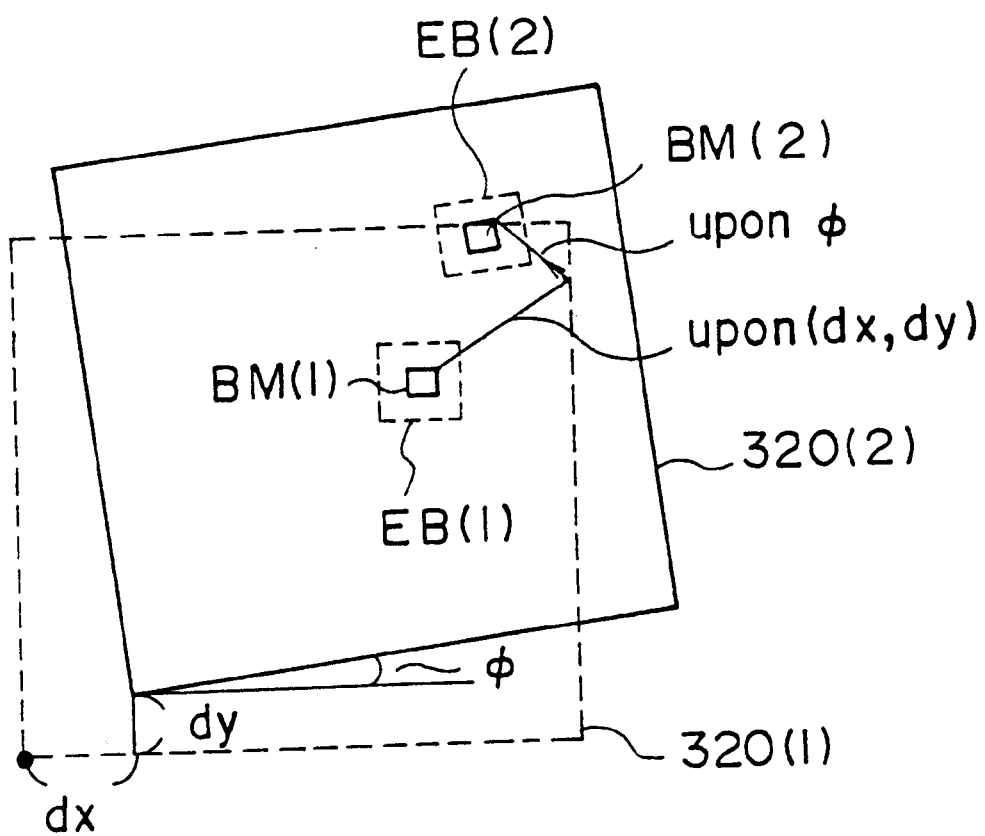
FIG.53 is an illustrative drawing for explaining a beam-position correction.

FIG.53 is an illustrative drawing for explaining the corrections described above. In FIG.53, the mask 320 at a correct position is shown as a mask 320(1), and the mask 320 at a displaced and rotated position is shown as a mask 320(2). The mask 320(2) is displaced by (dx, dy) and rotated by an angle φ relative to the mask 320(1). In this case, corrections based on the displacement (dx, dy) and the rotation angle φ must be conducted as described above. In addition, the position and angle of the electron beam EB are further corrected. That is, the electron beam EB is shifted from an initial position and an initial angle shown as EB(1) to a position and an angle shown as EB(2).

As described above, according to the fourth principle of the present invention, a plurality of large apertures, each of which allows the passage of the entire rectangular charged-particle beam, are provided through the mask, and the charged-particle beam is relatively shifted in the X direction and in the Y direction within the large aperture, so that the X coordinate, the Y coordinate, and the angle φ of the mask as well as the deviation of the mask stage from orthogonality are easily obtained. Each of the large apertures has such a large area size that the charged-particle beam can pass through under the condition of normally generated displacement. Thus, the detection process can be carried out in a short period of time.

Accordingly, throughput of the charged-particle-beam exposure device is enhanced, and an exposure of an accurate superimposition is carried out.

Moreover, the present invention concerns another problem, and a description thereof will be provided below.

The charged-particle-beam exposure method using an electron beam or an ion beam is capable of forming a sub-micron exposure patterns, so that use of the charged-particle-beam exposure method is effective in microprocessing surfaces such as semiconductor-wafer surfaces and mask-base surfaces. The charged-particle-beam exposure method is far superior to widely-used optical exposure methods in terms of resolution and focus depth of exposure patterns.

In the charged-particle-beam exposure method, however, the charged-particle beam should be directed to a desired position on a wafer, thereby requiring accurate positioning of the beam. A first problem concerning the accurate positioning of the beam is the detection of the beam position on the wafer with respect to the coordinate system of the stage which carries the wafer. A second problem is the detection of a position of a positioning mark on the wafer with respect to the coordinate system of the stage.

The first problem affects stitching accuracy between deflection fields. This first problem can be overcome by a calibration of the beam position which detects the beam position with respect to the coordinate system of the wafer stage, and, then, detects a shifted (deflected) beam position with respect to the coordinate system of the wafer stage.

The second problem affects the positioning of exposure patterns when these exposure patterns are superimposed one over another. This second problem is obviated by superimposing exposure patterns based on positions of alignment marks on the wafer, after detecting correct positions of the alignment marks with respect to the stage coordinate system by calibrating scattered-electron detectors for detecting these alignment marks.

Such a beam-position detection and a positioning-mark detection are conventionally carried out by using a plurality of scattered-electron detectors provided in a proximity of the wafer. An electron beam is scanned over a ditch-like mark provided on a surface of the wafer or the wafer stage, and electrons scattered by the ditch-like mark are detected by the plurality of the detectors. Scattered-electron signals from the plurality of detectors are added together, and an analysis of a resulting signal waveform allows the position detection.

FIG.54 is an illustrative drawing showing a conventional configuration for detection of the positioning marks based on scattered-electron detectors. As shown in FIG.54, an electron beam EB is scanned in a direction shown by an arrow SCAN over a mark MK, which is comprised of steps ST1 and ST2 formed in a surface of a stage or a wafer. Scattered-electron detectors 540 and 541, which detect electrons scattered by the mark MK, output scattered-electron-intensity signals, which are added by an adder 542. Then, a signal-analysis unit 543 analyzes the added signal.

Figures 55A, 55B, 55C:
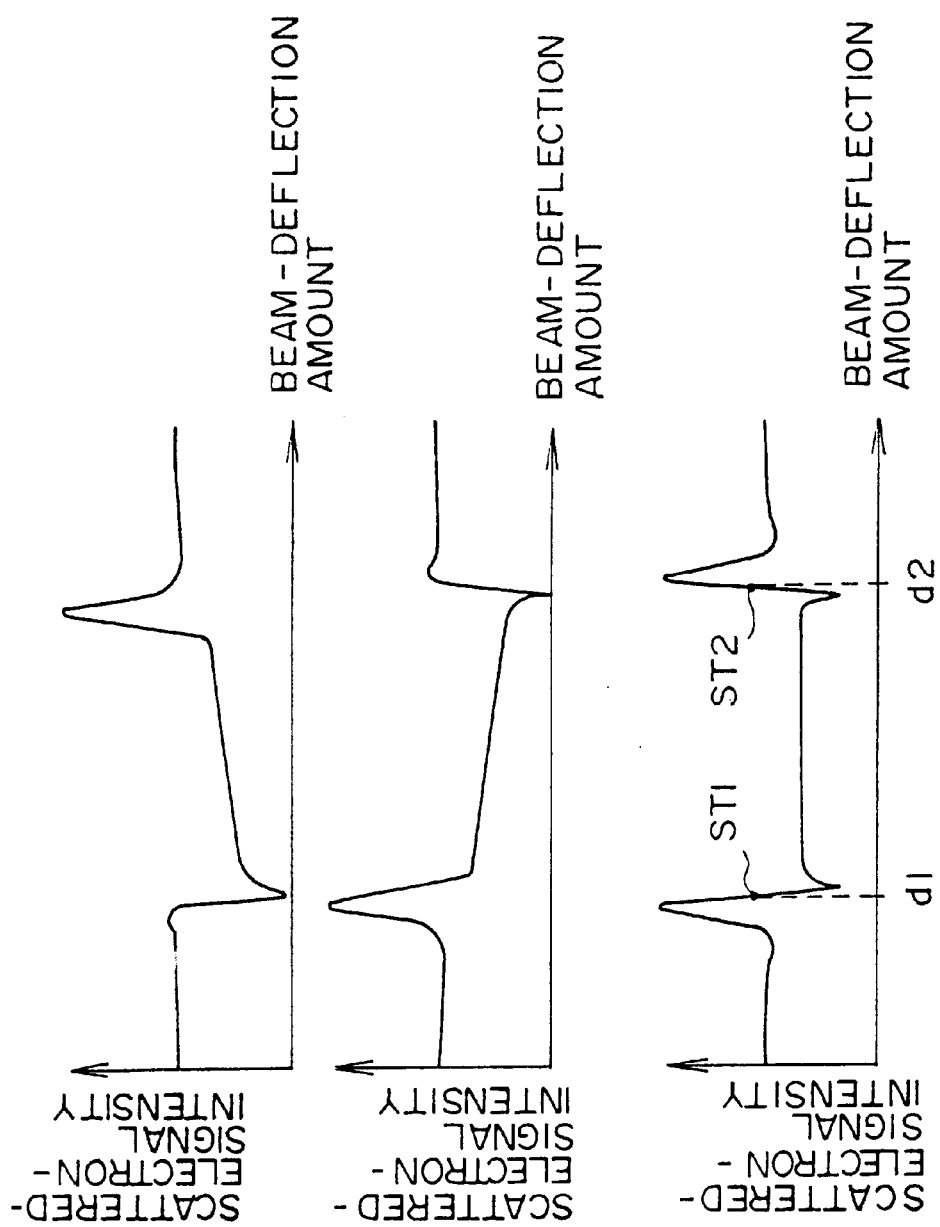
FIGS.55A and 55B are illustrative drawings showing signals detected by the scattered-electron detectors.
FIG.55C is an illustrative drawing showing an added signal.

FIGS.55A and 55B are illustrative drawings showing signals detected by the scattered-electron detectors, and FIG.55C is an illustrative drawing showing the added signal. As shown in FIG.55B, when the electron beam EB is scanned over the step ST1, the scattered-electron detector 541 provided on an opposite side to the step ST1 detects a scattered-electron signal having a relatively high intensity. On the other hand, as shown in FIG.55A, the scattered-electron detector 540 on the side of the step ST1 detects a scattered-electron signal having a relatively low intensity. This is because scattered electrons are obstructed by the step ST1 before reaching the scattered-electron detector 540.

When the electron beam EB is scanned over the step ST2, the opposite to what is described above happens. As a result, an added signal shown in FIG.55C, which is obtained by adding together the scattered-electron signals from the scattered-electron detectors 540 and 541, has a generally symmetrical shape. In the added signal of FIG.55C, two points st1 and st2 where a slope of the signal waveform becomes maximum correspond to positions of the steps ST1 and ST2, respectively. Then, a center position between these two points is detected as a center position of the mark MK.

However, the method described above can only accurately detect the position of the mark MK, when the scattered-electron detectors 540 and 541 are provided at symmetrical positions with respect to the mark MK. If the mark MK is positioned closer to the scattered-electron detector 540 than to the scattered-electron detector 541 or vice versa, the accuracy of the position detection is deteriorated.

Figure 56A:
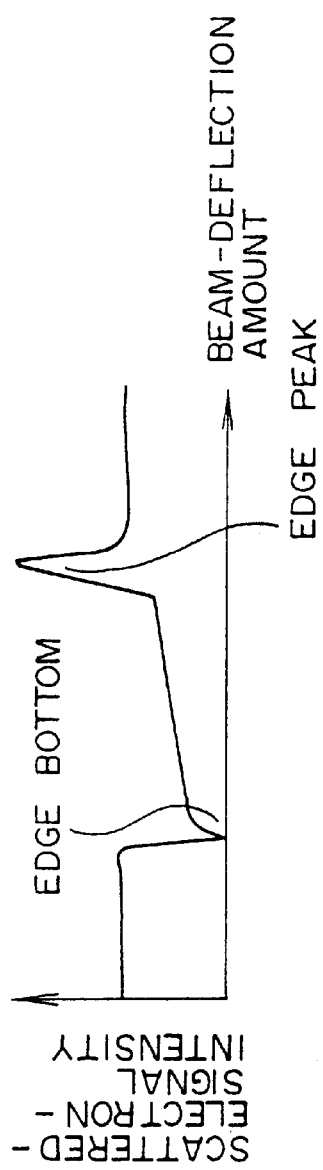
FIGS.56A through 56C are illustrative drawings for explaining deterioration of position-detection accuracy.
Figure 56B:
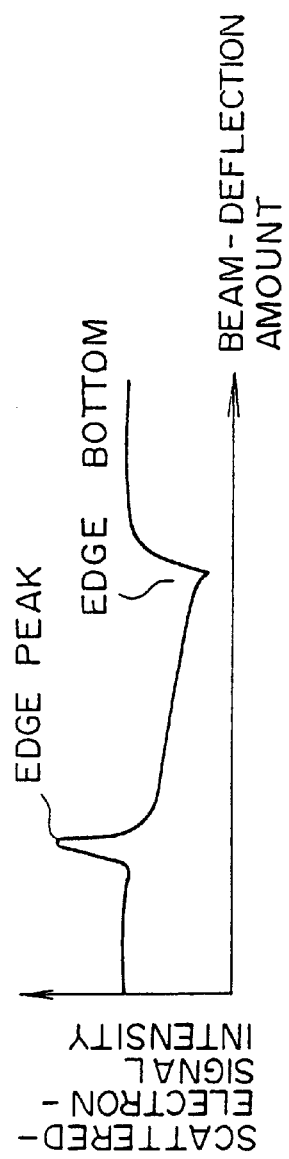
Figure 56C:
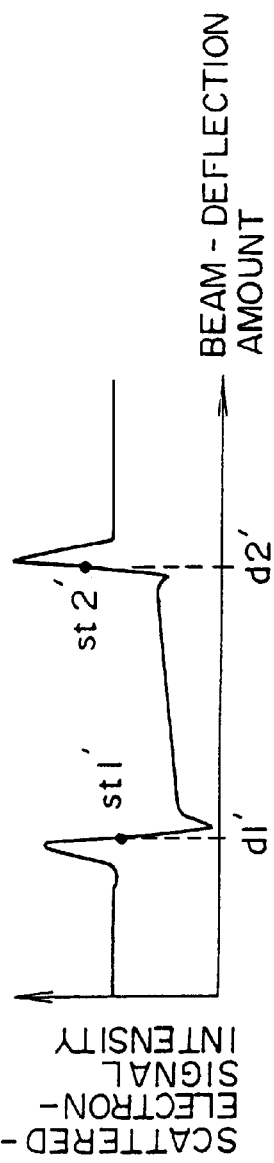

FIGS.56A through 56C are illustrative drawings for explaining the deterioration of the position-detection accuracy. As a comparison between FIG.56A and FIG.56B, the scattered-electron detector 540 closer to the mark MK outputs a signal (FIG.56A) which has a lower edge bottom corresponding to the step ST1 and a higher edge peak corresponding to the step ST2, and the scattered-electron detector 541 more distant from the mark MK outputs a signal (FIG.56B) which has a lower edge peak corresponding to the step ST1 and a higher edge bottom corresponding to the step ST2.

As a result, a signal obtained by adding the two signals from the two detectors has an asymmetric shape as shown in FIG.56C. Because of this asymmetry, points of the maximum slope st1' and st2' are displaced to the right in the figure. Such a displacement is about 0.05 μm, for example. If expectations for the use of the electron-beam exposure method are to be met, however, a pattern less than 0.15 μm must be formed. In order to achieve this, a positioning accuracy within a tolerance level of 0.015 μm is required. Thus, even a displacement of 0.05 μm cannot be ignored.

Such a problem is caused by the fact that the scattered-electron detectors for detecting scattered electrons are spatially distanced from the mark to be detected.

Some of the inventors of the present invention disclosed a method for obviating this problem in Japanese Patent Application No.7-184232, in which gains of the amplifiers for amplifying output signals from scattered-electron detectors are controlled based on a mark position so as to obtain output signals of a constant intensity from the amplifiers. However, controlling the gains results in more complex work steps being required for a calibration process and an alignment-mark detection process.

Also, a method of detecting an electron-beam shape is disclosed in Japanese Patent Laid-Open Application No.7-226361. In this method, a Faraday cup for detecting an intensity of an electron beam and a knife edge for shaping the electron beam are provided on the wafer stage. However, a Faraday cup has too slow a response time to appropriately detect the beam intensity, so that the Faraday cup is not suitable for a beam-position detection and a mark detection of a high-speed nature. Also, the knife edge for cutting off the beam has a relatively large aperture size in order to detect the beam shape, so that such a knife edge cannot be used as a replacement of the position detection mark.

Accordingly, there is a need for a charged-particle-beam exposure device which can accurately detect a position of the charged-particle beam.

Also, there is a need for a charged-particle-beam exposure device which can carry out an accurate calibration of the charged-particle beam, and can accurately detect a position of an alignment mark on a wafer.

Further, there is a need for charged-particle-beam exposure device which can accurately detect a beam position and a mark position by providing a beam-position-detection mark and charged-particle detectors one over the other on a wafer stage.

A fifth principle of the present invention addresses the needs described above.

In the following, embodiments of the fifth principle will be described with reference to the accompanying drawings. However, the scope of the present invention is not intended to be limited to these embodiments.

Figure 57:
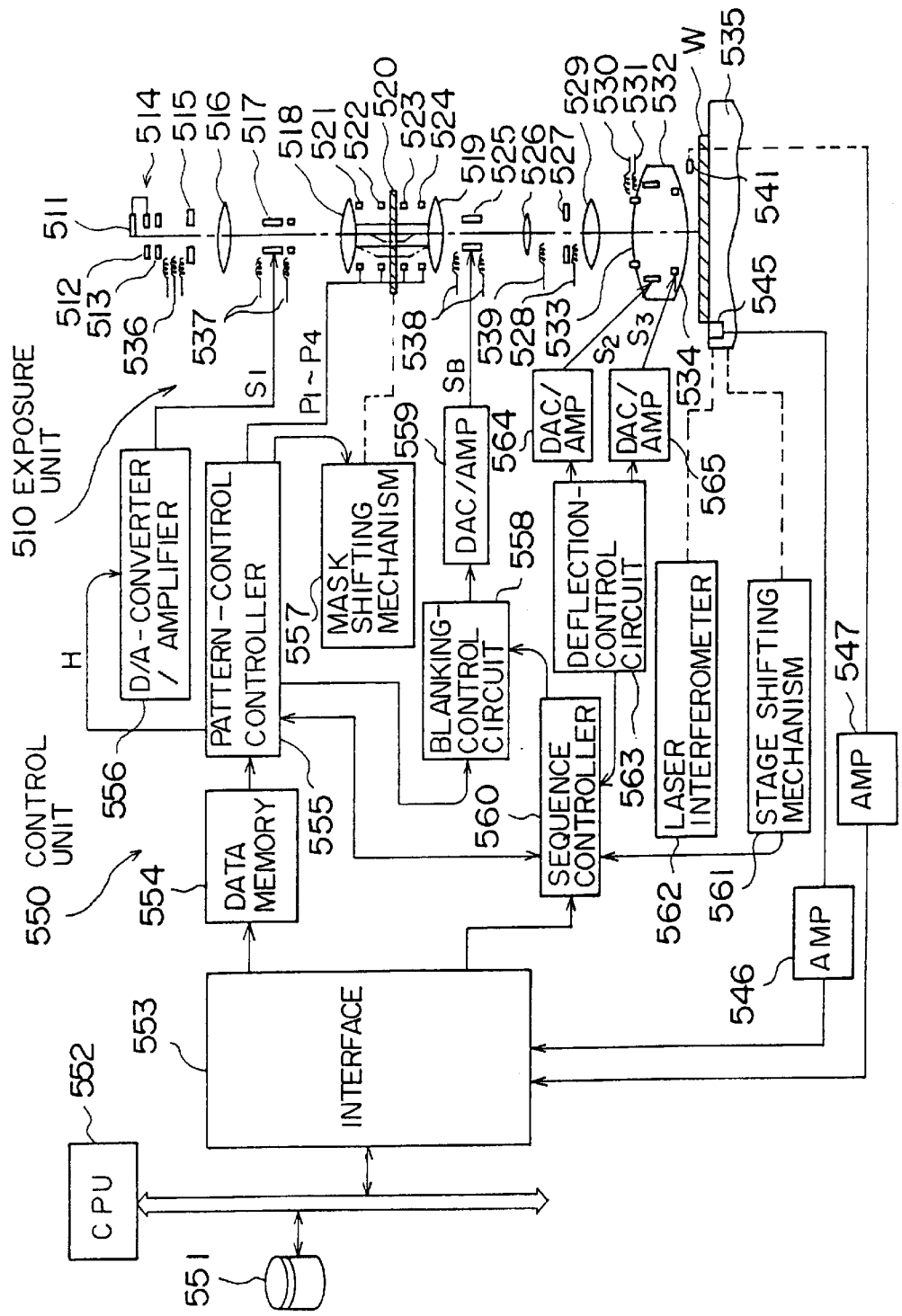
FIG.57 is an illustrative drawing showing the entire configuration of an exposure device which employs an electron beam as a charged-particle beam.

FIG.57 is an illustrative drawing showing the entire configuration of an exposure device which employs an electron beam as a charged-particle beam. In the following, a description of the fifth principle will be given by taking an electron beam as an example. The exposure device of FIG.57 includes an exposure unit 510 and a control unit 550. Various lenses and deflectors provided in the exposure unit 516 are controlled by the control unit 550. In the control unit 550, pattern data stored in a storage unit 551 such as a hard drive is provided through an interface 553 to convert the pattern data into various driving signals required for exposure. The lenses and deflectors in the exposure unit 510 are driven by these driving signals.

Figure 58:
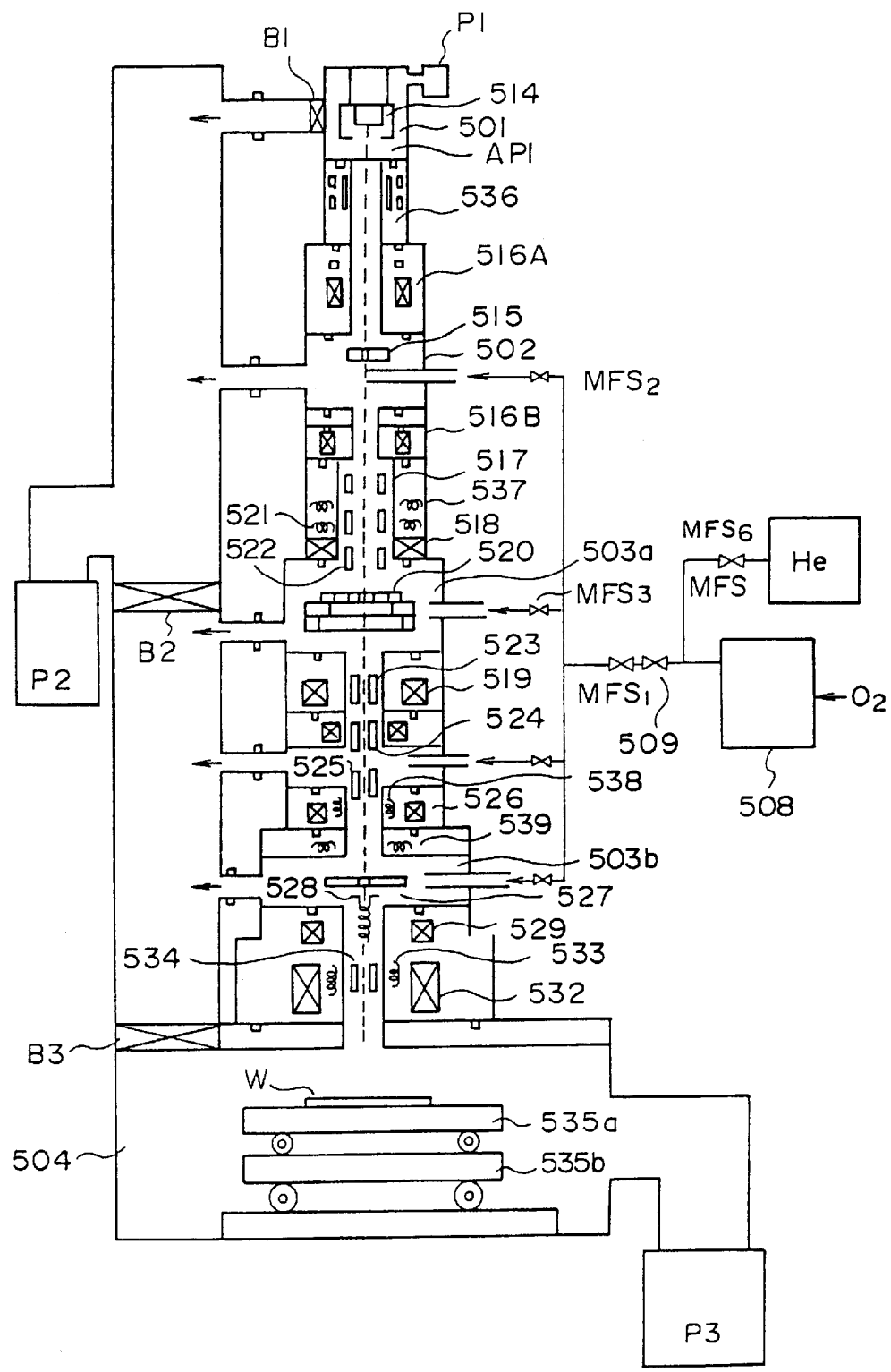
FIG.58 is an illustrative drawing showing a detailed configuration of an exposure unit shown in FIG.57.

FIG.58 is an illustrative drawing showing a detailed configuration of the exposure unit 510 shown in FIG.57. A description of the exposure unit 510 will be better understood with reference to FIG.58 in addition to FIG.57.

A description of the exposure unit 510 will be provided first. An electron gun 514 serving as an electron-beam generator includes a cathode electrode 511, a grid electrode 512, and an anode electrode 513. An electron beam is directed to a first slit 515 via an alignment coil 536 and a lens 516A (not shown in FIG.57 but shown in FIG.58). The first slit 515 has a rectangular aperture to shape a cross section of the electron beam into a rectangular shape. A resulting rectangular beam is passed through a slit deflector 517 after a lens 516B. The slit deflector 517 is controlled by a deflection signal S1 for a minute adjustment of a beam position. An alignment coil 537 is provided for an alignment purpose.

In order to shape the electron beam into a desired pattern, a mask 520 which has a plurality of apertures including a rectangular aperture and various block masks is provided. Electromagnetic lenses 518 and 519 and deflectors 521 through 524 are provided above or below the mask 520 to deflect the electron beam to a selected block pattern. The mask 520 is mounted on a stage movable in horizontal directions.

The electron beam thus shaped is passed through a blanking electrode 525 to which a blanking signal SB is applied, so that on/off states of the electron beam onto a wafer W are controlled by the blanking electrode 525. An alignment coil 538 is also provided besides the blanking electrode 525.

The electron beam passes through a lens 526 and a round aperture 527 when an on state is selected by the blanking electrode 525. The round aperture 527 is a kind of diaphragm whose aperture size is controllable, and controls a convergency angle of the electron beam. Finally, a shape of the electron beam is adjusted by a refocus coil 528 and an electromagnetic lens 529. A focus coil 530 focuses the electron beam on a surface of an exposure target, and a stigmator coil 531 is used for astigmatism correction.

Finally, a size of the electron beam is reduced to an exposure size by a projection lens 532. A main deflector 533 and a sub-deflector 534, respectively controlled by exposure-position determination signals S2 and S3, deflect the electron beam to a desired position on a surface of the wafer. The main deflector 533 is an electromagnetic deflector, and the sub-deflector 534 is an electrostatic deflector.

According the fifth principle of the present invention, a beam detector 545 which is a mark and a photodiode integrally formed together is provided on an upper surface of a stage 535 carrying the wafer W, where the photodiode detects scattered electrons. The beam detector 545 has a configuration such that a silicon-oxide layer or a metal layer having the same shape as the mark is formed on a surface of a semiconductor substrate in which the photodiode is formed. When the electron beam is shot at the mark, the photodiode provided below the mark can detect the beam. The beam detector 545 will be later described in detail.

A plurality of scattered-electron detectors 541 (only one is shown in FIG.57) are provided in a proximity of the wafer W to detect electrons scattered when the electron beam is shot. Outputs of the beam detector 545 and the scattered-electron detector 541 are supplied to the interface 553 via an amplifier 546 and an amplifier 547, respectively. These outputs are analyzed by a CPU 552 for the purposes of calibrations, etc.

In the following, the control unit 550 will be described. As previously described, the data of the exposure pattern is stored in the storage unit 551. The CPU 552 reads out the data from the storage unit 551 to obtain data for drawing patterns. The data for drawing patterns is supplied to a data memory 554 and a sequence controller 560 via the interface 553. The data for drawing patterns includes position data and mask data, the position data indicating positions on the wafer W to which the electron beam is to be directed, and the mask data indicating which patterns on the mask 520 are to be selected.

A pattern-control controller 555 provides the deflectors 521 through 524 with position signals P1 through P4 which indicate a block mask on the mask 520 according to the mask data. Also, the pattern-control controller 555 calculates a correction value H according to a difference between a desired pattern shape and a selected aperture shape, and feeds it to a D/A-converter/amplifier 556. The D/A-converter/amplifier 556 supplies a correction deflection signal S1 to the slit deflector 517. Further, the pattern-control controller 555 controls the mask shifting mechanism 557 according to a position of the selected aperture to shift the mask 520 in a horizontal direction.

A blanking-control circuit 558 supplies a blanking signal SB to the blanking electrode 525 via an amplifier 559 according to a control signal from the pattern-control controller 555. The blanking electrode 525 controls the on/off states of the electron beam.

The sequence controller 560 receives the position data from the interface 553 to control a pattern drawing sequence. A stage shifting mechanism 561 shifts the stage 535 in a horizontal direction based on a control signal provided from the sequence controller 560. A shift amount of the stage 535 is detected by a laser interferometer 562, and is fed to a deflection-control circuit 563. The deflection-control circuit 563 supplies the deflection signals S2 and S3 to the main deflector 533 and the sub-deflector 534, respectively, according to the shift amount as well as the exposure position data provided from the sequence controller 560. Generally, the main deflector 533 deflects the electron beam within a deflection field of a 2-to-10-mm square, and the sub-deflector 534 deflects the electron beam within a sub-field of a 100-μm square, for example.

Figure 59:
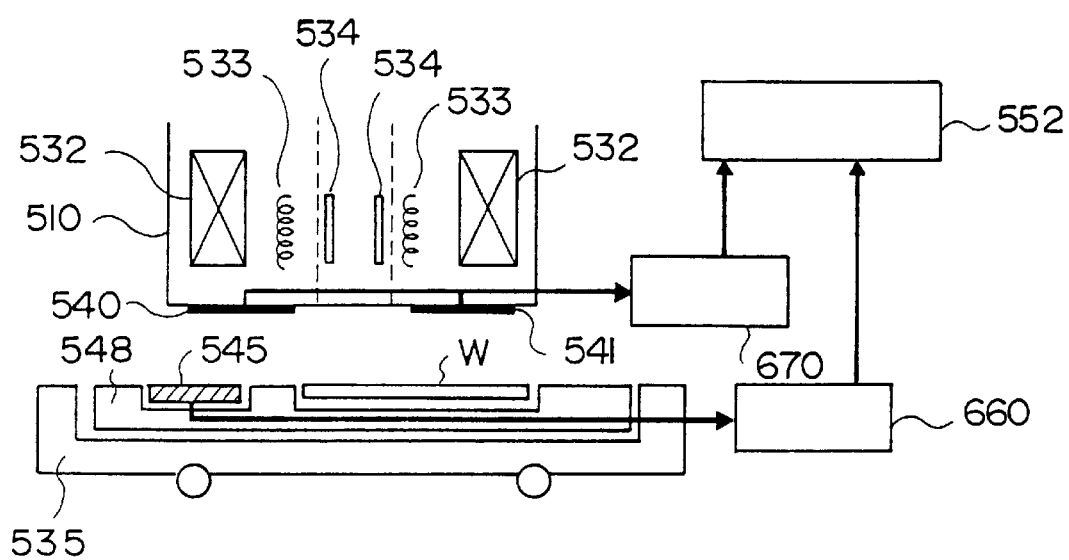
FIG.59 is an illustrative drawing showing a configuration for detecting a beam position based on a beam detector and the scattered-electron detectors.

FIG.59 is an illustrative drawing showing a configuration for detecting a beam position based on the beam detector 545 and the scattered-electron detectors 540 and 541. As shown in FIG.57 and FIG.58, the exposure unit 510 is an exposure column. The projection lens 532 and the main deflector 533 as well as the sub-deflector 534 are provided in a vacuum atmosphere immediately above the wafer W as shown in FIG.59. The stage 535 is placed at the bottom of the exposure unit 510, and carries a holder 548 for holding the wafer W. The holder 548 may be integrally formed with the stage 535.

The beam detector 545 which can directly detect the intensity of the electron beam is buried in an upper surface of the holder 548. The scattered-electron detectors 540 and 541 are arranged to face the wafer W. The scattered-electron detectors 540 and 541 are provided to detect scattered electrons in a conventional manner when positions of alignment marks on the wafer W should be detected.

Figure 60:
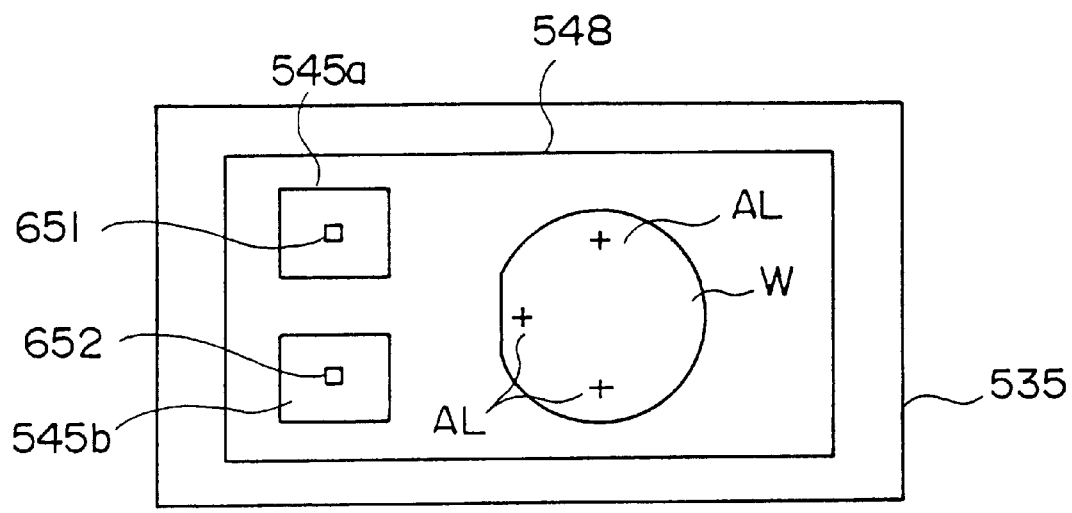
FIG.60 is a plan view of a stage carrying a holder.

FIG.60 is a plan view of the stage 535 carrying the holder 548. As shown in FIG.60, a beam detector 545a and a beam detector 545b are provided in the holder 548. These beam detectors 545a and 545b have been previously described as the beam detector 545. The beam detectors 545a and 545b include a solid device such as the photo-detector previously described, and have marks 651 and 652, respectively, on an upper surface of the solid device. The marks 651 and 652 are an opening formed through a layer which can prevent the passage of the electron beam. In FIG.60, the wafer W is also held by the holder 548, and alignment marks AL are provided on the wafer W.

Figure 61:
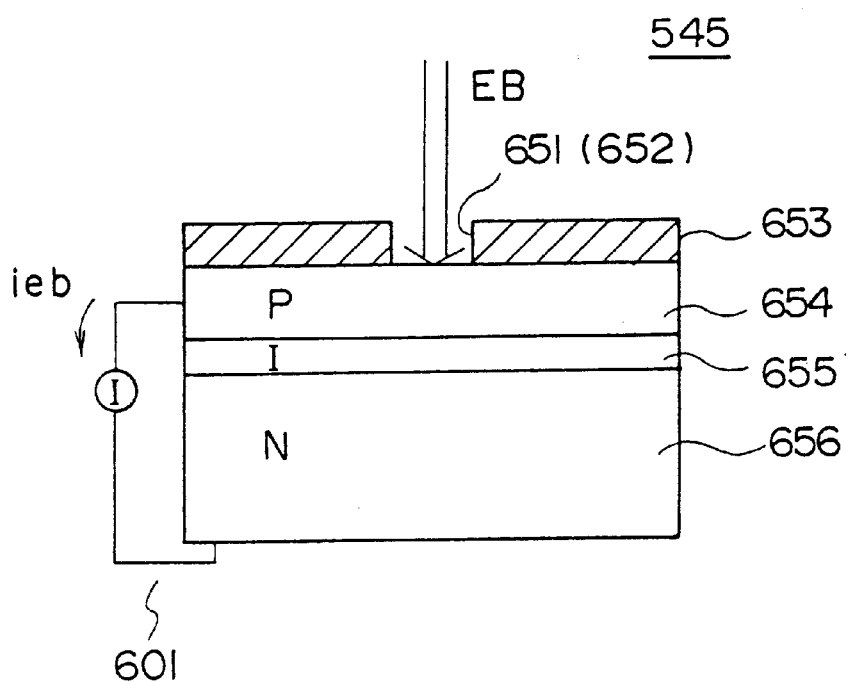
FIG.61 is a cross-sectional view of an exemplary configuration of the beam detector.

FIG.61 is a cross-sectional view of an exemplary configuration of the beam detector 545 (545a or 545b). The beam detector 545 of FIG.61 includes a mark 651 (652), a beam-cut-off layer 653, a P-type area 654, a half-insulating area 655, and an N-type silicon substrate 656. The N-type silicon substrate 656, the half-insulating area 655, and the P-type area 654 are laid one over another in this order from the bottom to form a P-I-N photodiode. The N-type silicon substrate 656 and the P-type area 654 are connected to a bias circuit 601. On the top of the P-type area 654 is provided the beam-cut-off layer 653 which is formed from a heavy metal such as W, Ta, Au, or the like. The mark 651 is an opening through the beam-cut-off layer 653 to expose the photodiode. The beam-cut-off layer 653 has a high electron-scattering coefficient to effectively shut off the electron beam.

When the electron beam EB is scanned over the beam detector 545, the electron beam EB can reach the photodiode only at a position of the mark 651 (652). When this happens, carriers in the PIN photodiode receiving bias voltage are excited by the electron beam EB, thereby causing a circulation of a beam-detection current ieb which indicates a detection of the beam.

The beam-cut-off layer 653 may be formed from silicon the same as the N-type silicon substrate 656. In this case, a beam-cut-off effect is weaker than the use of the heavy metal. However, the mark 651 (652) in this case can be formed as a ditch-like mark in the silicon layer as in the prior art. Thus, the mark 651 (652) can be used as a reference mark, and electrons scattered from a beam scan can be detected by the scattered-electron detectors 540 and 541.

In this manner, according to the fifth principle of the present invention, the mark for detecting the beam position and the detector for detecting the beam electrons are integrally formed in the surface of the stage or the surface of the holder on the stage, so that the problem of detected-mark-position displacement caused by asymmetrical positional relation between the mark and the beam detectors is obviated. That is, even when the beam scan of the mark is conducted at a position deviated from a center of the drawing field, detection of the mark by the detector provided below the mark is not influenced by the position of the mark. Also, a restriction in a configuration such that the scattered-electron detectors be provided at symmetrical positions relative to the mark with a sufficient view angle is no longer present. Further, the photodiode used as the detector has a shorter response time than the Faraday cup used in the prior-art beam shape detection, and, thus, is more suitable when a plurality of marks are used for detecting mark positions and beam positions.

As described above, the use of the integrally formed mark and the beam detector makes it possible to accurately detect the beam position with respect the coordinate system of the stage. As a result, an accurate calibration of the beam position is possible based on the detected beam position. Namely, deflection coefficients used in the beam deflectors such as the main deflector 533 for determining the degree of deflection are accurately obtained. The deflection coefficients thus obtained are used to precisely deflect the beam at a predetermined position. This means that the positional accuracy of exposure patterns and the stitching accuracy between exposure fields can be enhanced.

During an exposure for superimposing a pattern over a previously formed pattern, detectors are required to detect positions of alignment marks on a wafer. In order to calibrate the scattered electron detectors first, the beam detectors of the fifth embodiment may be used for detecting the beam position when a beam scan over the detector is conducted. In this manner, the problem of positional displacement is obviated. That is, alignment accuracy is enhanced in a superimposing exposure.

In the following, a method of calibration will be described.

Figure 62:
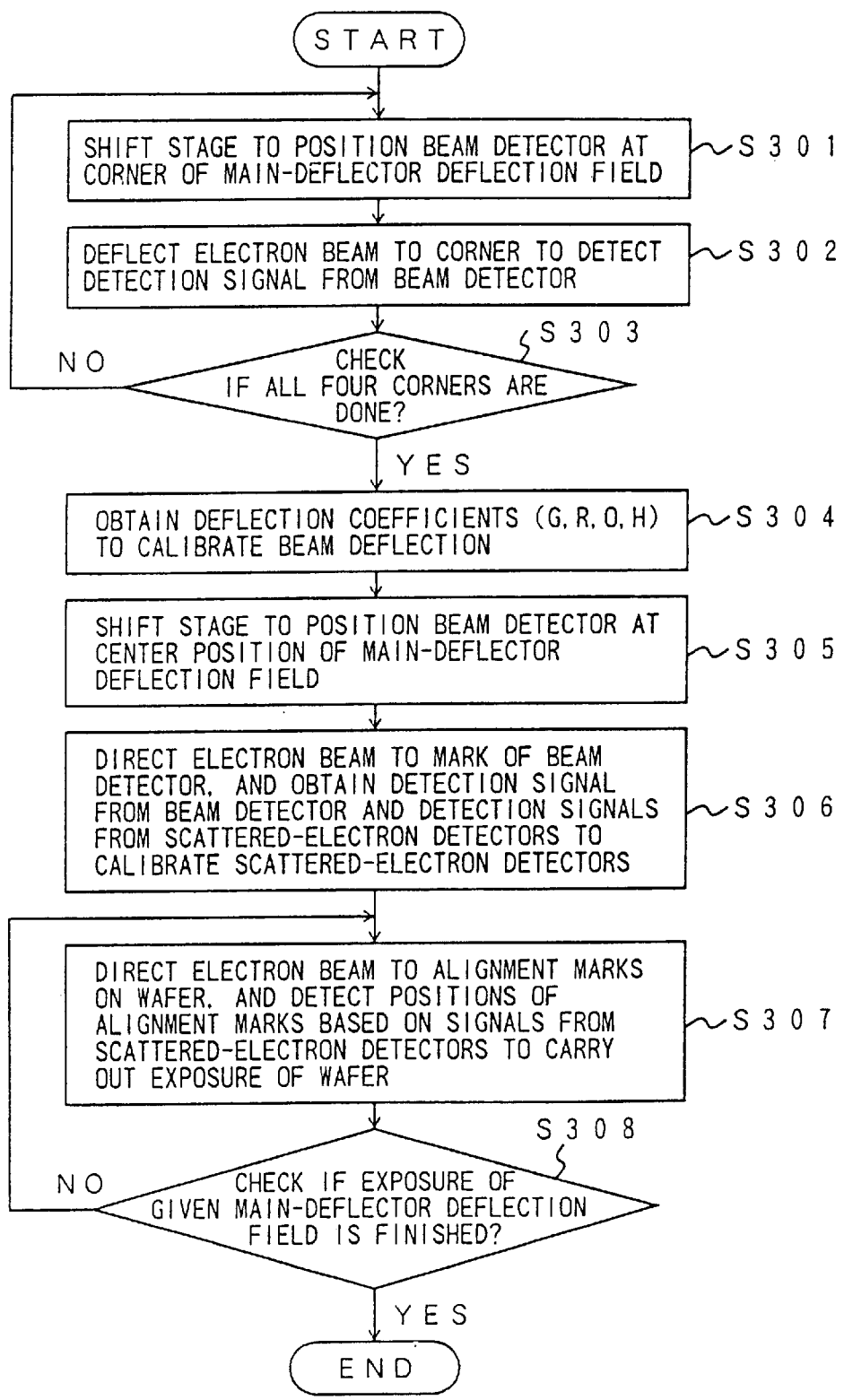
FIG.62 is a flowchart of the method of calibration.

FIG.62 is a flowchart of the method of calibration. In the flowchart of FIG.62, steps S301 through S304 are steps of obtaining deflection efficiency (deflection coefficients) by using the beam detector provided in the stage. Steps S305 through S308 are steps of calibrating the scattered-electron detectors and of carrying out a superimposing exposure.

Figure 63:
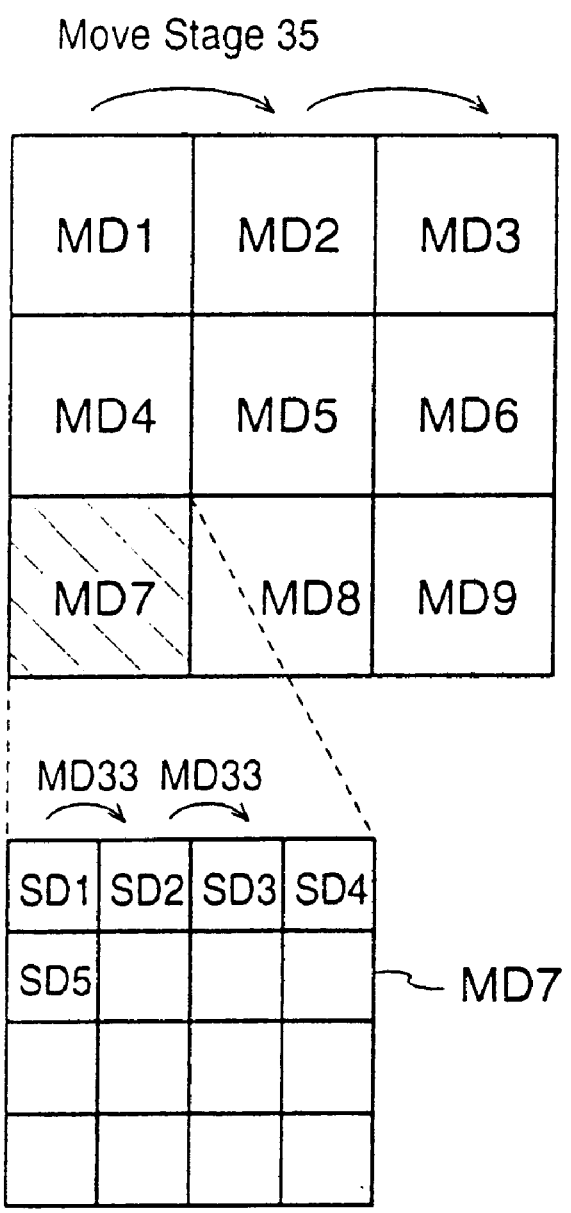
FIG.63 is an illustrative drawing for explaining a relation between a main-deflector deflection field and a sub-deflector deflection field.

FIG.63 is an illustrative drawing for explaining a relation between a main-deflector deflection field and a sub-deflector deflection field. In FIG.63, main-deflector deflection fields MD1 through MD9 are shown. Each of the main-deflector deflection fields MD1 through MD9 is an area in which the electron beam can be deflected by the main deflector 533. The main deflector 533 is a deflector of a slow response time, but has a relatively large deflection range for beam deflection. For example, the main-deflector deflection field is about a 2-to-10-mm square. An interior of each of the main-deflector deflection fields MD1 through MD9 is divided into a plurality of sub-deflector deflection fields SD1, SD2, SD3, and so on. Beam deflection within each of the sub-deflector deflection fields is carried out by the sub-deflector 534.

Beam shifts between the main-deflector deflection fields MD1 through MD9 are carried out by movement of the stage 535. First, a stage movement positions a center of one of the main-deflector deflection fields MD1 through MD9 at a center axis of the beam optical system, for example. Then, beam shifts between the sub-deflector deflection fields within the main-deflector deflection field are carried out by the main deflector 533. Further, the sub-deflector 534 deflects the electron beam within the sub-deflector deflection field.

In general, beam deflection by the main deflector 533 contains errors caused by characteristics of the main deflector 533 and the projection lens 532 provided beside the main deflector 533. The beam deflection by the main deflector 533 contains over deflection and/or under deflection in the X–Y directions, rotation around the center axis, displacement (offset) in the X–Y directions, and distortion of a rectangular deflection field into a trapezoid shape.

Figure 64:
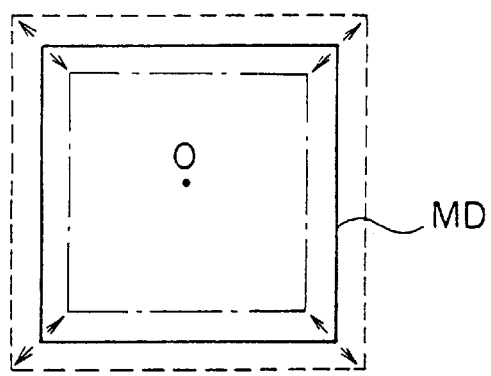
FIG.64 is an illustrative drawing showing an example of over deflection and under deflection.

FIG.64 is an illustrative drawing showing an example of the over deflection and the under deflection. In FIG.64, the main-deflector deflection field MD of a correct size is shown by solid lines, and an enlarged main-deflector deflection field because of the over deflection and a reduced main-deflector deflection field because of the under deflection are shown by dotted lines and dashed lines, respectively. When such enlargement or reduction of the field size is present, appropriate gain coefficients (Gx, Gy) regarding X–Y coordinates from a center position O should be provided to the main deflector 533 as correction values.

Figure 65:
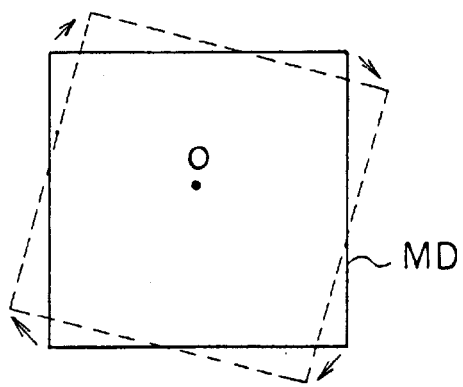
FIG.65 is an illustrative drawing showing an example of rotation.

FIG.65 is an illustrative drawing showing an example of the rotation. In FIG.65, the main-deflector deflection field MD at a correct angle is shown by solid lines, and a rotated main-deflector deflection field is shown by dotted lines. When such rotation is present, appropriate rotation coefficients (Rx, Ry) should be provided to the main deflector 533 as correction values.

Figure 66:
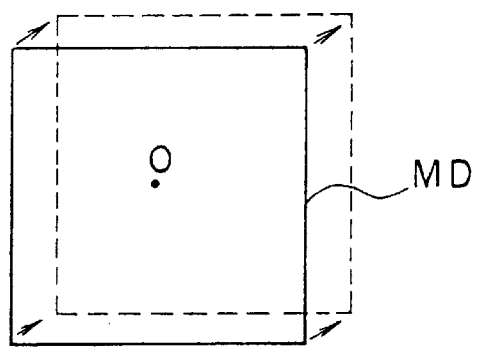
FIG.66 is an illustrative drawing showing an example of a displacement.

FIG.66 is an illustrative drawing showing an example of the displacement. In FIG.66, the main-deflector deflection field MD at a correct position is shown by solid lines, and a displaced main-deflector deflection field is shown by dotted lines. When such displacement is existent, appropriate offset coefficients (Ox, Oy) should be provided to the main deflector 533 as correction values.

Figure 67:
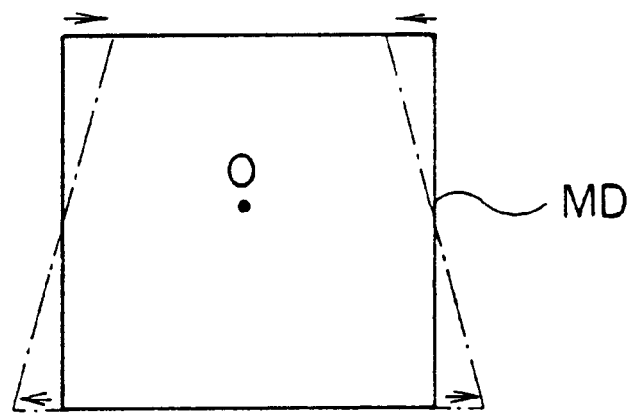
FIG.67 is an illustrative drawing showing an example of distortion.

FIG.67 is an illustrative drawing showing an example of the distortion. In FIG.64, the main-deflector deflection field MD at a correct shape is shown by solid lines, and a distorted main-deflector deflection field is shown by dashed lines. When such distortion is present, appropriate trapezoid coefficients (Hx, Hy) should be provided to the main deflector 533 as correction values.

By accurately obtaining these deflection coefficients (G, R, O, H), a deflected beam can be directed at a desired position within a correct deflection field as shown by solid lines in FIGS.64 through 67.

Figure 68:
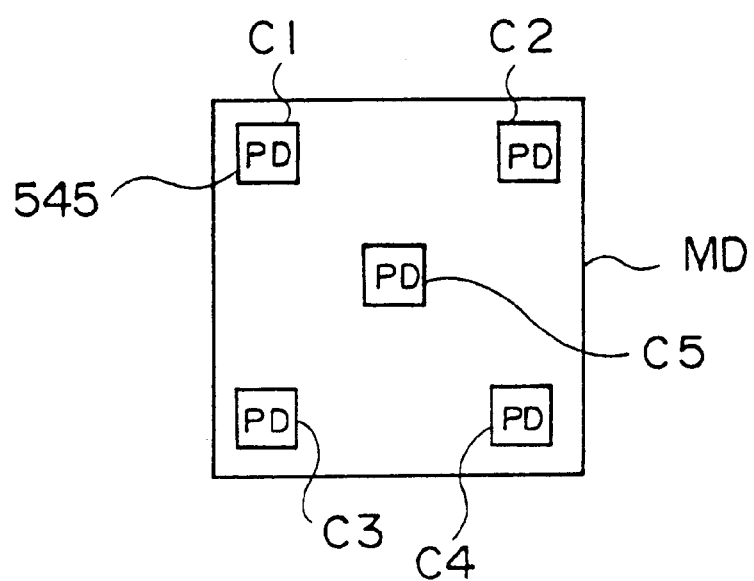
FIG.68 is an illustrative drawing showing a configuration of a deflection field and the beam detector for obtaining deflection coefficients.

FIG.68 is an illustrative drawing showing a configuration of the deflection field MD and the beam detector 545 for obtaining these deflection coefficients. In the figure, the beam detector 545 including the photodiode is shown by symbol PD. In the. flowchart of FIG.62, the stage 535 is shifted to position the beam detector 545 successively at four corners of the main-deflector deflection field MD, and the beam positions are detected at these four corners. These four corners are shown by symbols C1 through C4, and a center position is shown by symbol C5.

With reference to FIG.62, at a step S301, the stage 535 is shifted to position the beam detector 545 at the corner C1 of the main-deflector deflection field MD.

At a step S302, the main deflector 533 deflects the electron beam to the corner C1. When the electron beam is shot at the mark 651 of the beam detector 545, the beam detector 545 outputs a detection signal indicating the beam hit. The stage 535 is capable of accurate position detection of the beam detector 545 based on the laser interferometer 562. Based on a deflection magnitude used by the deflection-control circuit 563 when the beam is shot at the mark 651, the beam position is obtained with reference to the coordinate system of the stage 535. Based on the detected beam position, a displacement of the beam position is obtained.

At a step S303, a check is made whether the steps S301 and S302 are carried out for all the four corners. If they are, the procedure goes to a step S304. Otherwise, the procedure goes back to the step S301 to repeat the steps S301 and S302 for another remaining corner. In this manner, beam displacements are obtained at the four corners of the main-deflector deflection field MD.

At a step S304, deflection coefficients (G, R, O, H) are obtained to calibrate the beam deflection. Calculations for obtaining these coefficients are carried out by the CPU 552 using a program stored in the storage unit 551, for example. The deflection coefficients are fed to the deflection-control circuit 563 to calibrate the beam deflection by the main deflector 533. As a result, the electron beam is under accurate position control, so that the positional accuracy of exposure patterns and the stitching accuracy between the main-deflector deflection fields MD are enhanced.

At a step S305, the stage 535 is shifted to position the beam detector 545 at the center position C5 (see FIG.68), for example, of the main-deflector deflection field MD. The position of the beam detector 545 does not necessarily have to be at the center position C5 of the main-deflector deflection field MD, and may be at a predetermined arbitrary position. However, the position of the beam detector 545 needs to be the same position as alignment marks on the wafer to be detected in a subsequent superimposing exposure.

At a step S306, the electron beam is directed to the mark 651 of the beam detector 545, and a detection signal from the beam detector 545 and detection signals from the scattered-electron detectors 540 and 541 are obtained. Based on the detection signal from the beam detector 545, calibration of the detection signals from the scattered-electron detectors 540 and 541 is carried out. As previously described, the detection signal from the beam detector 545 does not have a position dependency, i.e., is not affected by the position of the mark 651, so that this detection signal can be used for the calibration. The position of the mark 651 can be anywhere within the main-deflector deflection field MD. However, when the alignment marks AL on the wafer W are detected subsequently in an exposure process, these alignment marks AL will have to be positioned in a proximity of the position where the mark 651 is detected.

At a step S307, the electron beam is directed to and scanned over the alignment marks AL on the wafer W, and positions of the alignment marks AL are detected based on signals from the scattered-electron detectors 540 and 541 to carry out an exposure of the wafer W according to the detected positions. Here, the alignment marks AL should be in a proximity of the position C5. As long as the mark-position dependency of the detected signals from the scattered-electron detectors 540 and 541 is not significantly different from that at the position C5, the alignment marks AL can be positioned slightly off from the position C5 when the alignment-mark-position detection is carried out.

At a step S308, a check is made whether exposure of a given main-deflector deflection field is finished. If it is, the procedure ends. Otherwise, the procedure goes back to the step S307 to repeat the step S307.

In the flowchart of FIG.62, an end of the exposure of one main-deflector deflection field is the end of the flowchart. However, after the calibrations of the beam deflection and the scattered-electron detectors are finished, an exposure process can be carried out for a plurality of main-deflector deflection fields under the same calibrated conditions. Also, exposure of one chip area or a plurality of chip areas may be conducted under the same calibrated conditions. Frequency of the calibrations is determined according to characteristics of the exposure device.

As described above according to the fifth principle of the present invention, the beam detector which includes a photodiode and a mark formed on the photodiode upper surface is provided in the wafer stage or in the holder on the wafer stage, so that a position dependency between the mark and the beam detector is eliminated to provide an accurate beam detection. As a result, the deflection coefficients of the deflector are accurately obtained to carry out a precise calibration of the beam deflection. Therefore, the position accuracy of exposure patterns and the stitching accuracy between exposure fields are enhanced.

Also, signals from the scattered-electron detectors detected when the electron beam is scanned over the mark of the beam detector are calibrated based on the detection signal from the beam detector. Therefore, an accurate position detection of the alignment marks on the wafer becomes possible to enhance the superimposition accuracy of exposures.

Moreover, the present invention concerns another problem, and a description thereof will be provided below.

A method of exposing a charged-particle beam such as an electron beam or an ion beam is capable of forming a pattern having an accuracy of sub-micron orders, and is used as an exposure technique for highly integrated semiconductor devices.

In such exposure devices, a charged-particle beam generated by an electron gun or the like is passed through a mask pattern to shape a cross section of the beam, and, then, is deflected by a deflector to a desired position on an object such as a wafer. Exposure data indicating a pattern shape and a pattern position on the wafer is read from storage media such as a hard-drive disk, and is converted into data usable by an optical system of the device. The optical system includes a plurality of lenses for attaining a uniformity of the beam and effecting a size reduction, a rotation, and a projection of the beam. The optical system also includes a mask deflector for deflecting the beam to a desired pattern on the mask, a mask deflection correcting unit for correcting the beam deflection for the mask, a round aperture working as a diaphragm for the beam, a main deflector and a sub-deflector for deflecting the beam to a desired position on the wafer, a mask stage for carrying the mask, and a wafer stage for carrying the wafer. The aforementioned data required for driving these elements is generated by an operation unit. To be exact, these elements are driven by analog driving signals corresponding to this data.

These analog driving signals are generated by converting digital signals, which are converted from the exposure data stored in the hard drive, into analog signals and by amplifying the resulting analog signals. When part of the exposure data is modified, a plurality of analog driving signals relating to the modified part are also changed, and an individual change cannot be made to each of these analog driving signals.

A plurality of driving signals drive these elements such that the charged-particle beam is deflected, converged, and corrected so as to be directed to a desired position. A change in the exposure data results in changes in more than one driving signal such that an exposure pattern and an exposure position on the wafer are also changed.

In normal procedures of an exposure process, errorless operations of these elements are assumed, and various conditions mainly set forth in the exposure data are determined to carry out an exposure of a desired pattern.

However, checking an errorless operation of each element is not an easy task. This is because inspections of an exposure-data input and an exposed-pattern output only cannot tell us about a specific deficiency of each element. When an abnormal operation of the system is detected, the cause of the abnormality might be deficiency or deterioration of individual elements, might be an external condition affecting particular elements, or might be a complication of relations between elements, etc. That is, the abnormality can be caused by anything.

A plurality of deflectors or correction coils provided in the optical system easily suffer from fatigue of electrodes, charging up caused by attachment of contamination, an elongation of the response time, a deterioration of the linearity caused by a whirling current accompanying a change in the magnetic field, etc. That is, these elements suffer from deteriorations in DC characteristics as well as AC characteristics.

Accordingly, a check on an operation of each element based on the exposed-pattern output requires a skilled hand, and is a time consuming process. As a result, a system-down time tends to be longer, thereby significantly reducing a system utilization.

Accordingly, there is a need for an exposure device and an exposure method which can provide an individual check as to whether a given element is operating normally.

Also, there is a need for an exposure device and an exposure method which can provide the setting of driving data individually for each element of the optical system such as a deflector, a correction coil, or the like.

Further, there is a need for an exposure device and an exposure method which can provide input data individually for each element of the operation system such as a data generating circuit or the like, and can allow the monitoring of an output of each element.

These needs are addressed by a sixth principle of the present invention.

In the following, embodiments of the sixth principle will be described with reference to the accompanying drawings. These embodiments, however, are not intended to limit the scope of the sixth principle of the present invention.

Figure 69:
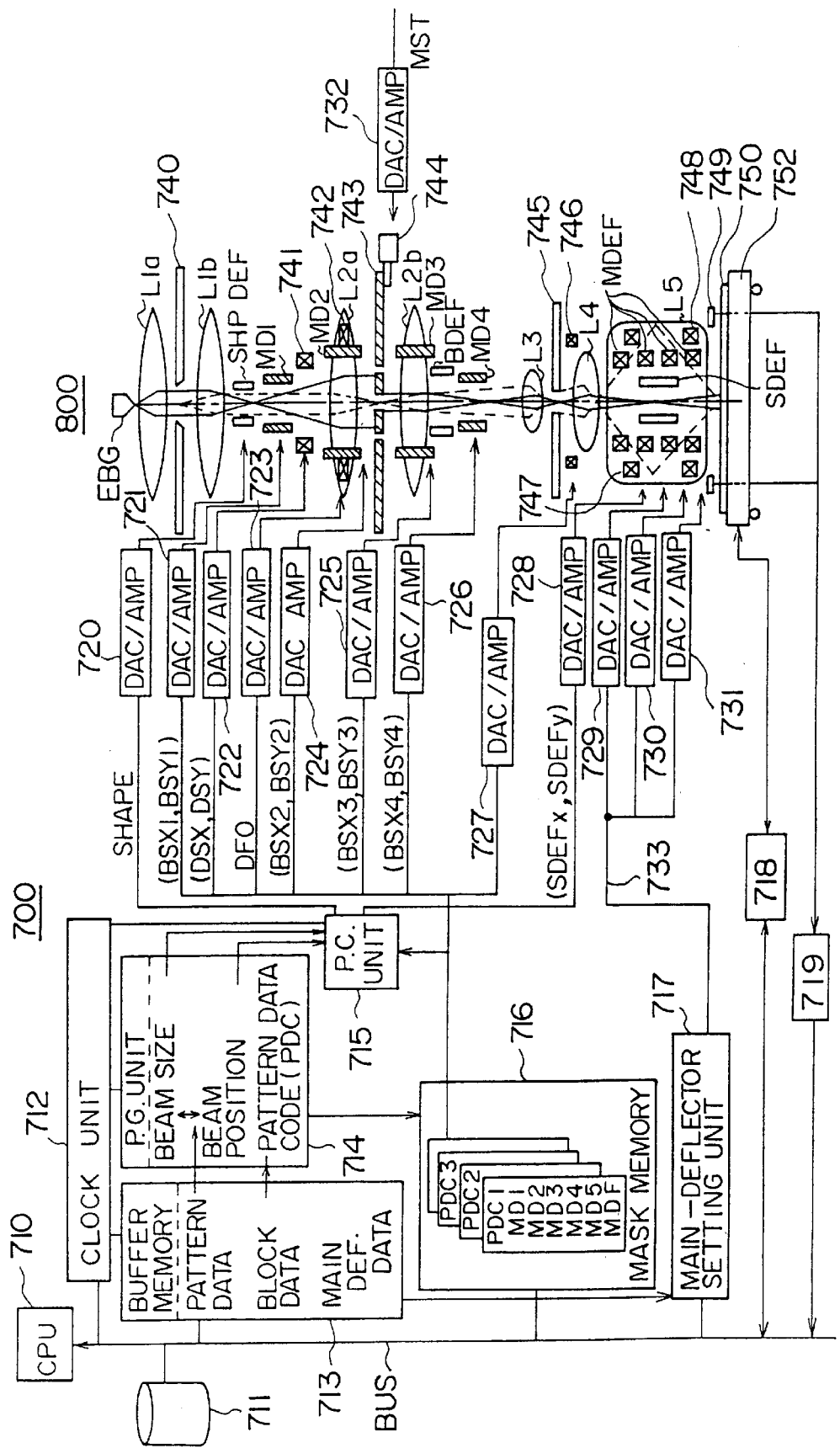
FIG.69 is an illustrative drawing showing an entire configuration of an electron-beam exposure device as an example of a charged-particle-beam exposure device.

FIG.69 is an illustrative drawing showing an entire configuration of an electron-beam exposure device as an example of a charged-particle-beam exposure device. In the following, a description of the sixth principle will be given by taking an electron beam as an example. It is apparent, however, that the present invention is not limited to the use of an electron beam, but can be applied to exposure methods and devices utilizing various charged-particle beams.

In FIG.69, the electron-beam exposure device includes an operation unit 700 and an electron optical system 800. The operation unit 700 converts the exposure data into driving signals for various elements of the electron optical system 800, and controls the electron optical system 800. The electron optical system 800 is an optical system which carries out an exposure of an electron beam.

First, the electron optical system 800 will be described below. An electron beam emitted from an electron-beam gun EBG is passed through a first mask 740 by electromagnetic lenses L1a and L1b. As a result, a cross section of the electron beam is shaped into a rectangular shape, for example. Then, the electron beam passes through a shaping deflector SHPDEF carrying out a fine deflection adjustment, and is passed through a selected block mask on a second mask 743 by mask deflectors MD1 through MD4.

The second mask 743 has a plurality of repeated aperture patterns and a rectangular aperture used for a variable-rectangle method. The electron beam is deflected by the mask deflectors MD1 and MD2 to a selected pattern on the second mask 743, and, then, is deflected back to the optical axis by the mask deflectors MD3 and MD4 as well as a beam converging force of lenses L2a and L2b. The second mask 743 is a 50-mm square mask, for example, on which a plurality of deflection areas (e.g., a 5-mm square each) are provided, as disclosed in Japan Journal of Applied Physics Vol.32 (1993)6006. Within each of the deflection areas, the plurality of mask patterns (repeated aperture patterns) are provided. As described above, one of the mask patterns is selected by the mask deflectors MD1 through MD4. A correction coil 741 corrects astigmatism dynamically according to the deflected beam position on the second mask 743. A correction coil 742 corrects a focus distance dynamically also according to the deflected beam position. The second mask 743 is placed on a mask stage 744 movable in horizontal directions.

The electron beam having a cross section of a desired pattern is exposed onto an object 750 such as a wafer placed on a object stage 752 after passing through a reduction lens L3 and projection lenses L4 and L5. A main deflector MDEF and a sub-deflector SDEF are provided to deflect the electron beam to a desired position on the object 750. The main deflector MDEF is an electromagnetic deflector, which is capable of a large deflection and has a relatively long response time. The sub-deflector SDEF is an electrostatic deflector, which has a relatively short response time and is capable of only a small magnitude of deflection. A correction coil 747 corrects astigmatism dynamically according to a deflection amount on the object 750. A correction coil 748 corrects a focus distance dynamically also according to the deflection amount.

A blanking deflector BDEF controls the on/off states of the electron beam on the object 750. A round aperture 745 is used for diaphragm control. A refocus coil 746 is used for refocusing the electron beam according to a size of the selected mask pattern of the second mask 743. This refocusing is carried out to correct the broadening of the beam cross section caused by repelling forces between electrons. The broadening of the beam cross section becomes prominent when the mask pattern has a large size, and, thus, an amount of electric current is large. Detectors 749 are provided above the object 750 to detect electrons scattered by a reference mark on the object 750 or on the object stage 752 when the electron beam is exposed onto the reference mark.

Each element such as a deflector, a correction coil, a mask stage, etc., are driven by a respective analog driving signal, which is supplied by a respective digital-to-analog converter/amplifier DAC/AMP. Digital signals generated by the operation unit 700 are supplied to digital-to-analog converter/amplifiers DAC/AMP 720 through 732.

In the operation unit 700, a CPU (central processing unit) 710 is connected via a bus BUS to a hard drive 711, a clock unit 712, a buffer memory 713, a pattern generating unit 714, a mask memory 716, a main-deflector setting unit 717, an object-stage controlling unit 718, and a scattered-electron detecting unit 719.

The hard drive 711 stores the exposure data, programs for converting the exposure data into the driving data for driving each element, and programs for controlling an exposure process. The exposure data stored in the hard drive 711 is read and temporarily stored in the buffer memory 713.

FIG.70 is a table chart showing relations between the exposure data and driving signals for elements such as deflectors, correction coils, etc. The exposure data is divided into pattern data, block data, main-deflector data, stage data, etc. The pattern data indicates a beam size and a beam position on the object 750. Thus, the pattern data is converted into driving data SHAPE and driving data (SDEFx, SDEFy). The driving data SHAPE is used for the shaping deflector SHPDEF to determine an extent to which the electron beam having passed through the first mask 740 is superimposed on the rectangular aperture of the second mask 743. The driving data (SDEFx, SDEFy) is used for the sub-deflector SDEF.

The block data is used when a mask pattern of the second mask 743 is used, and includes pattern data codes (PDC) for indicating a mask pattern selected from mask patterns of the second mask 743. When pattern data codes are determined, deflection data (BSX1, BSY1) through (BSX4, BSY4) for the mask deflectors MD1 through MD4, astigmatism-correction data (DSX, DSY) and focus-correction data DFO corresponding to the deflection amount, mask-stage driving data MST, and refocus data Refcs are read from the mask memory 716.

Main-deflector data 733 is used for driving the main deflector MDEF, and includes correction data DS for the correction coil 747 and correction data DF for the correction coil 748 responsive to the deflection amount. The stage data is used for driving the object stage 752.

Among the exposure data written in the buffer memory 713, the pattern data and the block data are supplied to the pattern generating unit 714, which then generates data for driving elements to expose the electron beam onto the object 750. A pattern-correction unit 715 receives data regarding a beam size and a beam position within sub-deflector deflection area, and carries out a correction operation and converts the data into coordinates of the electron optical system 800 corresponding to actual positions on the object 750. Driving data after the correction operation is supplied to the DAC/AMP 720 and the DAC/AMP 728 to generate analog driving signals for driving the shaping deflector SHPDEF and the sub-deflector SDEF, respectively.

Also, the pattern generating unit 714 generates pattern data codes PDC of the block data, and driving signals stored in mask memory 716 in advance are read out based on the pattern data codes PDC. Digital driving signals read from the mask memory 716 are provided for the DAC/AMPs 721–727 and 732. Elements connected to the DAC/AMPs 721–727 and 732 are driven by analog driving signals output from the DAC/AMPs 721–727 and 732.

The object-stage controlling unit 718 controls movement of the object stage 752, and detects the position of the object stage 752. The scattered-electron detecting unit 719 processes data detected by the detectors 749.

As previously described, a partial modification made to the exposure data results in changes in the driving data for more than one deflector and/or more than one correction coil. Therefore, a check on an individual element is difficult.

The exposure device according to the sixth principle of the present invention is divided into a plurality of subsystems based on their functions, such subsystems including the optical system, the object (e.g., wafer) loading system, the analog amplifier system, and the operation control system, and input means for individually supplying operation conditions and data to each of these elements is provided. Diagnosis data prepared in advance is input through the input means by using the operation unit 700. After this diagnosis data modifies the input data, changes in a beam intensity, beam sharpness, a deflection position, etc., of the electron beam are measured. As for elements which do not bring about a change in the electron beam such as the pattern-correction unit 715 or the like, output means for directly reading outputs thereof is provided.

Changes in the outputs responsive to changes in the input data are measured in terms of DC responses and AC responses. The DC responses are changes in the magnitudes of the outputs or changes in magnitude changes of the outputs which are brought about by constant-amount changes in the input data. The AC responses are response time of the outputs measured in terms of time constant or the like when the outputs change in response to the input changes. These changes in the outputs are measured by detecting scattered electrons or the amount of a stage current. The changes in the outputs are used for checking the operation of each element by making a comparison between a new output reading and a previously measured output reading.

Figure 71:
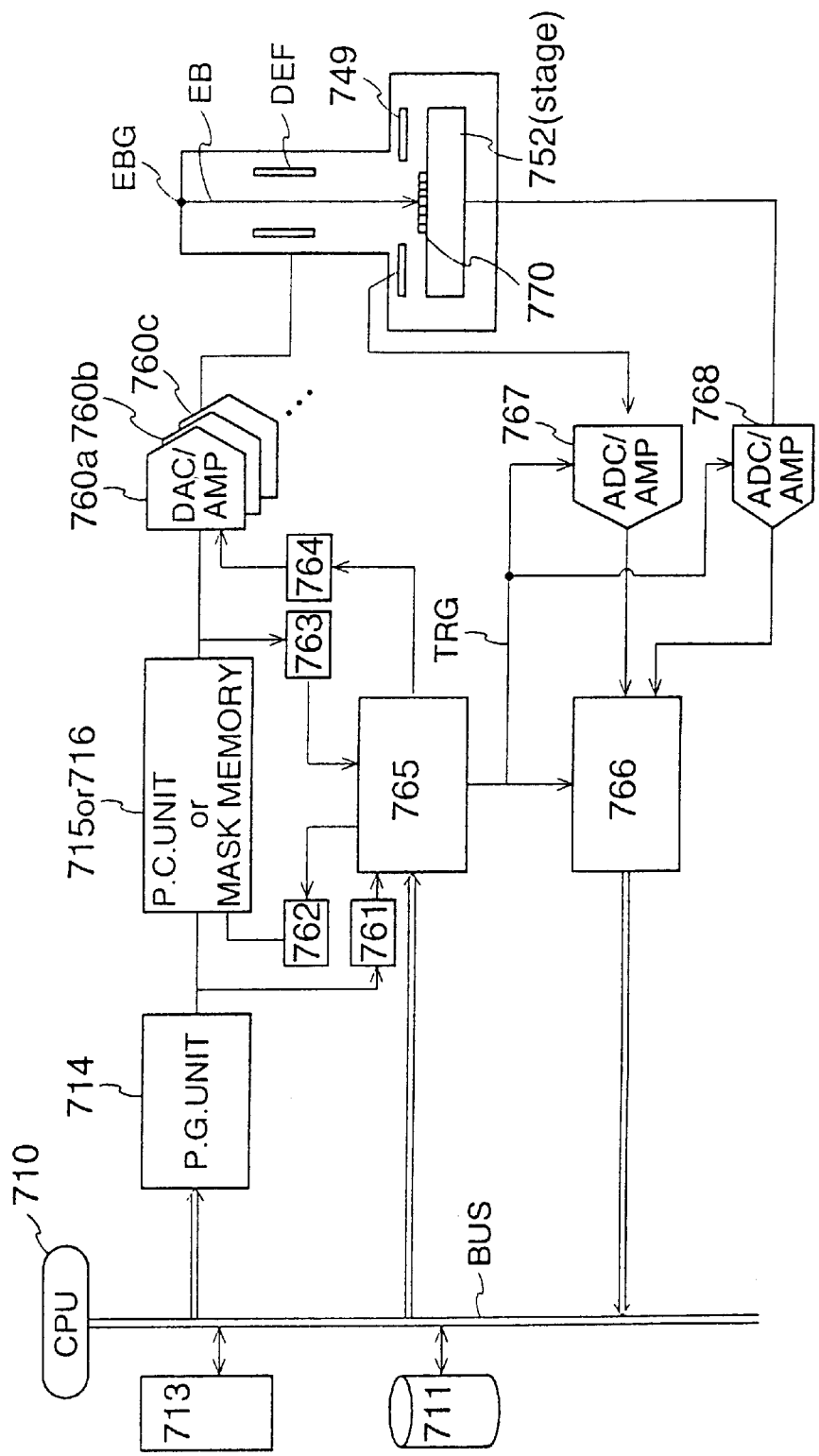
FIG.71 is a block diagram of an exposure device equipped with diagnosis functions according to a sixth principle of the present invention.

FIG.71 is a block diagram of an exposure device equipped with the diagnosis functions described above. In the figure, the pattern generating unit 714, the pattern-correction unit 715 or the mask memory 716, and digital-to-analog-converter/amplifiers 760a through 760c for driving relevant elements are shown as an example. An input-data setting circuit 765 is used for setting input data individually for the pattern-correction unit 715 and DAC/AMPs 760a through 760c. The input-data setting circuit 765 writes input data for diagnosis into a register unit 762 and a register unit 764. The data of the register unit 762 is then given to the pattern-correction unit 715, and the data of the register unit 764 is given to the DAC/AMPs 760a through 760c.

In FIG.71, a situation in which the DAC/AMP 760a drives a beam deflector DEF of the exposure device is given as an example. When the input data is set to the DAC/AMP 760a, a deflection amount of the beam deflector DEF is changed in response to the change in the input data, so that an electron beam EB changes its position. A reference mark 770 is formed on a wafer surface or a stage surface where the electron beam EB is exposed. The reference mark 770 has a different beam-scattering coefficient from the wafer surface or the stage surface. The detectors 749 detect the intensity of the scattered electrons, and the detected signal is provided via an ADC/AMP (analog-to-digital-converter/amplifier) 767. Also, an electric current flows through the object stage 752 (or the object 750) is detected and provided via an ADC/AMP 768.

The input-data setting circuit 765 sets the input data for the register unit 762 and the register unit 764, and, also, generates a sampling-trigger signal TRG at a timing synchronizing with or delayed from the setting of the input data. Then, changes in the electron beam EB are read from the ADC/AMP 767 and the ADC/AMP 768. A response-signal analyzing unit 766 detects the DC responses and the AC responses from the detected changes in the electron beam EB.

An output reading register 761 reads and stores the output data of the pattern generating unit 714, and an output reading register 763 reads and stores the output data of the pattern-correction unit 715. The input data set in the pattern generating unit 714 can be changed by changing the exposure data, but the output of the pattern generating unit 714 does not have a direct influence on the electron beam EB. Provision of the output reading register 761 allows a check on an operation of the pattern generating unit 714. By the same token, provision of the output reading register 763 enables a check on an output change of the pattern-correction unit 715 responsive to the input changes. The input-data setting circuit 765 reads data from the output reading register 761 and the output reading register 763, and supplies the data to the CPU 710.

Figure 72:
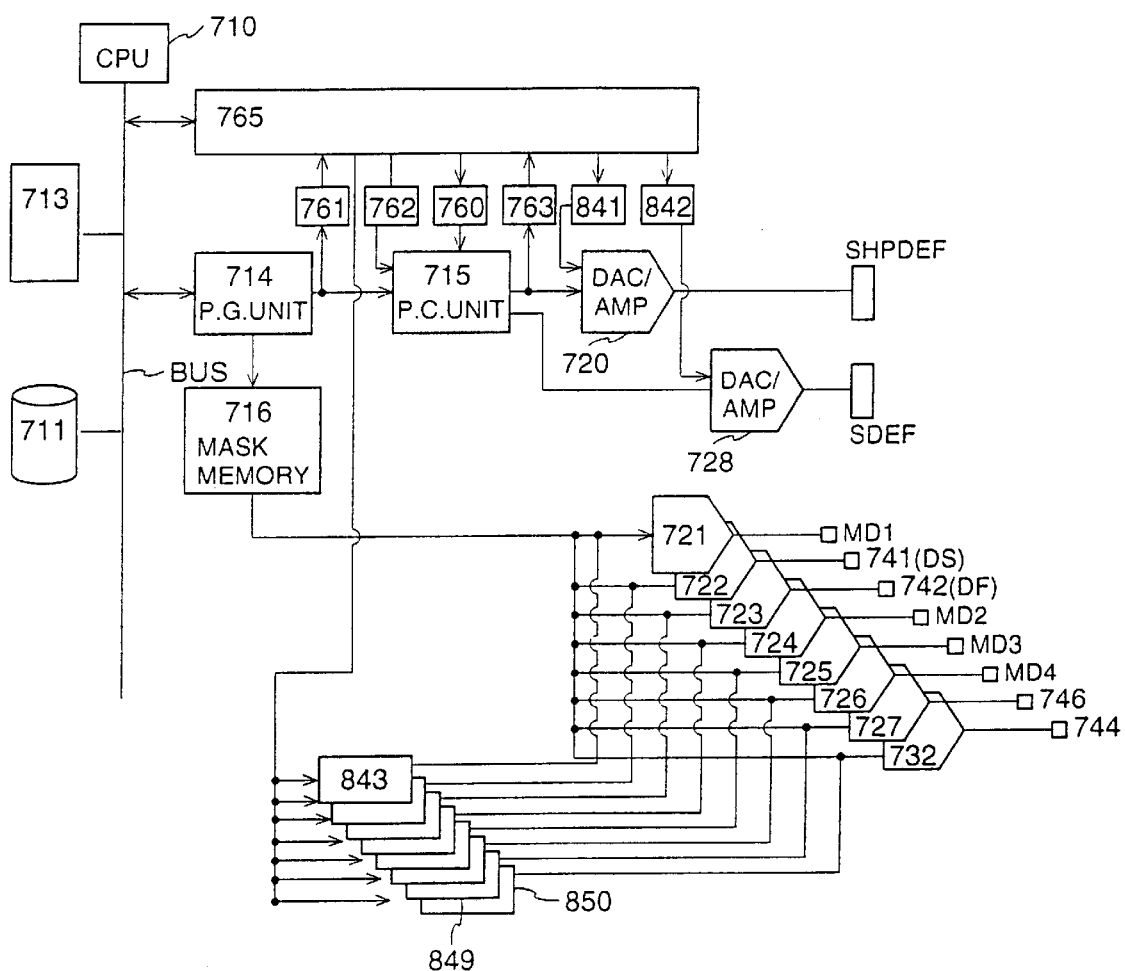
FIG.72 is a block diagram showing a detailed configuration around an input-data setting circuit of FIG.71.

FIG.72 is a block diagram showing a detailed configuration around the input-data setting circuit 765 of FIG.71.

In FIG.72, the input-data setting circuit 765 sets the input data for the DAC/AMPs 720 and 728 via input-data writing registers 841 and 842, respectively, and, also, sets the input data for the DAC/AMPs 721–727 and 732 via input-data writing registers 843–850, respectively. The DAC/AMPs 720 and 728 drive the shaping deflector SHPDEF and the sub-deflector SDEF, respectively. The DAC/AMPs 721–727 and 732 drive the mask deflector MD1, the correction coil 741, the correction coil 742, the mask deflector MD2, the mask deflector MD3, the mask deflector MD4, the refocus coil 746, and the mask stage 744, respectively. Also, a coefficient setting register 760 is provided between the input-data setting circuit 765 and the pattern-correction unit 715, and allows the setting of deflection coefficients for deflection corrections. The deflection coefficients for the deflection corrections are used for correcting a gain, rotation, an offset, and a distortion of the beam deflection caused by inherent characteristics of the optical system.

Figure 73:
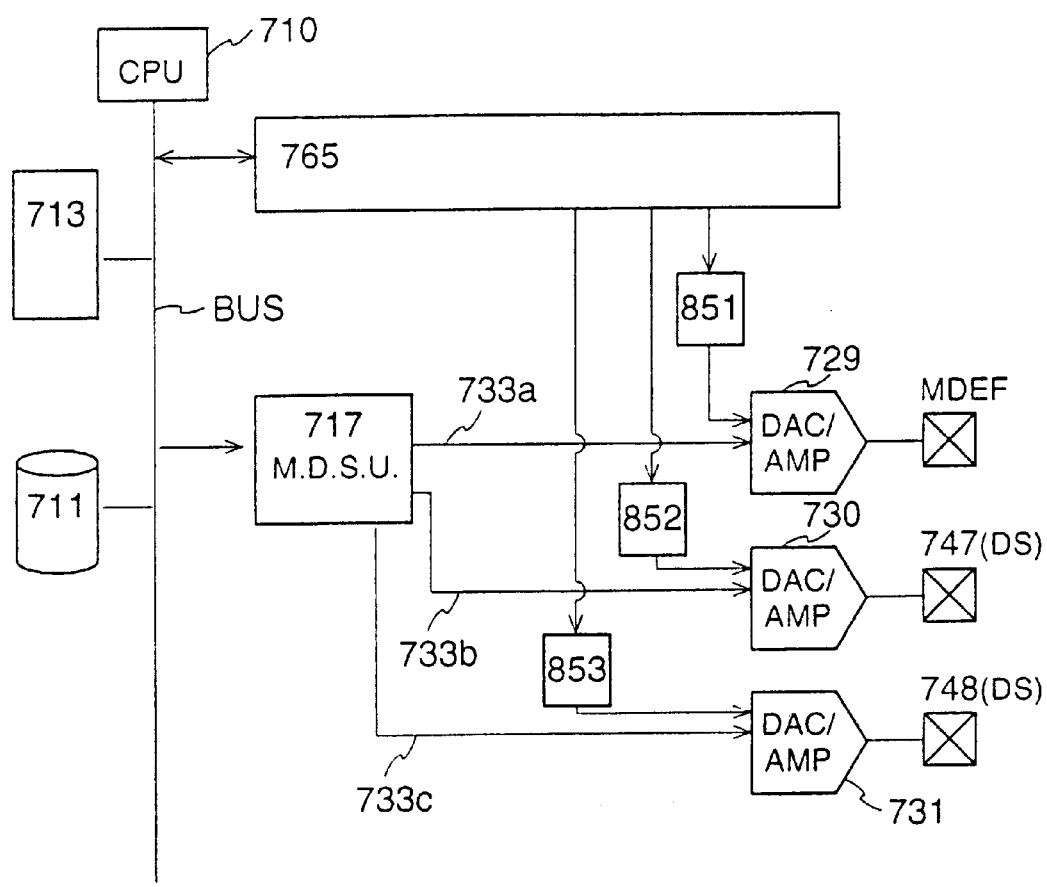
FIG.73 is a block diagram showing a configuration of another part around the input-data setting circuit.

FIG.73 is a block diagram showing a configuration of another part around the input-data setting circuit 765. In FIG.73, the input-data setting circuit 765 sets the input data for the DAC/AMPs 729 through 731 via input-data writing registers 851 through 853, respectively. In a normal operation, the main-deflector setting unit 717 provides the driving data 733a through 733c for the DAC/AMPs 729 through 731, respectively. In this manner, the main deflector MDEF, the correction coil 747, and the correction coil 748 are individually provided with the input data.

As described above, the registers, the detectors 749, and the stage-current detecting means are provided to allow the settings of the input data and the analysis of the outputs for various elements of the exposure device. Diagnosis evaluating the conditions of the exposure device is given by using a predetermined diagnosis program.

Figure 74:
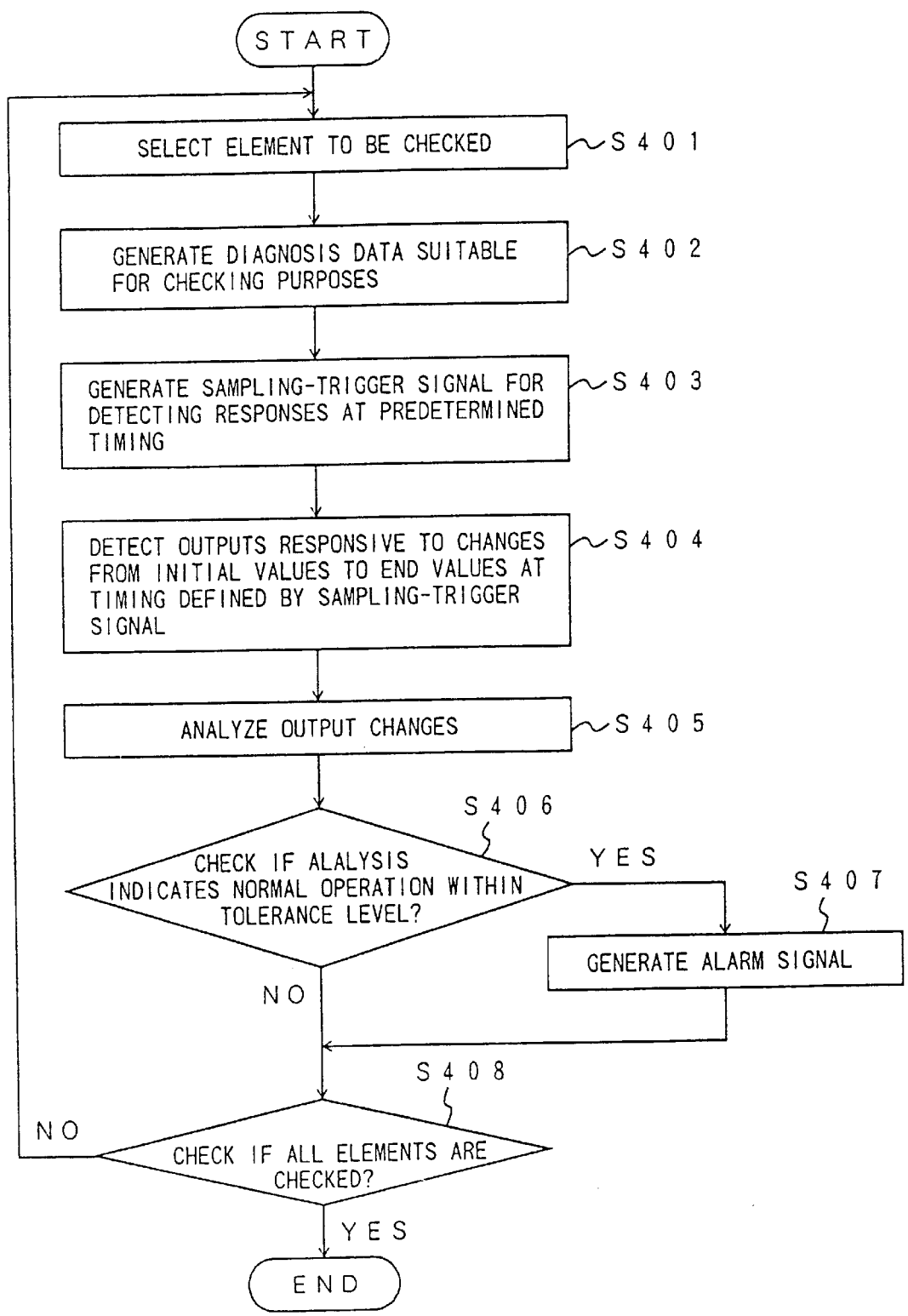
FIG.74 is a flowchart of a procedure according to a predetermined diagnosis program.

FIG.74 is a flowchart of a procedure according to the predetermined diagnosis program.

At a step S401, a selection is made for an element to be checked.

At a step S402, the input-data setting circuit 765 generates diagnosis data suitable for the checking purposes. For example, the diagnosis data is such that a set of typical initial values are set via the input-data writing registers for all the elements, and, after the outputs of all the elements are stabilized under the initial conditions, a set of end values providing changes in the input data for only the selected element are set via the input-data writing registers for all the elements. Namely, when the set of the end values are set, the input data for non-selected elements are not changed by the end values.

This diagnosis data is stored in the hard drive 711 as a plurality of sets of data. This plurality of sets of data include a set of the initial values, a set of first end values for changing only the driving data of the sub-deflector SDEF, a set of second end values for changing only the driving data of main deflector MDEF, a set of third end values for changing only the driving data of the correction coil 748, etc. Namely, a diagnosis data set for a check of an operation of each element is stored in addition to the set of the initial values. The input-data setting circuit 765 reads the set of the initial values and the set of the end values for checking a selected element, and writes these sets into the input-data writing register as described above.

At a step S403, the input-data setting circuit 765 generates the sampling-trigger signal TRG for detecting responses at a predetermined timing.

At a step S404, outputs responsive to the changes from the initial values to the end values are detected at the timing defined by the sampling-trigger signal TRG, as described with reference to FIG.71.

At a step S405, an analysis of the output changes is conducted. This analysis is based on the detection of changes in the electron beam. As previously described, the electron beam is deflected by a plurality of deflectors, and is corrected by a plurality of correction coils. Therefore, the detection of changes in the electron beam enables the check of the operation of each element.

At a step S406, a check is made whether a result of the analysis indicates a normal operation within a tolerance level. If it does, the procedure goes to a step S408. Otherwise, the procedure goes to a step S407.

At the step S407, an alarm signal is generated by the exposure device, for example.

At the step S408, a check is made whether all the elements are checked. If they are, the procedure ends. Otherwise, the procedure goes back to the step S401 to repeat the check process for another element.

In the following, a method of analysis of the output will be described.

Figure 75:
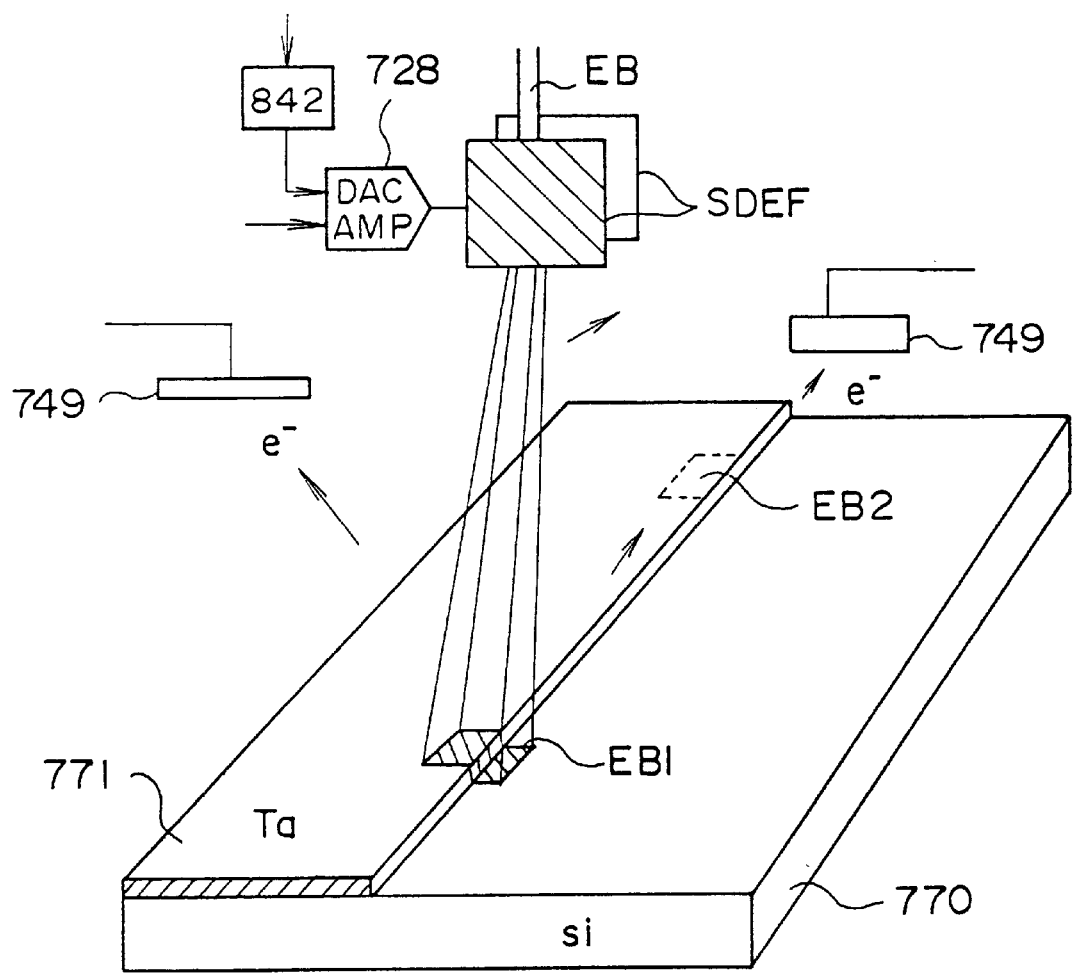
FIG.75 is an illustrative drawing showing a configuration in which DC characteristics of a sub-deflector of FIG.69 are measured.

FIG. 75 is an illustrative drawing showing a configuration in which the DC characteristics of the sub-deflector SDEF are measured. The DAC/AMP 728 for driving the sub-deflector SDEF is provided with the initial value and the end value from the input-data setting circuit 765 via the input-data writing register 842. The reference mark 770 used for the measurement of the DC characteristics is formed on the object stage 752 as a predetermined pattern of a heavy-metal layer 771 such as Ta on a Si substrate. A heavy metal such as Ta tends to scatter electrons several times as much as the Si substrate. Thus, the detected current amount (intensity) of scattered electrons is increased in proportion to the ratio of an area occupied by the heavy-metal layer 771 to the area exposed by the electron beam.

The initial value is set to the DAC/AMP 728 to deflect the electron beam at a position EB1, and the current amount of the scattered electrons is detected by the detectors 749. Then, a plurality of end values for deflecting the electron beam along the border between the heavy-metal layer 771 and the silicon substrate are successively set for the DAC/AMP 728, so that the electron beam is shifted step by step from the position EB1 to a position EB2. If the DAC/AMP 728 and the sub-deflector SDEF are operating normally, the detected current amount (intensity) of the scattered electrons changes linearly.

Figure 76:
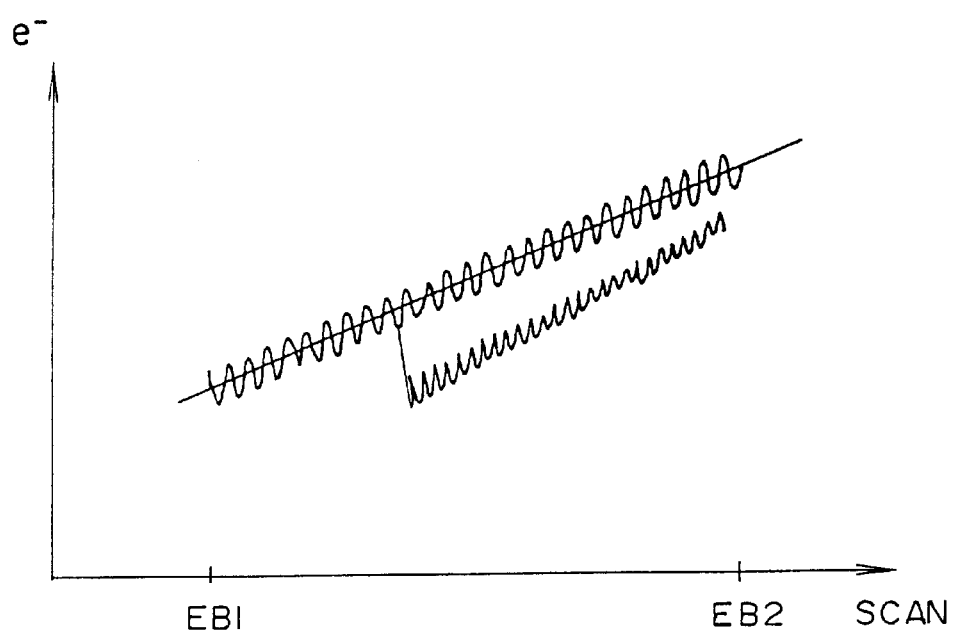
FIG.76 is an illustrative drawing showing relations between a position of the electron beam and a detected current amount of scattered electrons.

FIG.76 is an illustrative drawing showing relations between a position of the electron beam and the detected current amount of the scattered electrons. As shown by an upper signal waveform in FIG.76, the detected current amount of the scattered electrons should change linearly.

When a charge-up phenomena caused by contamination attached to the sub-deflector SDEF or the like is present, the detected current amount of the scattered electrons may not have a linear change. Also, when a deficiency such as missing of one bit in the DAC/AMP 728 is present, for example, the detected current amount of the scattered electrons has a sudden change as shown by a lower signal waveform of FIG.76.

These phenomena can be detected by the response-signal analyzing unit 766 based on a comparison of the detected signal with a previously detected signal stored in a memory or based on an evaluation of the detected signal as to whether it is within a predetermined tolerance level. If it is ascertained that the detected signal is out of the desired characteristics, the response-signal analyzing unit 766 instructs the CPU 710 to generate an alarm.

Figure 77:
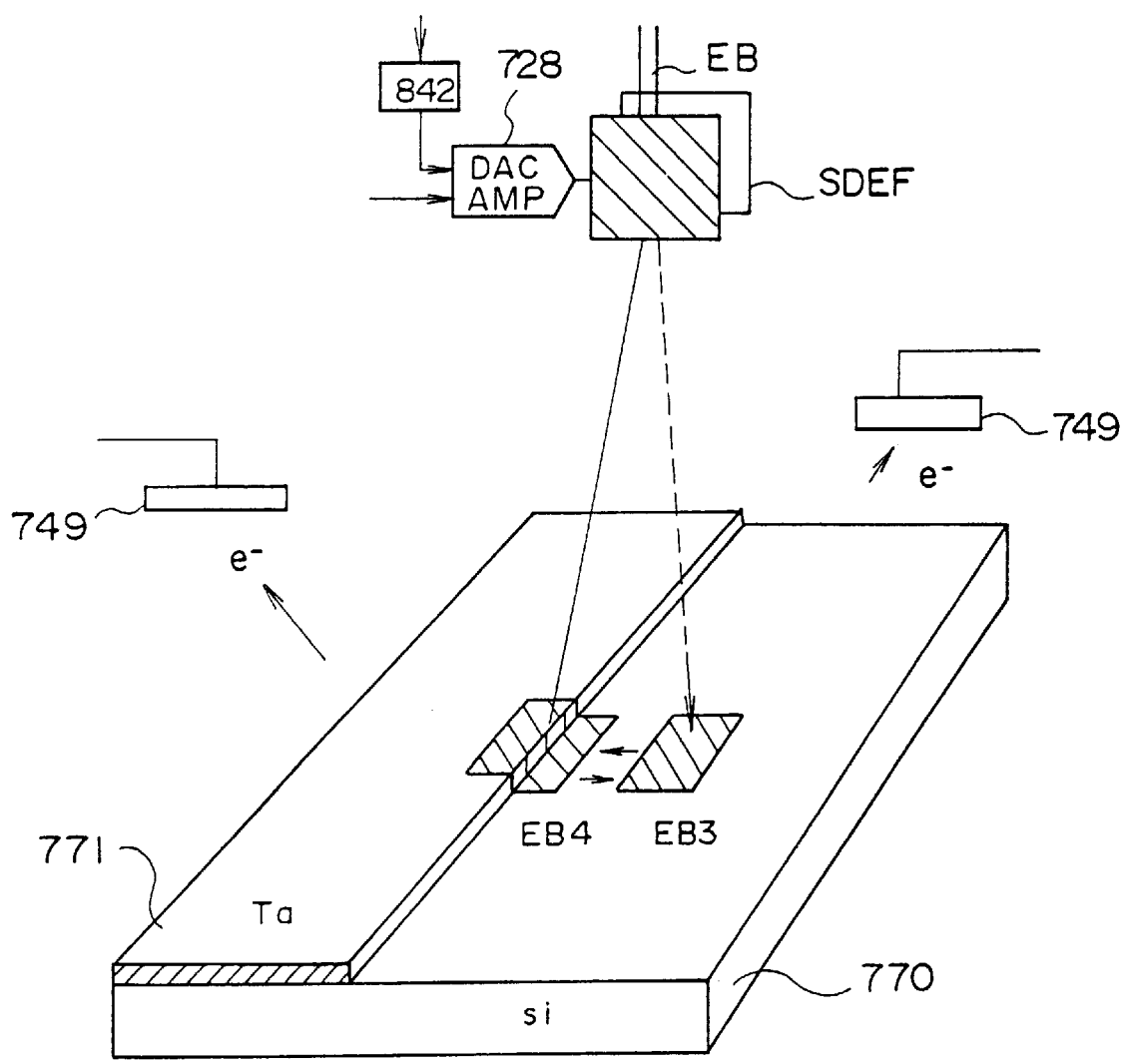
FIG.77 is an illustrative drawing showing a configuration in which AC characteristics of the sub-deflector are measured.

FIG.77 is an illustrative drawing showing a configuration in which the AC characteristics of the sub-deflector SDEF are measured. As shown in FIG.77, the electron beam is deflected so as to shift from a position EB3 to a position EB4 according to the initial value and the end value. Then, a response time Tr which is a time difference between time t1 when the driving data is changed from the initial value to the end value and time t2 when the detected current amount of the scattered electrons settles at a level corresponding to the end value is obtained.

Figure 78A:
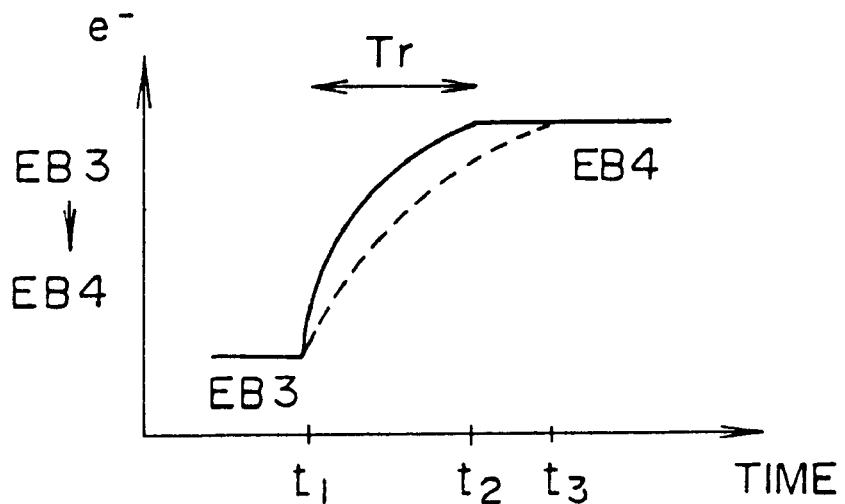
FIG.78A is a chart showing a change in the detected current amount of the scattered electrons.

FIG.78A is a chart showing a change in the detected current amount of the scattered electrons. In FIG.78, a current-amount change shown by a solid curve is obtained under normal conditions. A current-amount change shown by a dotted curve is obtained when the response characteristic is deteriorated because of the charging up in the deflector electrodes or in a proximity of the deflector electrodes. In this case, the response time exceeds the tolerance level, so that malfunction of the sub-deflector SDEF is detected. Here, the response time Tr is regarded as a time constant defining a maximum time period until the electron beam is settled.

Figure 78B:
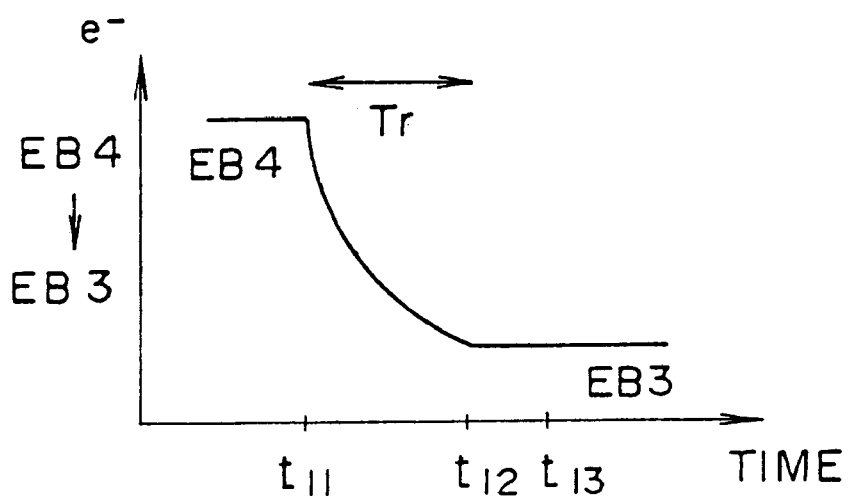
FIG.78B is a chart showing a change in the detected current amount of the scattered electrons when a beam position is changed from a position EB4 to a position EB3 in FIG.77.

FIG.78B is a chart showing a change in the detected current amount of the scattered electrons when the beam position is changed from the position EB4 to the position EB3. In this case also, the same analysis as described above can be applied to the change in the detected current amount of the scattered electrons.

The analysis of the AC characteristics described with reference to FIG.77 and FIGS.78A and 78B can also be applied to the analysis of the main deflector MDEF which is an electromagnetic deflector. When a magnetic field is generated by an electromagnetic deflector to deflect the electron beam, whirling currents created on surfaces of metal components in the magnetic field tend to affect the AC characteristics of the deflector. It is apparent that the method of detecting malfunction described with reference to FIG.77 and FIGS.78A and 78B is also effective in such a case.

Figure 79:
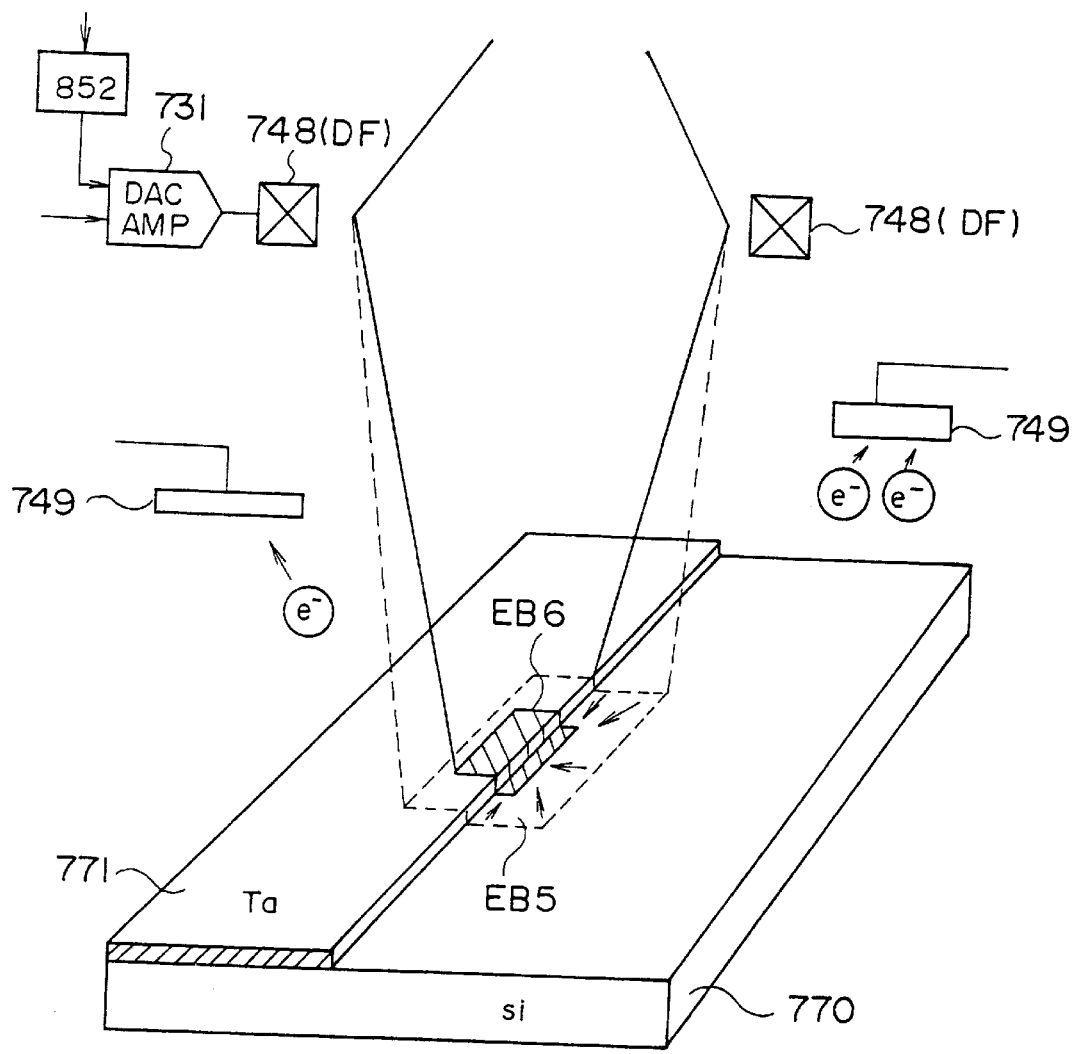
FIG.79 is an illustrative drawing showing a configuration in which AC characteristics of a correction coil of FIG.69 are measured.

FIG.79 is an illustrative drawing showing a configuration in which the AC characteristics of the correction coil 748 are measured. The input-data writing register 852 is connected to the DAC/AMP 731 for driving the correction coil 748. At a position deviated from the optical axis, an electron beam EB5 in an off-focus state is sharpened to an electron beam EB6 by setting a corrected focus value as the end value to the DAC/AMP 731 via the input-data writing register 852. Since the beam is focused by the correction coil 748, the ratio of the area occupied by the heavy-metal layer 771 to the entire beam-exposed area is increased as shown in FIG.79. Thus, the detected current amount of the scattered electrons is increased.

Figure 80:
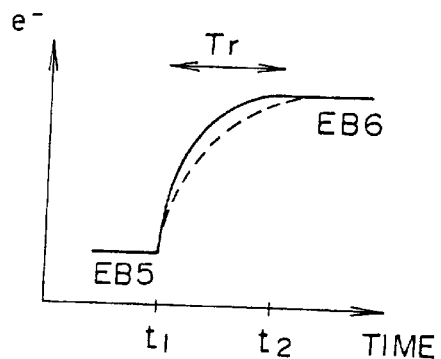
FIG.80 is a chart showing a change in the detected current amount of the scattered electrons when the electron beam is sharpened from an electron beam EB5 to an electron beam EB6 in FIG.79.

FIG.80 is a chart showing a change in the detected current amount of the scattered electrons when the electron beam is sharpened from the electron beam EB5 to the electron beam EB6. The response time Tr of the detected current amount of the scattered electrons, shown in FIG.80, is detected to measure the AC characteristics of the correction coil 748.

In the examples of FIG.75 through FIG.80, the detectors 749 are used. As shown in FIG.71, however, an electric current flowing through the object stage 752 (or the object 750) may be used in the same manner to detect the changes in the electron beam. For example, when the electron beam is directed to a pattern of a deep hole formed in the object 750, generation of the scattered electrons is prohibited so that the electric current flowing through the object 750 is generally proportional to the current amount of the electron beam. A signal obtained by detecting the electric current flowing through the object stage 752 has inverse characteristics to the signal detected by the detectors 749. Also, when the reference mark 770 is formed as being buried in the object stage 752, a leakage current from the object stage 752 can be detected as the above electric current to enhance detection sensitivity.

The method of checking characteristics of each element has been described with reference to a deflector and a correction coil. The described method is based on the detection of changes in the electron beam. However, as described with reference to FIG.71 and FIG.72, the input data can be set for the pattern-correction unit 715 via the register unit 762, and the output of the pattern-correction unit 715 can be stored in the output reading register 763, thereby allowing an individual check of characteristics of the pattern-correction unit 715.

Also, such an individual check can be applied to the object-stage controlling unit 718 controlling the movement of the object 750. For example, appropriate diagnosis data is set for the object-stage controlling unit 718. Then, the correction coil 748 or a stage-leakage-current detector can be used for observing a change in the electron scattering conditions as the reference mark on the object stage 752 is moved by the object-stage controlling unit 718.

As described above, according to the sixth principle of the present invention, a check is individually made for an operation of each element constituting the charged-particle-beam exposure device. In an exposure device in which a plurality of elements such as deflectors and coils operate in combination with each other under the control of exposure data, the driving data is individually set for each element to check an operation of each element in a separate fashion from each other. Therefore, a set-up stage of the exposure device can be significantly shortened to enhance the utility rate of the exposure device.

Further, the present invention is not limited to these embodiments, but various variations and modifications may be made without departing from the scope of the present invention.

What is claimed is:

1. A method of exposing a beam image onto an object after passing a charged-particle beam through a first slit and a second slit successively to form said beam image as a superimposition of said first slit and said second slit, said method comprising the steps of:
   a) scanning said beam image in at least one scan direction over a mark provided on one of said object and a proximity of said object;
   b) detecting a signal of charged particles scattered by said mark when said mark is scanned;
   c) detecting, based on said signal, displacement, rotation, and distortion of an image which said first slit projects onto said second slit;
   d) correcting said beam image based on information about said displacement, rotation, and distortion; and
   e) exposing said beam image after the correction onto said object.

2. The method as claimed in claim 1, wherein said mark has a width in said at least one scan direction smaller than a length of said beam image in said at least one scan direction.

3. The method as claimed in claim 1, wherein
   said step a) further comprises a step of conducting another scan of said beam image in said at least one scan direction over said mark by starting said another scan at an increased distance from said mark in said at least one scan direction by a length of a correct beam image, and wherein
   said step d) comprises a step of combining said signal of said another scan with said signal of the previous scan to detect a direction and an amount of said displacement based on one of a gap and a protrusion appearing at a connection point between said signal of said another scan and said signal of the previous scan.

4. The method as claimed in claim 3, wherein said at least one scan direction comprises a first direction and a second direction substantially perpendicular to said first direction, said direction and said amount of said displacement being detected for said first direction and said second direction.

5. The method as claimed in claim 3, wherein said mark comprises a first bar and a second bar substantially perpendicular to said first bar, said first direction being perpendicular to said first bar and said second direction being perpendicular to said second bar, said beam image being scanned over said first bar in said first direction and being scanned over said second bar in said second direction.

6. The method as claimed in claim 1, wherein said at least one scan direction comprises a first direction and a second direction substantially perpendicular to said first direction, and said step c) comprises a step of detecting said rotation when said signal corresponding to said first direction and said signal corresponding to said second direction have slopes having opposite signs to each other.

7. The method as claimed in claim 6, wherein said step c) further comprises a step of detecting a direction and an amount of said rotation based on said slopes.

8. The method as claimed in claim 6, wherein said step d) comprises a step of correcting said beam image so that an absolute value of a difference between said slopes becomes smaller than a predetermined tolerance level.

9. The method as claimed in claim 1, wherein said at least one scan direction comprises a first direction and a second direction substantially perpendicular to said first direction, and said step c) comprises a step of detecting said distortion when said signal corresponding to said first direction and said signal corresponding to said second direction have slopes having the same sign.

10. The method as claimed in claim 9, wherein said step c) further comprises a step of detecting a direction and an amount of said distortion based on said slopes.

11. The method as claimed in claim 9, wherein said step d) comprises a step of correcting said beam image so that an absolute value of a sum of said slopes becomes smaller than a predetermined tolerance level.

12. A method of exposing a charged-particle beam onto an object after passing said charged-particle beam having a rectangular cross section through a pattern of at least one aperture formed through a mask so as to form said pattern on said object, said method comprising the steps of:
   a) mounting a mask on a mask stage, said mask having at least one position detection aperture whose aperture size is larger than a size of said rectangular cross section, said mask stage being capable of shifting said mask in horizontal directions;
   b) relatively positioning said charged-particle beam with respect to said mask so that said charged-particle beam fully passes through said at least one position detection aperture;
   c) detecting a position of said mask by detecting a change in an intensity of said charged-particle beam passing through said at least one position detection aperture while shifting said mask through said mask-stage means, said change in said intensity being caused by a relative positional change between an edge of said at least one position detection aperture and said rectangular cross section; and
   d) controlling said mask stage based on a detected position of said mask so as to position said mask at a desired position.

13. The method as claimed in claim 12, wherein said step c) comprises the steps of:
   shifting said mask through said mask stage from a first point, where said charged-particle beam fully passes through said at least one position detection aperture, to a second point where an edge of said rectangular cross section touches said edge of said at least one position detection aperture;
   shifting said mask through said mask stage along said edge of said at least one position detection aperture from said second point to a third point where said rectangular cross section is in a proximity of an apex of said at least one position detection aperture; and
   shifting said mask through said mask stage around said third point in an X direction and in a Y direction to detect a position of said apex as said position of said mask based on said intensity.

14. The method as claimed in claim 12, wherein said at least one position detection aperture comprises at least two position detection apertures, and said step c) further detects a rotation angle of said mask based on detected positions of said at least two position detection apertures.

15. The method as claimed in claim 12, wherein said at least one position detection aperture comprises at least three position detection apertures, and said step c) further detects a deviation of said mask stage from orthogonality based on detected positions of said at least three position detection apertures.

16. A method of exposing a charged-particle beam onto an object by deflecting said charged-particle beam to a desired position on said object, said method comprising the steps of:
   positioning a beam detector successively at a plurality of positions within a deflection range of a deflector, said beam detector having a photodiode and a surface layer on said photodiode, said surface layer having an opening therethrough so that said charged-particle beam can reach said photodiode to be detected only through said opening;
   deflecting said charged-particle beam by said deflector to said beam detector to detect positions of said charged-particle beam by using said beam detector;
   obtaining a deflection efficiency of said deflector based on said positions of said charged-particle beam, said deflection efficiency being used for calibrating said deflector; and
   exposing said charged-particle beam onto said object by deflecting said charged-particle beam based on said deflection efficiency.

17. The method as claimed in claim 16, wherein said deflection efficiency includes a gain determining an enlargement or a reduction of said deflection range, a rotation of said deflection range, a displacement of said deflection range, and a distortion of said deflection range.

18. A method of exposing a charged-particle beam onto an object by deflecting said charged-particle beam to a desired position on said object, said method comprising the steps of:
   positioning a beam detector at a predetermined position within a deflection range of a deflector, said beam detector having a photodiode and a surface layer on said photodiode, said surface layer having an opening therethrough so that said charged-particle beam can reach said photodiode to be detected only through said opening;
   deflecting said charged-particle beam by said deflector to said beam detector to detect a position of said charged-particle beam by using said beam detector and to detect charged particles scattered by said opening of said beam detector by scattered-charged-particle detectors;
   calibrating outputs of said scattered-charged-particle detectors based on said position of said charged-particle beam detected by said beam detector;
   detecting a position of an alignment mark formed on said object by scanning said charged-particle beam over said alignment mark and by detecting charged particles scattered by said alignment mark by said scattered-charged-particle detectors; and
   exposing said charged-particle beam onto said object based on said position of said alignment mark.

19. A method of exposing a charged-particle beam onto an object by deflecting said charged-particle beam to a desired position on said object by use of control elements, said control elements including at least one deflector for deflecting said charged-particle beam and at least one correction coil for correcting said charged-particle beam, said method comprising the steps of:
   a) setting initial data for drivers, each of said drivers outputting a respective driving signal based on said initial data to control a corresponding one of said control elements;
   b) setting end data for a selected one of said drivers, said selected one of said drivers outputting a respective driving signal based on said end data to control a corresponding one of said control elements;
   c) detecting a change in said charged-particle beam, said change being caused by said end data; and
   d) checking an operation of said selected one of said control elements based on said change in said charged-particle beam.

20. The method as claimed in claim 19, wherein said c) comprises a step of detecting a magnitude of said change in said charged-particle beam.

21. The method as claimed in claim 19, wherein said step c) comprises a step of detecting a speed of said change in said charged-particle beam.

22. The method as claimed in claim 19, further comprising the steps of:
- a) setting initial data for sub-systems, said sub-systems constituting an operation unit which provides driving data for said drivers to control said control elements at a time of exposure of said object;
- b) setting end data for a selected one of said sub-systems;
- c) detecting a change in an output of said selected one of said sub-systems; and
- d) checking an operation of said selected one of said sub-systems based on said change in said output.

* * * * *